United States Patent
Asakawa et al.

(10) Patent No.: US 12,044,967 B2
(45) Date of Patent: Jul. 23, 2024

(54) ACTINIC-RAY-SENSITIVE OR RADIATION-SENSITIVE RESIN COMPOSITION, RESIST FILM, PATTERN FORMATION METHOD, AND METHOD FOR MANUFACTURING ELECTRONIC DEVICE

(71) Applicant: FUJIFILM Corporation, Tokyo (JP)

(72) Inventors: Daisuke Asakawa, Haibara-gun (JP); Hironori Oka, Haibara-gun (JP); Kyohei Sakita, Haibara-gun (JP); Michihiro Shirakawa, Haibara-gun (JP); Akiyoshi Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 1003 days.

(21) Appl. No.: 17/001,805

(22) Filed: Aug. 25, 2020

(65) Prior Publication Data

US 2020/0401045 A1  Dec. 24, 2020

Related U.S. Application Data

(63) Continuation of application No. PCT/JP2019/006235, filed on Feb. 20, 2019.

(30) Foreign Application Priority Data

Feb. 28, 2018  (JP) ................................ 2018-035948

(51) Int. Cl.
| | | |
|---|---|---|
| *G03F 7/004* | (2006.01) | |
| *C08F 220/18* | (2006.01) | |
| *C08F 220/28* | (2006.01) | |
| *C08F 220/34* | (2006.01) | |
| *C08F 220/38* | (2006.01) | |
| *G03F 7/038* | (2006.01) | |
| *G03F 7/039* | (2006.01) | |

(52) U.S. Cl.
CPC ...... *G03F 7/0045* (2013.01); *C08F 220/1804* (2020.02); *C08F 220/1808* (2020.02); *C08F 220/283* (2020.02); *G03F 7/038* (2013.01); *G03F 7/039* (2013.01); *C08F 220/346* (2020.02); *C08F 220/382* (2020.02)

(58) Field of Classification Search
CPC ........ G03F 7/0045; G03F 7/038; G03F 7/039; G03F 7/0046; G03F 7/0397; G03F 7/11; G03F 7/322; G03F 7/325; G03F 7/004; G03F 7/0382; G03F 7/20; G03F 7/26; C08F 220/1804; C08F 220/1808; C08F 220/283; C08F 220/346; C08F 220/382; C08F 220/24; C08F 2/50; C09D 133/14
USPC ........................ 430/270.1, 271.1, 272.1, 311
See application file for complete search history.

(56) References Cited

U.S. PATENT DOCUMENTS

| | | |
|---|---|---|
| 2009/0069521 A1 | 3/2009 | Nagai et al. |
| 2010/0324329 A1 | 12/2010 | Nagai et al. |
| 2011/0014566 A1 | 1/2011 | Ichikawa et al. |
| 2012/0065291 A1 | 3/2012 | Matsumura et al. |
| 2012/0308932 A1 | 12/2012 | Sagehashi et al. |
| 2012/0328982 A1 | 12/2012 | Iwasawa et al. |
| 2013/0022911 A1 | 1/2013 | Utsumi et al. |
| 2017/0037167 A1 | 2/2017 | Domon et al. |
| 2017/0299963 A1 | 10/2017 | Fujiwara |
| 2018/0039177 A1 | 2/2018 | Masunaga et al. |
| 2019/0010119 A1 | 1/2019 | Suzuki et al. |

FOREIGN PATENT DOCUMENTS

| | | |
|---|---|---|
| JP | 2011-037834 A | 2/2011 |
| JP | 2011-164436 A | 8/2011 |
| JP | 2012-242800 A | 12/2012 |
| JP | 2012-246426 A | 12/2012 |
| JP | 2013-040296 A | 2/2013 |
| JP | 2017-031378 A | 2/2017 |
| JP | 2018-025778 A | 2/2018 |
| JP | 2019-015802 A | 1/2019 |
| KR | 10-2008-0008415 A | 1/2008 |
| KR | 10-2011-0006614 A | 1/2011 |
| KR | 10-2012-0134046 A | 12/2012 |
| KR | 10-2017-0017790 A | 2/2017 |

(Continued)

OTHER PUBLICATIONS

Office Action issued Nov. 2, 2021 in Japanese Application No. 2020-503429.
Office Action dated May 31, 2022 issued by the Japanese Patent Office in Japanese Application No. 2020-503429.
Office Action dated May 3, 2022 issued by the Korean Patent Office in Korean Application No. 10-2020-7024759.

(Continued)

*Primary Examiner* — Caleen O Sullivan
(74) *Attorney, Agent, or Firm* — Sughrue Mion, PLLC

(57) ABSTRACT

An object of the present invention is to provide an actinic ray-sensitive or radiation-sensitive resin composition which is capable of forming a pattern having an excellent pattern line width roughness (LWR). In addition, another object of the present invention is to provide:

a resist film, a pattern forming method, and a method for manufacturing an electronic device, each of which uses the actinic ray-sensitive or radiation-sensitive resin composition.

The actinic ray-sensitive or radiation-sensitive resin composition of the present invention includes a resin including a repeating unit derived from a monomer having a salt structure and a repeating unit having a group whose polarity increases through decomposition by the action of an acid, the salt structure consists of an anionic structure moiety and an actinic ray-sensitive decomposable or radiation-sensitive decomposable cationic structure moiety, and a pKa of a monomer obtained by substituting the cationic structure moiety in the salt structure with a hydrogen atom is −0.80 or more.

12 Claims, No Drawings

(56) References Cited

FOREIGN PATENT DOCUMENTS

| | | |
|---|---|---|
| KR | 10-2018-0016276 A | 2/2018 |
| KR | 10-2019-0004661 A | 1/2019 |
| TW | 201111335 A1 | 4/2011 |
| TW | 201713721 A | 4/2017 |
| TW | 201738280 A | 11/2017 |
| WO | 2006/121096 A1 | 11/2006 |
| WO | 2010/119910 A1 | 10/2010 |

OTHER PUBLICATIONS

International Search Report dated May 21, 2019, issued by the International Searching Authority in application No. PCT/JP2019/006235.
Written Opinion dated May 21, 2019, issued by the International Searching Authority in application No. PCT/JP2019/006235.
International Preliminary Report on Patentability dated Sep. 1, 2020, issued by the International Bureau in application No. PCT/JP2019/006235.
Office Action issued Dec. 20, 2022 in Taiwanese Application No. 108106425.

ACTINIC-RAY-SENSITIVE OR RADIATION-SENSITIVE RESIN COMPOSITION, RESIST FILM, PATTERN FORMATION METHOD, AND METHOD FOR MANUFACTURING ELECTRONIC DEVICE

CROSS-REFERENCE TO RELATED APPLICATIONS

This application is a Continuation of PCT International Application No. PCT/JP2019/006235 filed on Feb. 20, 2019, which claims priority under 35 U.S.C. § 119(a) to Japanese Patent Application No. 2018-035948 filed on Feb. 28, 2018. The above application is hereby expressly incorporated by reference, in its entirety, into the present application.

BACKGROUND OF THE INVENTION

1. Field of the Invention

The present invention relates to an actinic ray-sensitive or radiation-sensitive resin composition, a resist film, a pattern forming method, and a method for manufacturing an electronic device.

2. Description of the Related Art

In processes for manufacturing semiconductor devices such as an integrated circuit (IC) and a large scale integrated circuit (LSI) in the related art, microfabrication by lithography using a chemically amplified resist composition has been performed.

For example, a resist composition including a photoacid generator and a compound (acid diffusion control agent) which is basic relative to the photoacid generator is disclosed in the section of Examples of JP2012-242800A. The acid diffusion control agent acts as a quencher which traps an acid generated from the photoacid generator upon exposure. The diffusion of the acid generated from the photoacid generator into the unexposed portion is controlled by the action of the quencher controls.

SUMMARY OF THE INVENTION

The present inventors have conducted studies on the resist composition described in JP2012-242800A, and have thus revealed that an acid diffusion control agent easily forms an aggregate and tends to be unevenly present in a system. Further, as a result, they have revealed that since the concentration distribution of the acid diffusion control agent is uneven in the resist film, the suppression (neutralization) of diffusion of an acid generated from a photoacid generator does not proceed evenly, and the line width roughness (LWR) of a pattern thus formed is not necessarily sufficient.

Therefore, an object of the present invention is to provide an actinic ray-sensitive or radiation-sensitive resin composition which is capable of forming a pattern having an excellent pattern line width roughness (LWR).

In addition, another object of the present invention is to provide a resist film, a pattern forming method, and a method for manufacturing an electronic device, each of which uses the actinic ray-sensitive or radiation-sensitive resin composition.

The present inventors have conducted intensive studies to accomplish the objects, and as a result, they have thus found that the problems can be solved with an actinic ray-sensitive or radiation-sensitive resin composition including a resin having a specific structure, thereby completing the present invention.

That is, the present inventors have found that the problems can be solved by the following configurations.

[1] An actinic ray-sensitive or radiation-sensitive resin composition comprising a resin including a repeating unit derived from a monomer having a salt structure and a repeating unit having a group whose polarity increases through decomposition by the action of an acid,
in which the salt structure consists of an anionic structure moiety and an actinic ray-sensitive decomposable or radiation-sensitive decomposable cationic structure moiety, and
a pKa of a monomer obtained by substituting the cationic structure moiety in the salt structure with a hydrogen atom is −0.80 or more.

[2] The actinic ray-sensitive or radiation-sensitive resin composition as described in [1],
in which the monomer having the salt structure is a monomer represented by General Formula (X1) which will be described later.

[3] The actinic ray-sensitive or radiation-sensitive resin composition as described in [1] or [2], further comprising a photoacid generator that generates an acid upon irradiation with actinic rays or radiation.

[4] The actinic ray-sensitive or radiation-sensitive resin composition as described in [3],
in which a pKa of an acid generated from the photoacid generator is smaller than a pKa of a monomer obtained by substituting the cationic structure moiety in the salt structure with a hydrogen atom.

[5] A resist film formed using the actinic ray-sensitive or radiation-sensitive resin composition as described in any one of [1] to [4].

[6] A pattern forming method comprising:
a resist film forming step of forming a resist film using the actinic ray-sensitive or radiation-sensitive resin composition as described in any one of [1] to [4];
an exposing step of exposing the resist film; and
a developing step of developing the exposed resist film using a developer.

[7] A method for manufacturing an electronic device, comprising the pattern forming method as described in [6].

According to the present invention, it is possible to provide an actinic ray-sensitive or radiation-sensitive resin composition which is capable of forming a pattern having an excellent pattern line width roughness (LWR).

In addition, according to the present invention, it is possible to provide a resist film, a pattern forming method, and a method for manufacturing an electronic device, each of which uses the actinic ray-sensitive or radiation-sensitive resin composition.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

"Actinic rays" or "radiation" in the present specification means, for example, a bright line spectrum of a mercury lamp, far ultraviolet rays typified by an excimer laser, extreme ultraviolet rays (EUV light), X-rays, electron beams (EB), or the like. "Light" in the present specification means actinic rays or radiation.

Unless otherwise specified, "exposure" in the present specification encompasses not only exposure by a bright line spectrum of a mercury lamp, far ultraviolet rays typified by an excimer laser, extreme ultraviolet rays, X-rays, EUV light, or the like, but also lithography by particle rays such as electron beams and ion beams.

In the present specification, a numerical range expressed using "to" is used in a meaning of a range that includes the preceding and succeeding numerical values of "to" as the lower limit value and the upper limit value, respectively.

In the present specification, (meth)acrylate represents acrylate and methacrylate.

In the present specification, the weight-average molecular weight (Mw), the number-average molecular weight (Mn), and the dispersity (also referred to as a molecular weight distribution) (Mw/Mn) of a resin are each defined as a value converted in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, detector: differential refractive index detector) using a GPC apparatus (HLC-8120 GPC manufactured by Tosoh Corporation).

In citations for a group (atomic group) in the present specification, in a case where the group is cited without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

Furthermore, in the present specification, in a case of referring to an expression "a substituent may be contained", the types of substituents, the positions of the substituents, and the number of the substituents are not particularly limited. The number of the substituents may be, for example, one, two, three, or more. Examples of the substituent include a monovalent non-metal atomic group from which a hydrogen atom has been excluded, and the substituent can be selected from the following substituent group T, for example.

(Substituent T)

Examples of the substituent T include halogen atoms such as a fluorine atom, a chlorine atom, a bromine atom, and an iodine atom; an alkoxy group such as a methoxy group, an ethoxy group, and a tert-butoxy group; an aryloxy group such as a phenoxy group and a p-tolyloxy group; an alkoxycarbonyl group such as a methoxycarbonyl group, a butoxycarbonyl group, and a phenoxycarbonyl group; an acyloxy group such as an acetoxy group, a propionyloxy group, and a benzoyloxy group; an acyl group such as an acetyl group, a benzoyl group, an isobutyryl group, an acryloyl group, a methacryloyl group, and a methoxalyl group; an alkylsulfanyl group such as a methylsulfanyl group and a tert-butylsulfanyl group; an arylsulfanyl group such as a phenylsulfanyl group and a p-tolylsulfanyl group; an alkyl group; a cycloalkyl group; an aryl group; a heteroaryl group; a hydroxyl group; a carboxyl group; a formyl group; a sulfo group; a cyano group; an alkylaminocarbonyl group; an arylaminocarbonyl group; a sulfonamido group; a silyl group; an amino group; a monoalkylamino group; a dialkylamino group; an arylamino group; and a combination thereof.

[Actinic Ray-Sensitive or Radiation-Sensitive Resin Composition]

The actinic my-sensitive or radiation-sensitive resin composition of the embodiment of the present invention (hereinafter also referred to as "the composition of the embodiment of the present invention") includes a resin (hereinafter also referred to as a "resin (A)") including a repeating unit (hereinafter also referred to as a "repeating unit A") derived from a monomer having a salt structure and a repeating unit (hereinafter also referred to as a "repeating unit B") having a group (hereinafter also referred to as an "acid-decomposable acid") whose polarity increases through decomposition by the action of an acid, the salt structure consists of an anionic structure moiety and an actinic my-sensitive decomposable or radiation-sensitive decomposable cationic structure moiety, and a pKa (acid dissociation constant) of a monomer obtained by substituting the cationic structure moiety in the salt structure with a hydrogen atom is −0.80 or more.

With the configuration, a pattern formed with the composition of the embodiment of the present invention has an excellent pattern line width roughness (LWR).

A reason therefor is not clear in detail, but is presumed as follows by the present inventors.

As described above, the pKa of the monomer from which the repeating unit A is derived is −0.80 or more in a case where the cationic structure moiety in the salt structure is substituted with a hydrogen atom. This pKa value is typically larger than the pKa value of an acid which is generated from the photoacid generator and contributes to the deprotection reaction of the acid-decomposable group. That is, the repeating unit A has a salt structure (preferably an onium salt structure) capable of generating an acid which is weaker than an acid generated from the photoacid generator.

Therefore, in the unexposed portion of the actinic my-sensitive or radiation-sensitive film (hereinafter also referred to as a "resist film"), an acid generated from the photoacid generator upon irradiation with actinic rays or radiations produces a salt having a weak acid and a strong acid anion by salt exchange in a case where the acid collides with the salt structure in the repeating unit A. That is, in this process, since the strong acid is exchanged with a weak acid having a lower catalytic ability, the acid is apparently deactivated, and thus, the acid diffusion can be controlled. On the other hand, the cationic structure moiety decomposes and the anionic structure moiety is protonated in the salt structure in the repeating unit A in the abovementioned resin (A) in the exposed portion, whereby the salt structure is converted into an acid structure. In a case where the salt structure in the repeating unit A is converted into the acid structure, the basicity to an acid generated from the photoacid generator upon irradiation with actinic rays or radiation is reduced. As a result, in the exposed portion, a deprotection reaction of the acid-decomposable group generated from the photoacid generator proceeds smoothly.

As described above, in the resist film formed with the composition of the embodiment of the present invention, the resin (A) includes the repeating unit A having an acid diffusion control function. With this configuration, a problem of uneven concentration distribution caused by the aggregation of acid diffusion control agents and the like, which occurs with a resist film formed from a resist composition including an acid diffusion control agent alone in addition to the resin (related art), can be solved. That is, with the composition of the embodiment of the present invention, the suppression (neutralization) of diffusion of an acid generated from a photoacid generator proceeds uniformly, and the LWR performance of a pattern thus formed is excellent.

Hereinafter, the components included in the composition of the embodiment of the present invention will be described in detail. Furthermore, the composition of the embodiment of the present invention is a so-called resist composition, and may be either a positive tone resist composition or a negative tone resist composition. In addition, the composition of the embodiment of the present invention may be either a resist composition for alkali development or a resist composition for organic solvent development.

The composition of the embodiment of the present invention is typically a chemically amplified resist composition.

<Resin (A)>

The composition of the embodiment of the present invention includes a resin (hereinafter also referred to as a "resin (A)").

As the resin (A), for example, the resin (AX1) which will be described later and the resin (AX2) which will be described later can be used, and among these, the resin (AX1) is preferable.

(Resin (AX1))

The resin (AX1) includes a resin including a repeating unit derived from a monomer having a salt structure (repeating unit A) and a repeating unit having an acid-decomposable group (repeating unit B).

In a case where the composition of the embodiment of the present invention includes the resin (AX1), usually, a pattern thus formed is a positive tone pattern with a use of an alkali developer as a developer, and the pattern thus formed is a negative tone pattern with a use of an organic developer as the developer.

• Repeating Unit A

The resin (AX1) includes a repeating unit (repeating unit A) derived from a monomer having a salt structure.

The salt structure consists of an anionic structure moiety and an actinic ray-sensitive decomposable or radiation-sensitive decomposable cationic structure moiety.

In addition, the pKa of a monomer obtained by substituting the cationic structure moiety in the salt structure with a hydrogen atom is −0.80 or more. The pKa is preferably −0.50 or more, and more preferably 0 or more. In addition, an upper limit value thereof is not particularly limited, but is, for example, 30 or less.

Moreover, a value of the pKa is preferably larger than the pKa of an acid generated from a photoacid generator (a photoacid generator which contributes to the deprotection reaction of an acid-decomposable group upon irradiation with actinic rays or radiation, such as a photoacid generator (B) which will be described later). Further, the pKa can be measured by the following method.

<<Measurement of Acid Dissociation Constant pKa>>

In the present specification, the acid dissociation constant pKa refers to an acid dissociation constant pKa in an aqueous solution, and is defined, for example, in Chemical Handbook (II) (Revised 4th Edition, 1993, compiled by the Chemical Society of Japan, Maruzen Company, Ltd.), and a lower value thereof indicates higher acid strength. Specifically, the acid dissociation constant pKa in an aqueous solution can be actually measured by using an infinite-dilution aqueous solution and measuring the acid dissociation constant at 25° C., and the acid dissociation constant pKa can also be determined using the following software package 1 by computation from a value based on a Hammett substituent constant and the database of publicly known literature values. Any of the values of pKa described in the present specification represent values determined by calculation using the software package.

Software Package 1: Advanced Chemistry Development (ACD/Labs) Software V 8.14 for Solaris (1994-2007ACD/Labs)

The monomer having a salt structure is preferably a monomer represented by General Formula (X1) from the viewpoint that the LWR of a pattern thus formed is more excellent. With regard to the monomer represented by General Formula (X1), a monomer obtained by substituting the cationic structure moiety in the salt structure with a hydrogen atom satisfies a pKa of −0.80 or more.

(X1)

$P^{11}$ represents a polymerizable group. The type of the polymerizable group is not particularly limited, examples thereof include known polymerizable groups, and from the viewpoint of reactivity, a functional group capable of performing an addition polymerization reaction is preferable, and an ethylenically unsaturated polymerizable group is more preferable. Examples of the polymerizable group include substituents represented by (Q1) to (Q7) shown below. In addition, a hydrogen atom in the substituent represented by each of (Q1) to (Q7) shown below may be substituted with other substituents such as a halogen atom.

 (Q1)

 (Q2)

 (Q3)

 (Q4)

 (Q5)

 (Q6)

 (Q7)

$L^{11}$ represents a single bond or an m+1-valent linking group.

The m+1-valent linking group represented by $L^{11}$ is not particularly limited, and examples thereof include groups represented by (A1) to (A5). Further, in (A1) to (A5), *[1] represents a bonding position to $P^{11}$, and *2 represents a bonding position to $Y^{11-}$.

It should be noted that in a case where $Y^{11-}$ which will be described later is an anionic functional group represented by General Formula (Y) which will be described later, $L^{11}$ represents *[1]—CO—O-$L^{S1}$-*2. $L^{S1}$ represents a divalent linking group which includes no —O—CO—. Further, in a case where $Y^{11-}$ which will be described later is an anionic functional group represented by General Formula (Y2) which will be described later, $L^{11}$ includes neither a phenylene group nor a lactone structure.

The $L^{S1}$ is preferably an alkyl group having 1 to 20 carbon atoms (which may be in any of linear, branched, and cyclic forms).

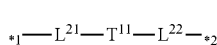
(A1)

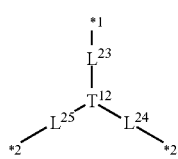
(A2)

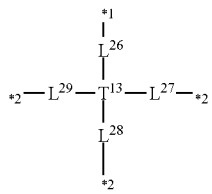
(A3)

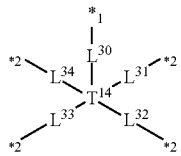
(A4)

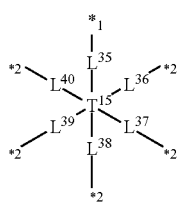
(A5)

In (A1) to (A5), $T^{11}$ represents a single bond, a divalent hydrocarbon ring group, or a divalent heterocyclic group, $T^{12}$ represents a trivalent hydrocarbon ring group or a trivalent heterocyclic group, $T^{13}$ represents a tetravalent hydrocarbon ring group or a tetravalent heterocyclic group, $T^{14}$ represents a pentavalent hydrocarbon ring group or a pentavalent heterocyclic group, and $T^{15}$ represents a hexavalent hydrocarbon ring group or a hexavalent heterocyclic group.

The hydrocarbon ring group may be an aromatic hydrocarbon ring group or an aliphatic hydrocarbon ring group. The number of carbon atoms included in the hydrocarbon ring group is preferably 6 to 18, and more preferably 6 to 14.

The heterocyclic group may be either an aromatic heterocyclic group or an aliphatic heterocyclic group. The heterocycle is preferably a 5- to 10-membered ring, more preferably a 5- to 7-membered ring, and still more preferably a 5- or 6-membered ring, each of which has at least one N atom, O atom, S atom, or Se atom in the ring structure.

In addition, in (A1) to (A5), $L^{21}$ to $L^{40}$ each independently represent a single bond or a divalent linking group.

Examples of the divalent linking group represented by each of $L^{21}$ to $L^{40}$ include —N=N—, —O—, —S—, —$NR^a$—, —CO—, an alkylene group (which may be in any of cyclic, branched, and linear forms), an alkenylene group, an alkynylene group, or a divalent group formed by combination of these groups. $R^a$ represents a hydrogen atom or a substituent (for example, an alkyl group).

The alkylene group preferably has 1 to 10 carbon atoms, more preferably has 1 to 6 carbon atoms, and still more preferably has 1 to 4 carbon atoms.

The alkenylene group preferably has 2 to 10 carbon atoms, more preferably has 2 to 6 carbon atoms, and still more preferably has 2 to 4 carbon atoms.

The alkynylene group preferably has 2 to 10 carbon atoms, more preferably has 2 to 6 carbon atoms, and still more preferably has 2 to 4 carbon atoms.

The alkylene group, the alkenylene group, and the alkynylene group represented by each of $L^{21}$ to $L^{40}$ may each have a substituent. As the substituent, a halogen atom is preferable, and a fluorine atom is more preferable.

$Y^{11-}$ represents a group selected from the group consisting of anionic functional groups represented by General Formulae (Y1) to (Y8).

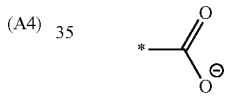
(Y1)

In General Formula (Y1), * represents a bonding position to $L^{11}$.

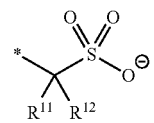
(Y2)

In General Formula (Y2), $R^{11}$ and $R^{12}$ each independently represent a hydrogen atom or a monovalent organic group.

The monovalent organic group represented by each of $R^{11}$ and $R^{12}$ is not particularly limited, and examples thereof include the groups exemplified in the above-mentioned substituent group T. As the monovalent organic group represented by each of $R^{11}$ and $R^{12}$, an alkyl group (which may be in any of linear, branched, and cyclic forms, and preferably has 1 to 20 carbon atoms, more preferably has 1 to 10 carbon atoms, and still more preferably has 1 to 6 carbon atoms), a fluoroalkyl group (which represents an alkyl group substituted with at least one fluorine atom, is preferably, for example, a perfluoroalkyl group, and preferably has 1 to 10 carbon atoms, and more preferably has 1 to 4 carbon atoms in the fluoroalkyl group), a halogen atom (examples of the halogen atom includes a fluorine atom, a chlorine atom, a bromine atom, and an iodine atom), and an alkoxy group (which may be in any of linear, branched, and cyclic forms, and preferably has 1 to 20 carbon atoms, more preferably has 1 to 10 carbon atoms, and still more preferably has 1 to 6 carbon atoms) is preferable.

It should be noted that in a case where one of $R^{11}$ and $R^{12}$ represents a fluorine atom or a fluoroalkyl group, the other of $R^{11}$ and $R^{12}$ represents a hydrogen atom or a monovalent organic group different from the fluorine atom and the fluoroalkyl group.

Furthermore, $R^{11}$ and $R^{12}$ may be bonded to each other to form a ring. Incidentally, $R^{11}$ and $R^2$ may be bonded to $L^{11}$ in General Formula (X1) to forma ring. It should be noted that the ring formed by the bonding of $R^{11}$ and $L^{11}$ in General Formula (X1) and the ring formed by the bonding of $R^{12}$ and $L^{11}$ in General Formula (X1) include no benzene ring.

* represents a bonding position to $L^{11}$.

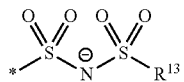
(Y3)

In General Formula (Y3), $R^{13}$ represents a monovalent organic group.

Examples of the monovalent organic group represented by $R^{13}$ include the same ones as those of the monovalent organic group represented by each of $R^{11}$ and $R^{12}$ in General Formula (Y2), and among these, an alkyl group (which may be in any of linear, branched, and cyclic forms, and preferably has 1 to 20 carbon atoms, more preferably has 1 to 10 carbon atoms, and still more preferably has 1 to 6 carbon atoms) is preferable.

It should be noted that in a case where a group adjacent to a sulfur atom (intended to mean a sulfur atom linked to $R^{13}$, which is specified in General Formula (Y3)) in $R^{13}$ is a carbon atom, the carbon atom has no fluorine atom as a substituent. Incidentally, $R^{13}$ may be bonded to $L^{11}$ in General Formula (X1) to forma ring. * represents a bonding position to $L^{11}$.

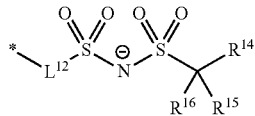
(Y4)

In General Formula (Y4), $L^{12}$ represents a single bond or a divalent linking group.

Examples of the divalent linking group represented by $L^{12}$ include —N=N—, —O—, —S—, —NR$^a$—, —CO—, alkylene groups (which may be in any of cyclic, branched, and linear forms), an alkenylene group, an alkynylene group, or a divalent group formed by combination of these groups. $R^a$ represents a hydrogen atom or a substituent (for example, an alkyl group).

The alkylene group preferably has 1 to 10 carbon atoms, more preferably has 1 to 6 carbon atoms, and still more preferably has 1 to 4 carbon atoms.

The alkenylene group preferably has 2 to 10 carbon atoms, more preferably has 2 to 6 carbon atoms, and still more preferably has 2 to 4 carbon atoms.

The alkynylene group preferably has 2 to 10 carbon atoms, more preferably has 2 to 6 carbon atoms, and still more preferably has 2 to 4 carbon atoms.

The alkylene group, the alkenylene group, and the alkynylene group may have a substituent. As the substituent, a halogen atom is preferable, and a fluorine atom is more preferable.

Among those, the divalent linking group represented by $L^{12}$ is preferably a —CO—O-alkylene group.

$R^{14}$, $R^{15}$, and $R^{16}$ each independently represent a hydrogen atom or a monovalent organic group.

Examples of the monovalent organic group represented by each of $R^{14}$, $R^{15}$, and $R^{16}$ include the same ones as those of the monovalent organic group represented by each of $R^{11}$ and $R^{12}$ in General Formula (Y2), and among these, an alkyl group (which may be in any of linear, branched, and cyclic forms, and preferably has 1 to 20 carbon atoms, more preferably has 1 to 10 carbon atoms, and still more preferably has 1 to 6 carbon atoms) is preferable.

It should be noted that in a case where two of $R^{14}$, $R^{15}$, and $R^{16}$ represent a fluorine atom or a fluoroalkyl group, one of $R^{14}$, $R^{15}$, and $R^{16}$ represents a hydrogen atom or represents a monovalent organic group different from the fluorine atom and the fluoroalkyl group. In addition, in a case where two of $R^{14}$, $R^{15}$, and $R^{16}$ each represent a fluorine atom or a fluoroalkyl group, and a group adjacent to an amido group (intended to mean an amido group linked to $L^{12}$, which is specified in General Formula (Y4)) in $L^{12}$ is a carbon atom, the carbon atom does not have two or more fluorine atoms and fluoroalkyl groups as the substituent.

In addition, $R^{14}$, $R^{15}$, and $R^{16}$ may be bonded to each other to form a ring. Further, $R^{14}$, $R^{15}$, and $R^{16}$ may be each independently bonded to $L^{12}$ to form a ring. In addition, $R^{14}$, $R^{15}$, and $R^{16}$ may be each independently bond to $L^{11}$ in General Formula (X1) to form a ring.

* represents a bonding position to $L^{11}$.

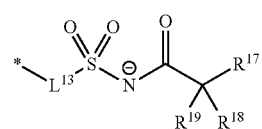
(Y5)

In General Formula (Y5), $L^{13}$ represents a single bond or a divalent linking group.

Examples of the divalent linking group represented by $L^{13}$ include the same ones as those of the divalent linking group represented by $L^{12}$ in General Formula (Y4). Among these, as the divalent linking group represented by $L^{13}$, a —CO—O-alkylene group is preferable.

$R^{17}$, $R^{18}$, and $R^{19}$ each independently represent a hydrogen atom or a monovalent organic group.

Examples of the monovalent organic group represented by each of $R^{17}$, $R^{18}$, and $R^{19}$ include the same ones as those of the monovalent organic group represented by each of $R^{11}$ and $R^{12}$ in General Formula (Y2), and among these, an alkyl group (which may be in any of linear, branched, and cyclic forms, and preferably has 1 to 20 carbon atoms, more preferably has 1 to 10 carbon atoms, and still more preferably has 1 to 6 carbon atoms) is preferable.

It should be noted that two or more of $R^{17}$, $R^{18}$, or $R^{19}$ each represent a fluorine atom or a fluoroalkyl group, and a group adjacent to a sulfonamido group (intended to mean a sulfonamido group linked to $L^{13}$, which is specified in General Formula (Y5)) in $L^{13}$ is a carbon atom, the carbon atom does not have two or more fluorine atoms and fluoroalkyl groups as a substituent.

Moreover, $R^{17}$, $R^{18}$, and $R^{19}$ may be bonded to each other to form a ring. Further, $R^{17}$, $R^{18}$, and $R^{19}$ may be each independently bonded to $L^{13}$ to form a ring. In addition, $R^{17}$, $R^{18}$, and $R^{19}$ may be each independently bonded to $L^{11}$ in General Formula (X1) to form a ring. * represents a bonding position to $L^{11}$.

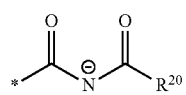

(Y6)

In General Formula (Y6), $R^{20}$ represents a monovalent organic group.

Examples of the monovalent organic group represented by $R^{20}$ include the same ones as those of the monovalent organic group represented by each of $R^{11}$ and $R^{12}$ in General Formula (Y2), and among these, an alkyl group (which may be in any of linear, branched, and cyclic forms, and preferably has 1 to 20 carbon atoms, more preferably has 1 to 10 carbon atoms, and still more preferably has 1 to 6 carbon atoms) is preferable.

In addition, $R^{20}$ may be bonded to $L^{11}$ in General Formula (X1) to form a ring. * represents a bonding position to $L^{11}$.

(Y7)

In General Formula (Y7), * represents a bonding position to $L^{11}$. It should be noted that the atom bonded to * in $L^{11}$ is a carbon atom which is not a carbonyl group.

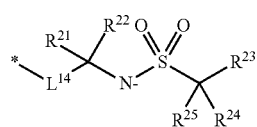

(Y8)

In General Formula (Y8), $L^{14}$ represents a single bond or a divalent linking group.

Examples of the divalent linking group represented by $L^{14}$ include the same ones as those of the divalent linking groups represented by $L^{12}$ in General Formula (Y4). Among those, the divalent linking group represented by $L^{14}$ is preferably a —CO—O-alkylene group.

$R^{21}$, $R^{22}$, $R^{23}$, $R^{24}$, and $R^{25}$ each independently represent a hydrogen atom or a monovalent organic group.

Examples of the monovalent organic group represented by each of $R^{21}$, $R^{22}$, $R^{23}$, $R^{24}$, and $R^{25}$ include the same ones as those of the monovalent organic group represented by each of $R^{11}$ and $R^{12}$ in General Formula (Y2), and among these, an alkyl group (which may be in any of linear, branched, and cyclic forms, and preferably has 1 to 20 carbon atoms, more preferably has 1 to 10 carbon atoms, and still more preferably has 1 to 6 carbon atoms) is preferable.

Moreover, $R^{23}$, $R^{24}$, and $R^{25}$ may be bonded to each other to form a ring. Furthermore, $R^{23}$, $R^{24}$, and $R^{25}$ may be each independently bonded to $L^{14}$, $R^{21}$, and $R^{22}$ to form a ring. Incidentally, $R^{21}$, $R^{22}$, and $L^{14}$ may be bonded to each other to form a ring. In addition, $R^{23}$, $R^{24}$, and $R^{25}$ may be each independently bonded to $L^{11}$ in General Formula (X1) to form a ring.

$Z^{11+}$ represents an actinic ray-sensitive decomposable or radiation-sensitive decomposable cation.

The actinic my-sensitive decomposable or radiation-sensitive decomposable cation is not particularly limited as long as it can convert the salt structure in the repeating unit A into the above-mentioned acid structure upon irradiation with actinic rays or radiation.

As the actinic my-sensitive decomposable or radiation-sensitive decomposable cation, for example, a cation represented by General Formula (XI), a cation represented by General Formula (XII), or a cation represented by General Formula (XIII) is preferable.

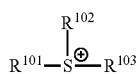

(XI)

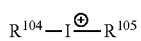

(XII)

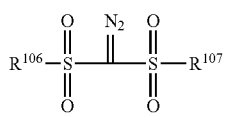

(XIII)

In General Formula (XI),
$R^{101}$, $R^{102}$, and $R^{103}$ each independently represent an organic group.

The organic group as each of $R^{101}$, $R^{102}$, and $R^{103}$ generally has 1 to 30 carbon atoms, and preferably has 1 to 20 carbon atoms.

In addition, two of $R^{101}$ to $R^{103}$ may be bonded to each other to form a ring structure, and the ring may include an oxygen atom, a sulfur atom, an ester bond, an amide bond, or a carbonyl group. Examples of the group formed by the bonding of two of $R^{101}$ to $R^{103}$ include an alkylene group (for example, a butylene group and a pentylene group), and —CH$_2$—CH$_2$—O—CH$_2$—CH$_2$—.

As the cation represented by General Formula (XI), a cation represented by a compound (XI-1), a cation represented by a compound (XI-2), a cation represented by General Formula (XI-3), or a cation represented by General Formula (XI-4) is preferable.

First, the cation represented by the compound (XI-1) will be described.

The cation represented by the compound (XI-1) is a cation in which at least one of $R^{101}$, . . . , or $R^{103}$ in General Formula (XI) is an aryl group (arylsulfonium cation).

In the cation represented by the compound (XI-1), all of $R^{101}$ to $R^{103}$ may be an aryl group, or a part of $R^{101}$ to $R^{103}$ may be an aryl group and the rest may be an alkyl group or a cycloalkyl group.

Examples of the cation represented by the compound (XI-1) include a triarylsulfonium cation, a diarylalkylsulfonium cation, an aryldialkylsulfonium cation, a diarylcycloalkylsulfonium cation, and an aryldicycloalkylsulfonium cation.

As the aryl group included in the arylsulfonium cation, a phenyl group or a naphthyl group is preferable, a phenyl group is more preferable. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium cation has two or more aryl groups, the two or more aryl groups may be the same as or different from each other.

The alkyl group or the cycloalkyl group which may be contained in the arylsulfonium cation, as necessary, is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group represented by each of $R^{101}$ to $R^{103}$ may each independently have an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group as a substituent.

Next, the cation represented by the compound (XI-2) will be described.

The cation represented by the compound (XI-2) is a cation in which $R^{101}$ to $R^{103}$ in Formula (XI) each independently represent an organic group having no aromatic ring. Here, examples of the aromatic ring also include an aromatic ring including a heteroatom.

The organic group having no aromatic ring as each of $R^{101}$ to $R^{103}$ generally has 1 to 30 carbon atoms, and preferably 1 to 20 carbon atoms.

$R^{101}$ to $R^{103}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

As the alkyl group and the cycloalkyl group of each of $R^{101}$ to $R^{103}$, a linear alkyl group having 1 to 10 carbon atoms or branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group) is preferable.

$R^{101}$ to $R^{103}$ may be further substituted with a halogen atom, an alkoxy group (for example, having 1 to 5 carbon atoms), a hydroxyl group, a cyano group, or a nitro group.

Next, the cation represented by General Formula (XI-3) will be described.

The cation represented by General Formula (XI-3) is a phenacylsulfonium cation represented by the following general formula.

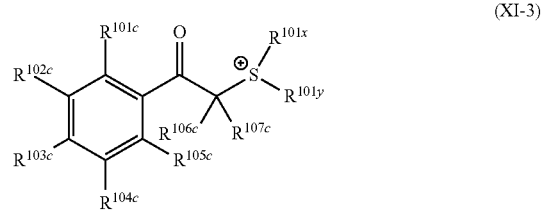

In General Formula (XI-3), $R^{101c}$ to $R^{105c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R^{106c}$ and $R^{107c}$ each independently represent a hydrogen atom, an alkyl group, a cycloalkyl group, a halogen atom, a cyano group, or an aryl group.

$R^{101x}$ and $R^{101y}$ each independently represent an alkyl group, a cycloalkyl group, a 2-oxoalkyl group, a 2-oxocycloalkyl group, an alkoxycarbonylalkyl group, an allyl group, or a vinyl group.

Any two or more of $R^{101c}$, ..., or $R^{105c}$, $R^{105c}$ and $R^{106c}$, $R^{106c}$ and $R^{107c}$, $R^{105c}$ and $R^{101x}$, or $R^{101x}$ and $R^{101y}$ may be bonded to each other to form a ring structure, and the ring structure may each independently include an oxygen atom, a sulfur atom, a ketone group, an ester bond, or an amide bond.

Examples of the ring structure include an aromatic or non-aromatic hydrocarbon ring, an aromatic or non-aromatic heterocycle, and a polycyclic fused ring in which two or more of these rings are combined. Examples of the ring structure include a 3- to 10-membered ring, preferably a 4- to 8-membered ring, and more preferably a 5- or 6-membered ring.

Examples of the group formed by the bonding of any two or more of $R^{101c}$, ..., or $R^{105c}$, $R^{106c}$ and $R^{107c}$, or $R^{101x}$ and $R^{101y}$ include a butylene group and a pentylene group.

The group formed by the bonding of $R^{105c}$ and $R^{106c}$, and $R^{105c}$ and $R^{101x}$ is preferably a single bond or an alkylene group. Examples of the alkylene group include a methylene group and an ethylene group.

Next, the cation represented by General Formula (XI-4) will be described.

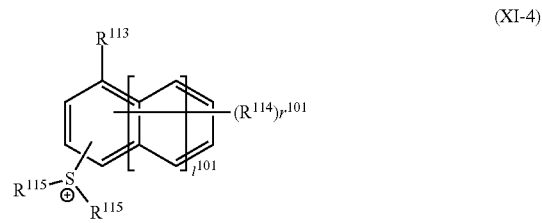

In General Formula (XI-4), $l^{101}$ represents an integer of 0 to 2.

$r^{101}$ represents an integer of 0 to 8.

$R^{13}$ represents a group having a hydrogen atom, a fluorine atom, a hydroxyl group, an alkyl group, a cycloalkyl group, an alkoxy group, an alkoxycarbonyl group, or a cycloalkyl group. These groups may have a substituent.

R[114] represents a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent. In a case where R[114]'s are present in a plural number, they each independently represent the group such as a hydroxyl group.

R[115]'s each independently represent an alkyl group, a cycloalkyl group, or a naphthyl group. These groups may have a substituent. Two of R[115]'s may be bonded to each other to form a ring. In a case where two of R[115]'s are bonded to each other to form a ring, the ring skeleton may include a heteroatom such as an oxygen atom and a nitrogen atom. In one aspect, it is preferable that two of R[115]'s are alkylene groups and are bonded to each other to form a ring structure.

In General Formula (XI-4), the alkyl groups represented by each of R[113], R[114], and R[115] are linear or branched. The alkyl group preferably has 1 to 10 carbon atoms. As the alkyl group, a methyl group, an ethyl group, an n-butyl group, or a t-butyl group is preferable.

Next, General Formula (XII) and General Formula (XIII) will be described.

In General Formulae (XII) and (XIII), R[104] to R[107] each independently represent an aryl group, an alkyl group, or a cycloalkyl group.

As the aryl group represented by each of R[104] to R[107], a phenyl group or a naphthyl group is preferable, and the phenyl group is more preferable. The aryl group represented by each of R[104] to R[107] may be an aryl group having a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

As the alkyl group and the cycloalkyl group represented by each of R[104] to R[107], a linear alkyl group having 1 to 10 carbon atoms, a branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group) is preferable.

The aryl group, the alkyl group, and the cycloalkyl group represented by each of R[104] to R[107] may each independently have a substituent. Examples of the substituent which may be contained in the aryl group, the alkyl group, and the cycloalkyl group represented by each of R[104] to R[107] include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

Preferred examples of the sulfonium cation in General Formula (XI) and the iodonium cation in General Formula (XII) are shown below.

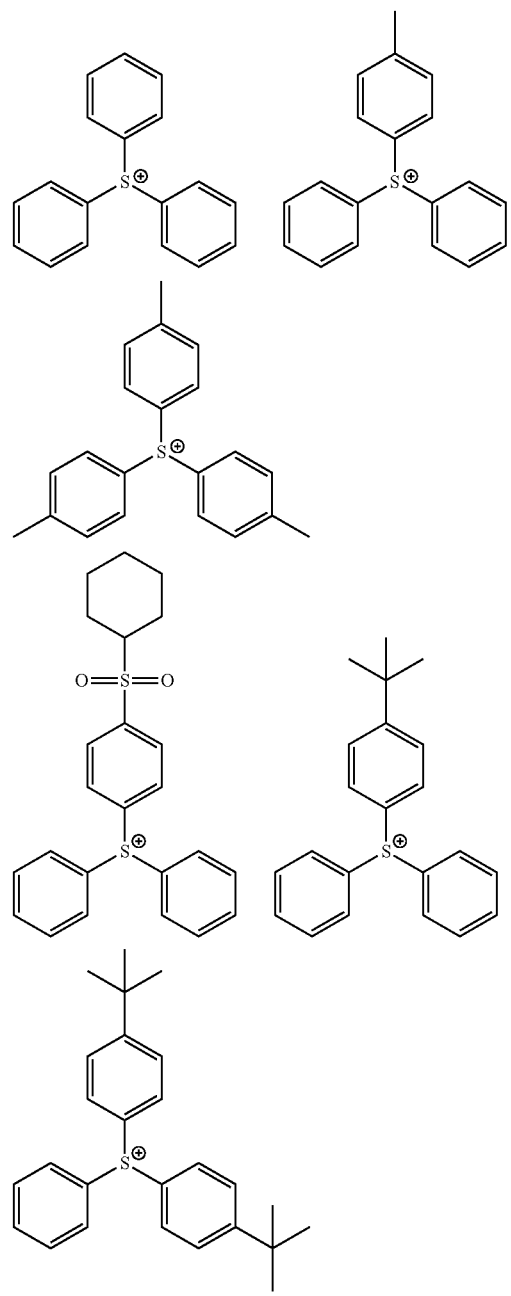

17
-continued

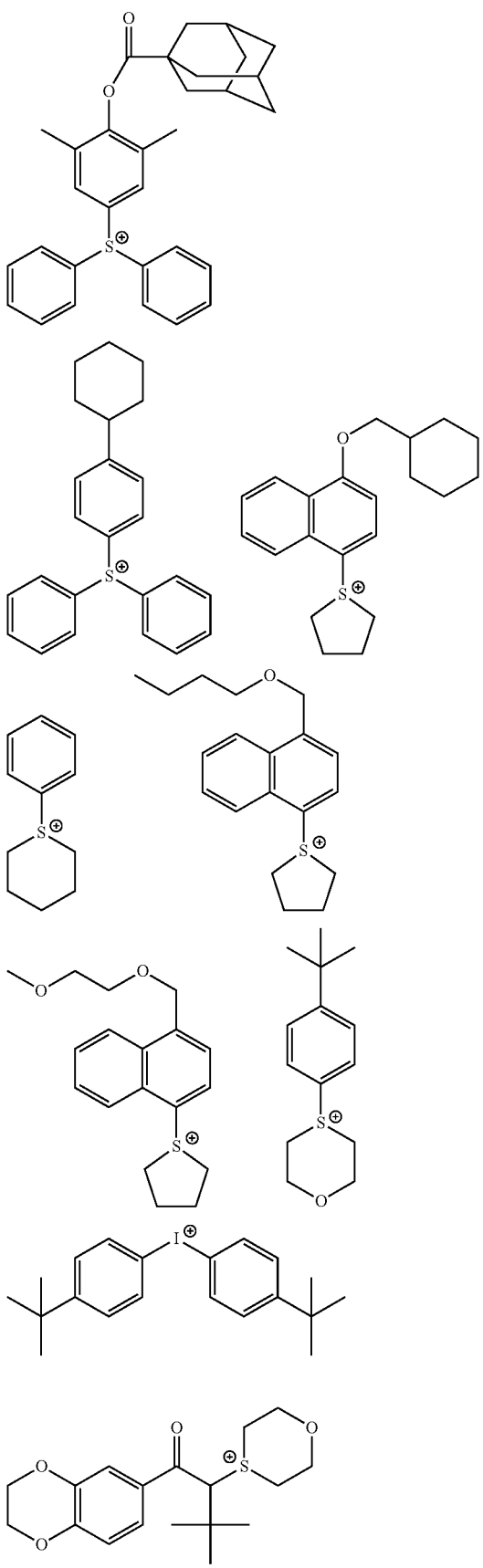

18
-continued

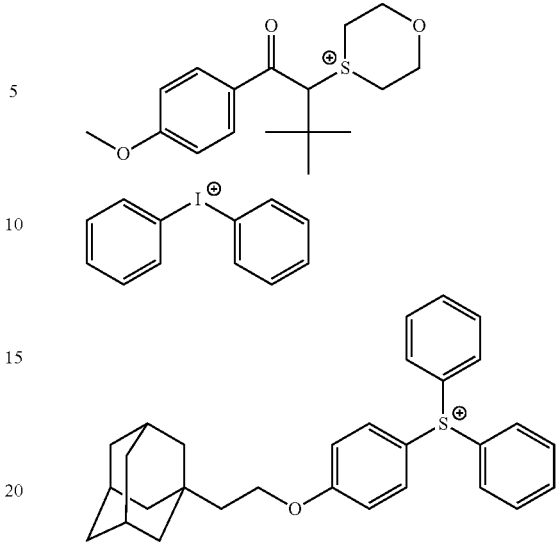

m represents an integer of 1 or more.

m is not particularly limited, but an upper limit thereof is, for example, 10, preferably 1 to 6, more preferably 1 to 4, and still more preferably 1 or 2.

The resin (AX1) may include the repeating unit A singly or in combination of two or more kinds thereof.

The content of the repeating unit A included in the resin (AX1) (in a case where the repeating units A are present in a plural number, a total content thereof) is preferably 0.5% to 15% by mole, more preferably 0.5% to 10% by mole, and still more preferably 1% to 10% by mole, with respect to all the repeating units of the resin (AX1).

• Repeating Unit B

The resin (AX1) includes a repeating unit having an acid-decomposable group (repeating unit B).

The acid-decomposable group preferably has a structure in which a polar group is protected with a group (leaving group) that leaves through decomposition by the action of an acid.

Examples of the polar group include an acidic group (a group which dissociates in a 2.38%-by-mass aqueous tetramethylammonium hydroxide solution), such as a carboxyl group, a phenolic hydroxyl group, a fluorinated alcohol group, a sulfonic acid group, a sulfonamido group, a sulfonylimido group, an (alkylsulfonylxalkylcarbonyl)methylene group, an (alkylsulfonylXalkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and an alcoholic hydroxyl group.

Moreover, the alcoholic hydroxyl group refers to a hydroxyl group bonded to a hydrocarbon group, which is a hydroxyl group other than a hydroxyl group (phenolic hydroxyl group) directly bonded to an aromatic ring, from which an aliphatic alcohol (for example, a hexafluoroisopropanol group) having the α-position substituted with an electron withdrawing group such as a fluorine atom is excluded as a hydroxyl group. The alcoholic hydroxyl group is preferably a hydroxyl group having an acid dissociation constant (pKa) from 12 to 20.

Preferred examples of the polar group include a carboxyl group, a phenolic hydroxyl group, a fluorinated alcohol group (preferably a hexafluoroisopropanol group), and a sulfonic acid group.

The group which is preferable as the acid-decomposable group is a group in which a hydrogen atom is substituted with a group (leaving group) that leaves by the action of an acid.

Examples of the group (leaving group) that leaves by the action of an acid include —$C(R_{36})(R_{37})(R_{38})$, —$C(R_{36})(R_{37})(OR_{39})$, and —$C(R_{01})(R_{02})(OR_{39})$.

In the formulae, $R_{36}$ to $R_{39}$ each independently an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, an aryl group, an aralkyl group, or an alkenyl group.

As the alkyl group as each of $R_{36}$ to $R_{39}$, $R_{01}$, and $R_{02}$, an alkyl group having 1 to 8 carbon atoms is preferable, and examples thereof include a methyl group, an ethyl group, a propyl group, an n-butyl group, a sec-butyl group, a hexyl group, and an octyl group.

The cycloalkyl group represented by each of $R_{36}$ to $R_{39}$, $R_{01}$, and $R_{02}$ may be either a monocycle or a polycycle. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, and a cyclooctyl group. As the polycyclic cycloalkyl group, a cycloalkyl group having 6 to 20 carbon atoms is preferable, and examples thereof include an adamantyl group, a norbornyl group, an isobornyl group, a camphanyl group, a dicyclopentyl group, an α-pinene group, a tricyclodecanyl group, a tetracyclododecyl group, and an androstanyl group. Further, at least one carbon atom in the cycloalkyl group may be substituted with a heteroatom such as an oxygen atom.

As the aryl group represented by each of $R_{36}$ to $R_{39}$, $R_{01}$, and $R_{02}$, an aryl group having 6 to 10 carbon atoms is preferable, and examples thereof include a phenyl group, a naphthyl group, and an anthryl group.

As the aralkyl group represented by each of $R_{36}$ to $R_{39}$, $R_{01}$, and $R_{02}$, an aralkyl group having 7 to 12 carbon atoms is preferable, and examples thereof include a benzyl group, a phenethyl group, and a naphthylmethyl group.

As the alkenyl group represented by each of $R_{36}$ to $R_{39}$, $R_{01}$, and $R_{02}$, an alkenyl group having 2 to 8 carbon atoms is preferable, and examples thereof include a vinyl group, an allyl group, a butenyl group, and a cyclohexenyl group.

The ring formed by the mutual bonding of $R_{36}$ and $R_{37}$ is preferably a (monocyclic or polycyclic) cycloalkyl group. As the cycloalkyl group, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group are preferable.

As the repeating unit having an acid-decomposable group, among others, a repeating unit having a structure (acid-decomposable group) in which a —COO— group is protected by a leaving group that leaves through decomposition by the action of an acid, or a repeating unit having a structure (acid-decomposable group) in which a phenolic hydroxyl group is protected by a leaving group that leaves through decomposition by the action of an acid is preferable.

Furthermore, examples of the structure (acid-decomposable group) in which a —COO— group is protected by a leaving group that leaves through decomposition by the action of an acid include a cumyl ester group, an enol ester group, an acetal ester group, and a tertiary alkyl ester group, and the acetal ester group or the tertiary alkyl ester group is preferable.

• Repeating Unit Having Structure in which —COO— Group is Protected by Leaving Group that Leaves Through Decomposition by Action of Acid The repeating unit having a structure in which a —COO— group is protected by a leaving group that leaves through decomposition by the action of an acid is preferably a repeating unit represented by General Formula (AI).

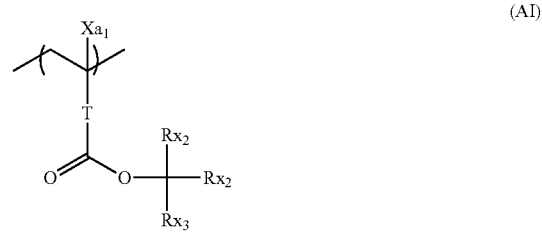

(AI)

In General Formula (AI), $Xa_1$ represents a hydrogen atom, a halogen atom, or a monovalent organic group.

T represents a single bond or a divalent linking group.

$Rx_1$ to $Rx_3$ each independently represent an alkyl group or a cycloalkyl group.

Any two of $Rx_1$, . . . , or $Rx_3$ may or may not be bonded to each other to form a ring structure.

Examples of the divalent linking group represented by T include an alkylene group, an arylene group, —COO-Rt-, and —O-Rt-. In the formulae, Rt represents an alkylene group, a cycloalkylene group, or an arylene group.

T is preferably the single bond or —COO-Rt-. Rt is preferably a chained alkylene group having 1 to 5 carbon atoms, and more preferably —$CH_2$—, —$(CH_2)_2$—, or —$(CH_2)_3$—.

T is more preferably the single bond.

$Xa_1$ is preferably a hydrogen atom or an alkyl group.

The alkyl group represented by $Xa_1$ may have a substituent, and examples of the substituent include a hydroxyl group and a halogen atom (preferably a fluorine atom).

The alkyl group represented by $Xa_1$ preferably has 1 to 4 carbon atoms, and examples thereof include a methyl group, an ethyl group, a propyl group, a hydroxymethyl group, and a trifluoromethyl group. The alkyl group of $Xa_1$ is preferably a methyl group.

The alkyl group represented by each of $Rx_1$, $Rx_2$, and $Rx_3$ may be linear or branched, and is preferably a methyl group, an ethyl group, an n-propyl group, an isopropyl group, an n-butyl group, an isobutyl group, a t-butyl group, or the like. The alkyl group preferably has 1 to 10 carbon atoms, more preferably has 1 to 5 carbon atoms, and still more preferably has 1 to 3 carbon atoms. In the alkyl group represented by each of $Rx_1$, $Rx_2$, and $Rx_3$, a part of carbon-carbon bonds may be a double bond.

As the cycloalkyl group represented by each of $Rx_1$, $Rx_2$, and $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As a ring structure formed by the bonding of two of $Rx_1$, $Rx_2$, and $Rx_3$, a monocyclic cycloalkane ring such as a cyclopentyl ring, a cyclohexyl ring, a cycloheptyl ring, and a cyclooctane ring, or a polycyclic cycloalkyl ring such as a norbornane ring, a tetracyclodecane ring, a tetracyclododecane ring, and an adamantane ring is preferable. Among those, the cyclopentyl ring, the cyclohexyl ring, or the adamantane ring is more preferable. As the ring structure formed by the bonding of two of $Rx_1$, $Rx_2$, and $Rx_3$, the structures shown below are also preferable.

Specific examples of a monomer corresponding to the repeating unit represented by General Formula (AI) are shown below, but the present invention is not limited to these specific examples. The following specific examples correspond to the case where $Xa_1$ in General Formula (AI) is a methyl group, but $Xa_1$ can be optionally substituted with a hydrogen atom, a halogen atom, or a monovalent organic group.

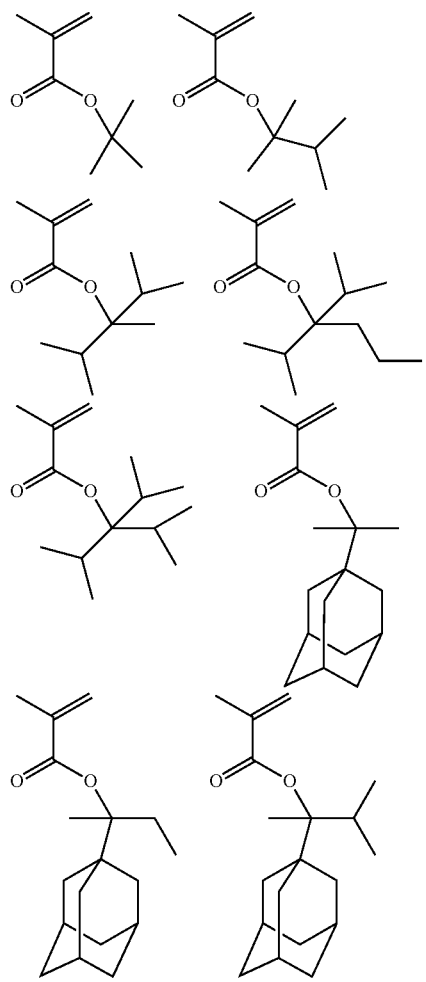

-continued

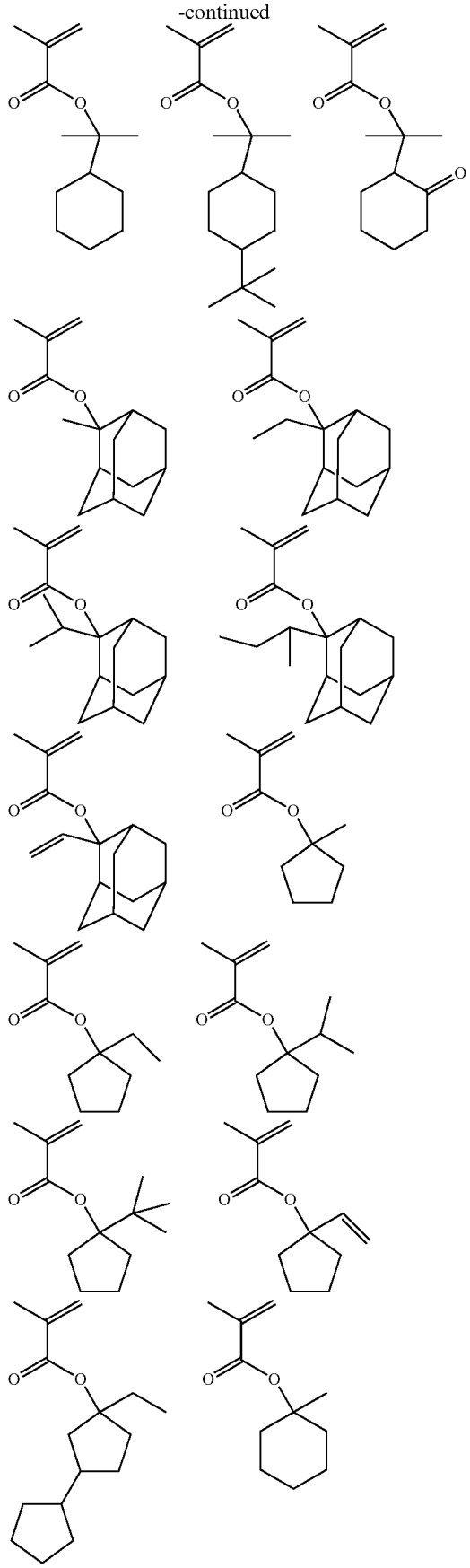

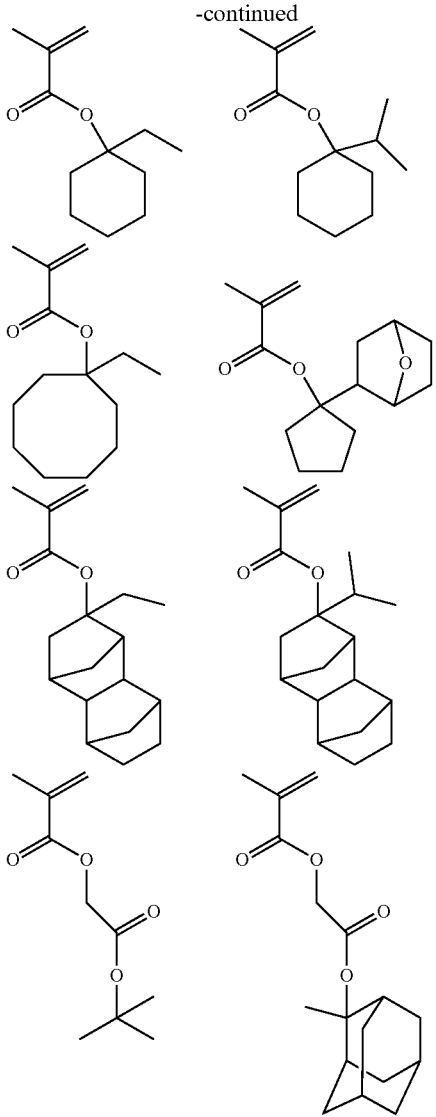

• Repeating Unit Having Structure (Acid-Decomposable Group) in which Phenolic Hydroxyl Group is Protected by Leaving Group that Leaves Through Decomposition by Action of Acid In the present specification, the phenolic hydroxyl group is a group obtained by substituting a hydrogen atom of an aromatic hydrocarbon group with a hydroxyl group. The aromatic ring of the aromatic hydrocarbon group is a monocyclic or polycyclic aromatic ring, and examples thereof include a benzene ring and a naphthalene ring.

Examples of the leaving group that leaves through decomposition by the action of an acid include groups represented by Formulae (Y1) to (Y4).

—C(Rx$_1$)(Rx$_2$)(Rx$_3$)   Formula (Y1):

—C(=O)OC(Rx$_1$)(Rx$_2$)(Rx$_3$)   Formula (Y2):

—C(R$_{36}$)(R$_{37}$)(OR$_{38}$)   Formula (Y3):

—C(Rn)(H)(Ar)   Formula (Y4):

In Formulae (Y1) and (Y2), Rx$_1$ to Rx$_3$ each independently represent an (linear or branched) alkyl group or a (monocyclic or polycyclic) cycloalkyl group. It should be noted that in a case where all of Rx$_1$ to Rx$_3$ are (linear or branched) alkyl groups, it is preferable that at least two of Rx$_1$, . . . , or Rx$_3$ are methyl groups.

Among those, Rx$_1$ to Rx$_3$ are more preferably each independently a repeating unit which represents a linear or branched alkyl group, and Rx$_1$ to Rx$_3$ are still more preferably each independently a repeating unit which represents a linear alkyl group.

Two of Rx$_1$ to Rx$_3$ may be bonded to each other to form a monocycle or a polycycle.

As the alkyl group of each of Rx$_1$ to Rx$_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of Rx$_1$ to Rx$_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of Rx$_1$ to Rx$_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable. Among those, a monocyclic cycloalkyl group having 5 or 6 carbon atoms is more preferable.

In the cycloalkyl group formed by the bonding of two of Rx$_1$ to Rx$_3$, for example, one of the methylene groups constituting the ring may be substituted with a heteroatom such as an oxygen atom, or a group having a heteroatom, such as a carbonyl group.

For the group represented by each of Formulae (Y1) and (Y2), for example, an aspect in which Rx$_1$ is a methyl group or an ethyl group, and Rx$_2$ and Rx$_3$ are bonded to each other to form the above-mentioned cycloalkyl group is preferable.

In Formula (Y3), R$_{36}$ to R$_{38}$ each independently represent a hydrogen atom or a monovalent organic group. R$_{37}$ and R$_{38}$ may be bonded to each other to form a ring. Examples of the monovalent organic group include an alkyl group, a cycloalkyl group, an aryl group, an aralkyl group, and an alkenyl group. R$_{36}$ is preferably a hydrogen atom.

In Formula (Y4), Ar represents an aromatic hydrocarbon group. Rn represents an alkyl group, a cycloalkyl group, or an aryl group. Rn and Ar may be bonded to each other to form a non-aromatic ring. Ar is more preferably an aryl group.

The repeating unit having a structure (acid-decomposable group) in which a phenolic hydroxyl group is protected by a leaving group that leaves through decomposition by the action of an acid preferably has a structure in which a hydrogen atom in the phenolic hydroxyl group is protected by a group represented by any of Formulae (Y1) to (Y4).

As the repeating unit having a structure in which the phenolic hydroxyl group is protected by a leaving group that leaves through decomposition by the action of an acid, a repeating unit represented by General Formula (AII) is preferable.

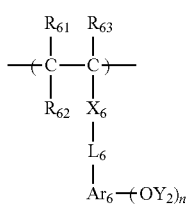
(AII)

In General Formula (AII), $R_{61}$, $R_{62}$, and $R_{63}$ each independently represent a hydrogen atom, an alkyl group, a cycloalkyl group, a halogen atom, a cyano group, or an alkoxycarbonyl group. It should be noted that $R_{62}$ may be bonded to $Ar_6$ to form a ring, and in this case, $R_{62}$ represents a single bond or an alkylene group.

$X_6$ represents a single bond, —COO—, or —$CONR_{64}$—. $R_{64}$ represents a hydrogen atom or an alkyl group.

$L_6$ represents a single bond or an alkylene group.

$Ar_6$ represents an (n+1)-valent aromatic hydrocarbon group, and in a case of being bonded to $R^{62}$ to form a ring, Ar represents an (n+2)-valent aromatic hydrocarbon group.

$Y_2$'s each independently represent a hydrogen atom or a group that leaves by the action of an acid in a case of n≥2. It should be noted that at least one of $Y_2$'s represents a group that leaves by the action of an acid. The group that leaves by the action of an acid as Y2 is preferably any of Formulae (Y1) to (Y4).

n represents an integer of 1 to 4.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), and these groups preferably have 8 or less carbon atoms.

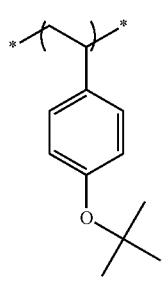
(VI-1)

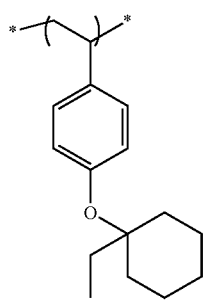
(VI-2)

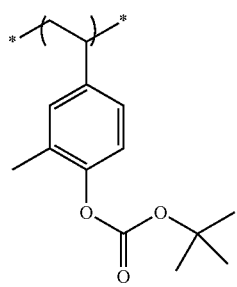
(VI-3)

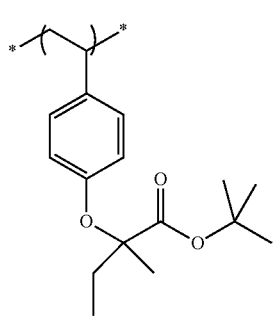
(VI-4)

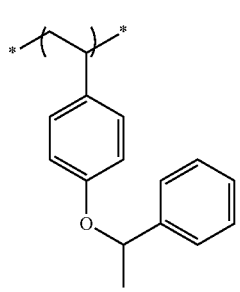
(VI-5)

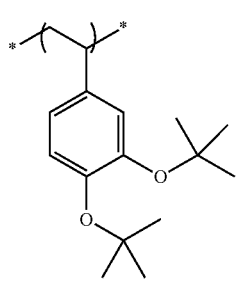
(VI-6)

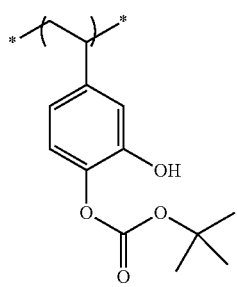
(VI-7)

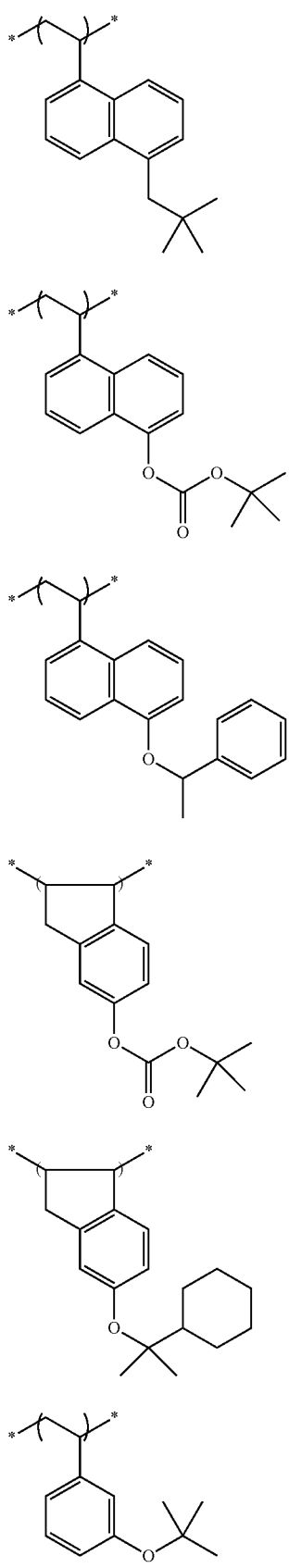
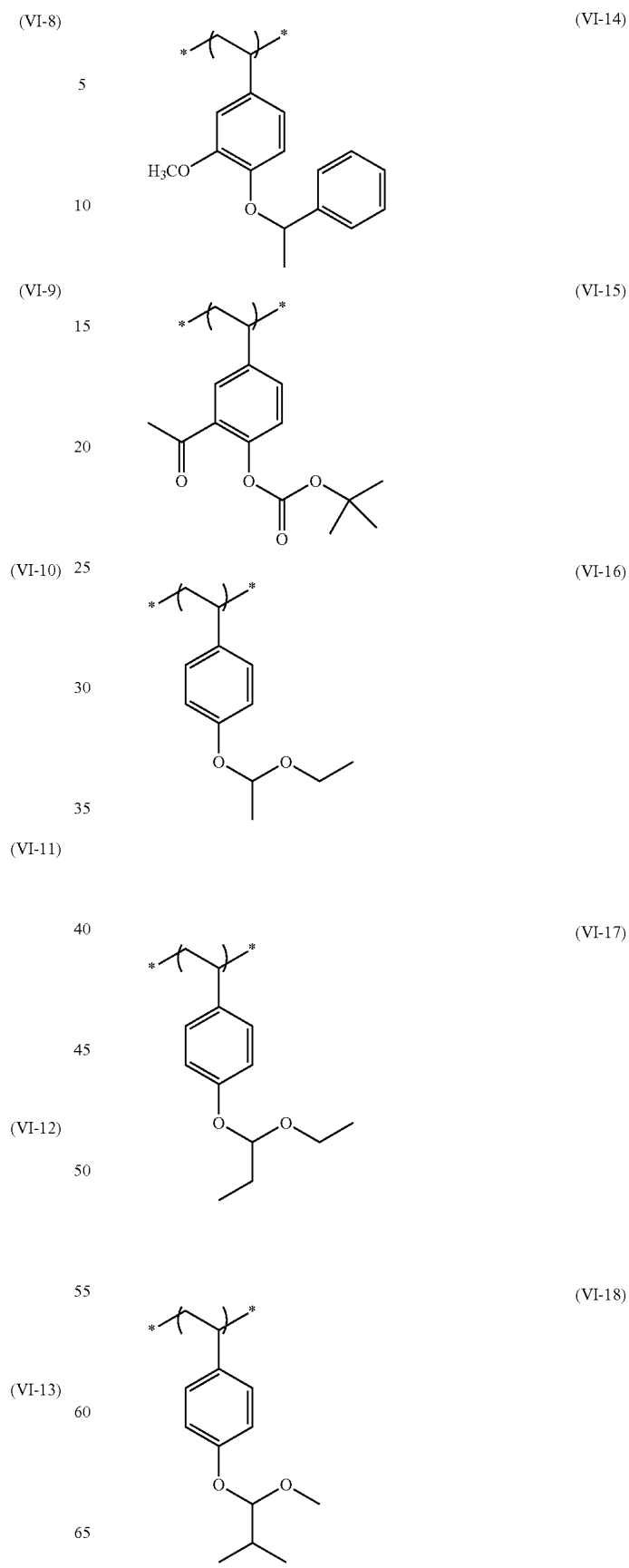

(VI-19)
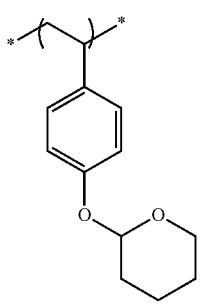
(VI-20)
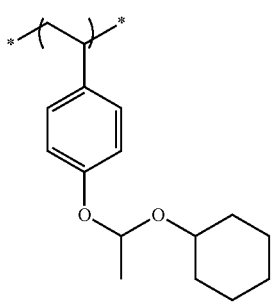
(VI-21)
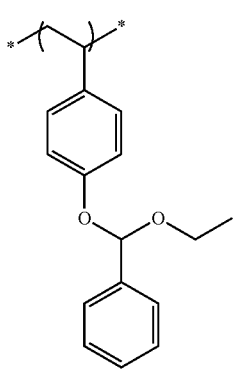
(VI-22)
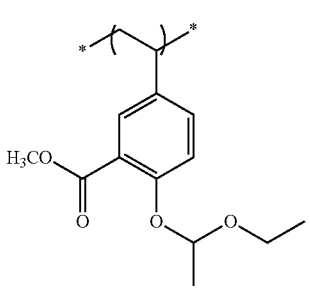
(VI-23)
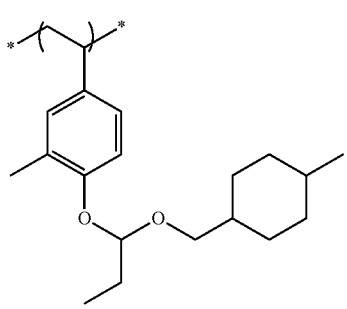
(VI-24)
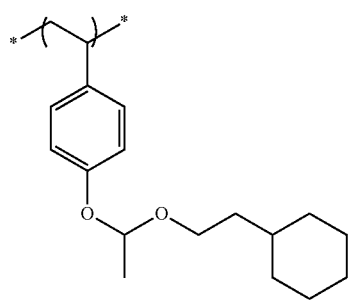
(VI-25)
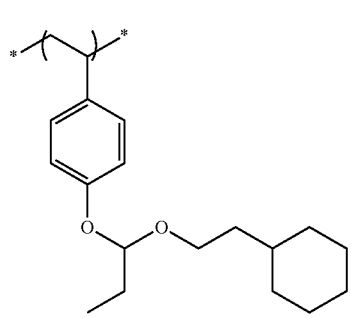
(VI-26)
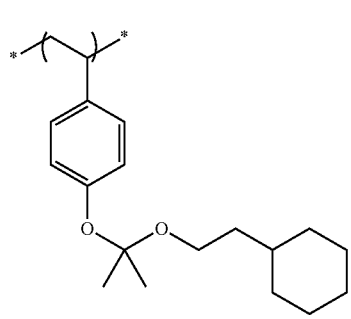
(VI-27)
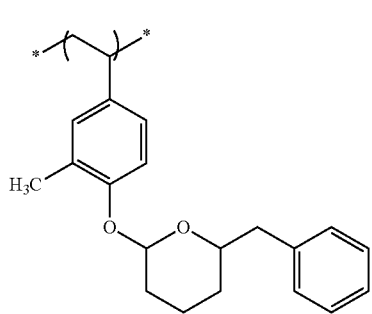
(VI-28)
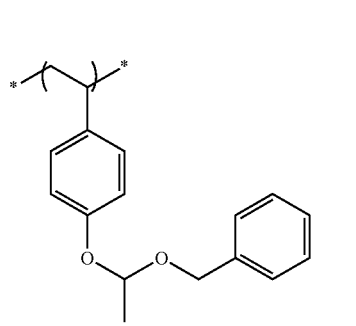

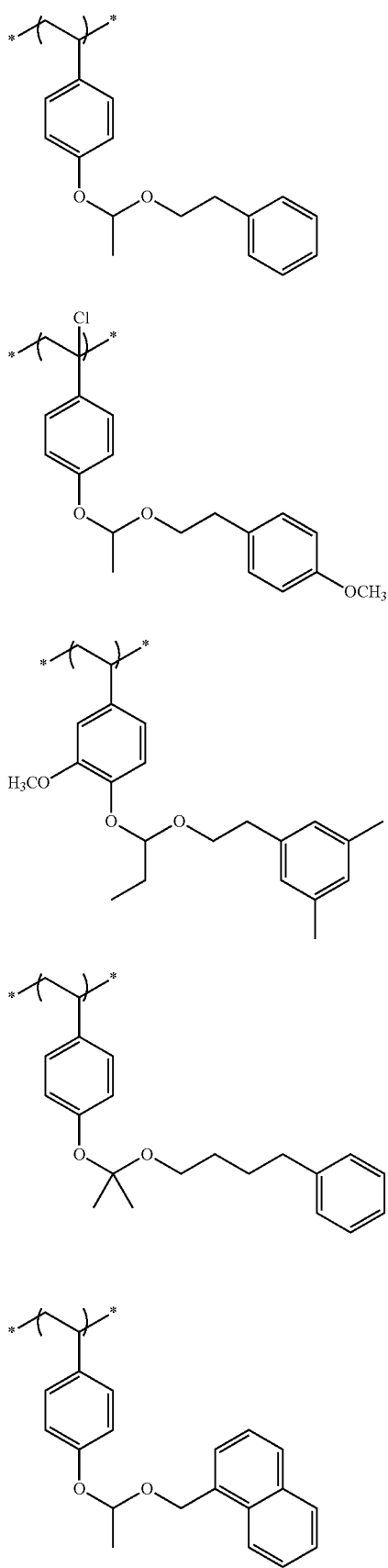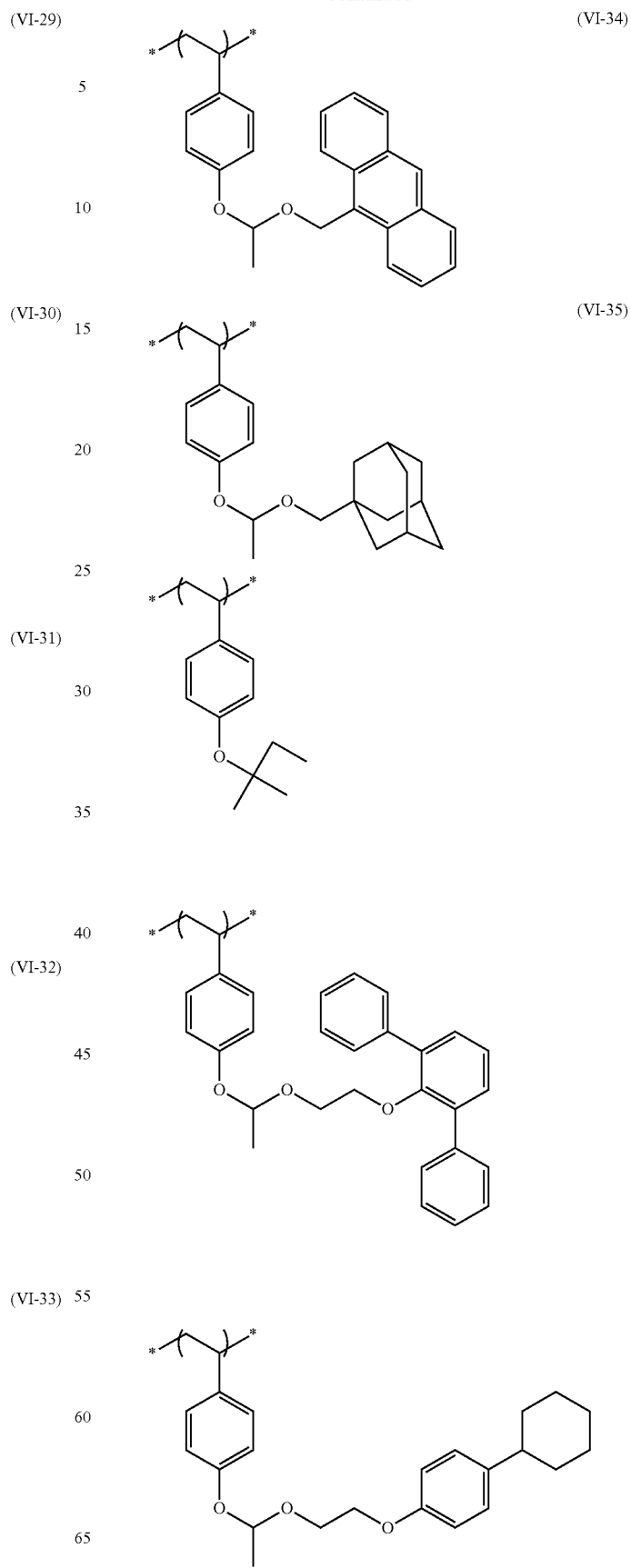

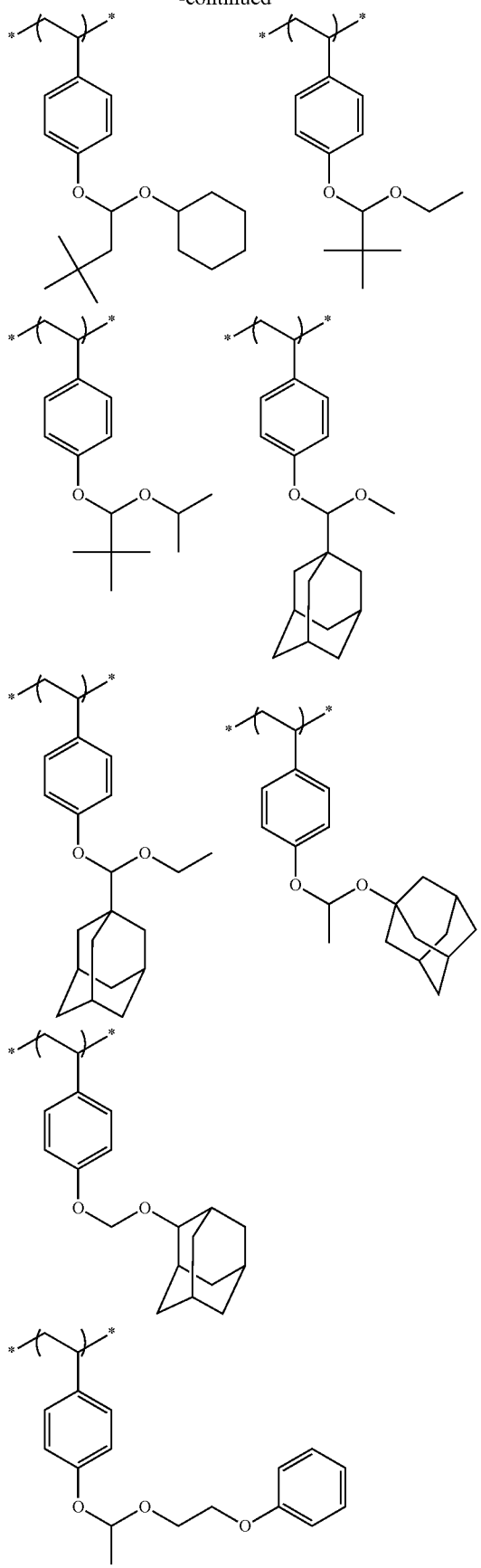
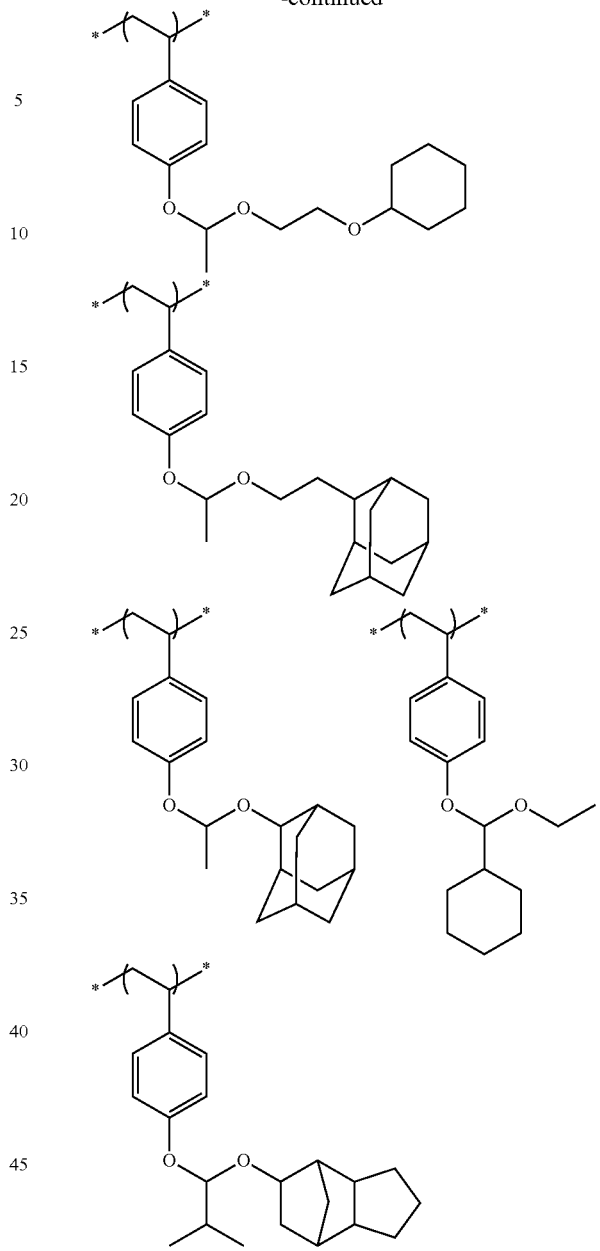

The resin (A) may include the repeating unit B singly or in combination of two or more kinds thereof.

It is also preferable that the resin (AX1) includes the repeating units described in paragraphs [0336] to [0369] of the specification of US2016/0070167A1 as the repeating unit B.

Furthermore, the resin (AX1) may also include the repeating unit having a group that decomposes by the action of an acid to produce an alcoholic hydroxyl group as described in paragraphs [0363] to [0364] of the specification of US2016/0070167A1 as the repeating unit B.

A content of the repeating unit B included in the resin (AX1) (in a case where the repeating units B are present in a plural number, a total content thereof) is preferably 10% to 90% by mole, more preferably 20% to 80% by mole, and still more preferably 30% to 70% by mole, with respect to all the repeating units of the resin (AX1).

• Repeating Unit C

Furthermore, the resin (AX1) preferably includes a repeating unit (hereinafter also referred to as a "repeating unit C") having at least one selected from the group consisting of a lactone structure, a sultone structure, and a carbonate structure.

As the lactone structure or sultone structure, any structure which has a lactone structure or sultone structure may be used, but the structure is preferably a 5- to 7-membered ring lactone structure or a 5- to 7-membered ring sultone structure. Among those, the structure is more preferably a 5- to 7-membered ring lactone structure with which another ring structure is fused in the form of forming a bicyclo structure or a spiro structure or a 5- to 7-membered ring sultone structure with which another ring structure is fused in the form of forming a bicyclo structure or a spiro structure.

The resin (AX1) still more preferably has a repeating unit having a lactone structure represented by any one of General Formulae (LC1-1) to (LC1-21) or a sultone structure represented by any one of General Formulae (SL1-1) to (SL1-3). Further, a lactone structure or sultone structure may be bonded directly to the main chain. Preferred examples of the structure include a lactone structure represented by General Formula (LC1-1), General Formula (LC1-4), General Formula (LC1-5), General Formula (LC1-8), General Formula (LC1-16), or General Formula (LC1-21), or a sultone structure represented by General Formula (SL1-1).

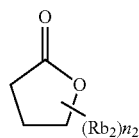

LC1-1

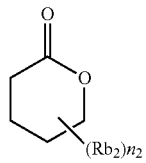

LC1-2

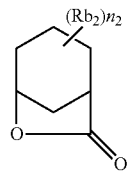

LC1-3

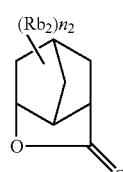

LC1-4

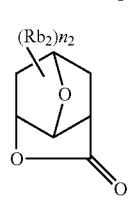

LC1-5

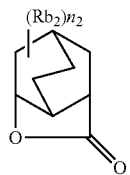

LC1-6

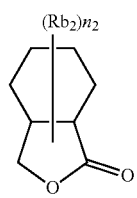

LC1-7

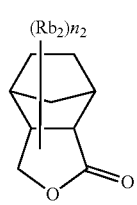

LC1-8

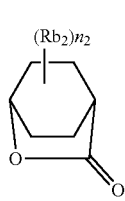

LC1-9

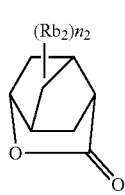

LC1-10

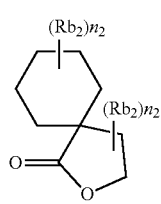

LC1-11

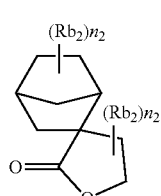

LC1-12

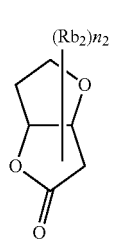

LC1-13

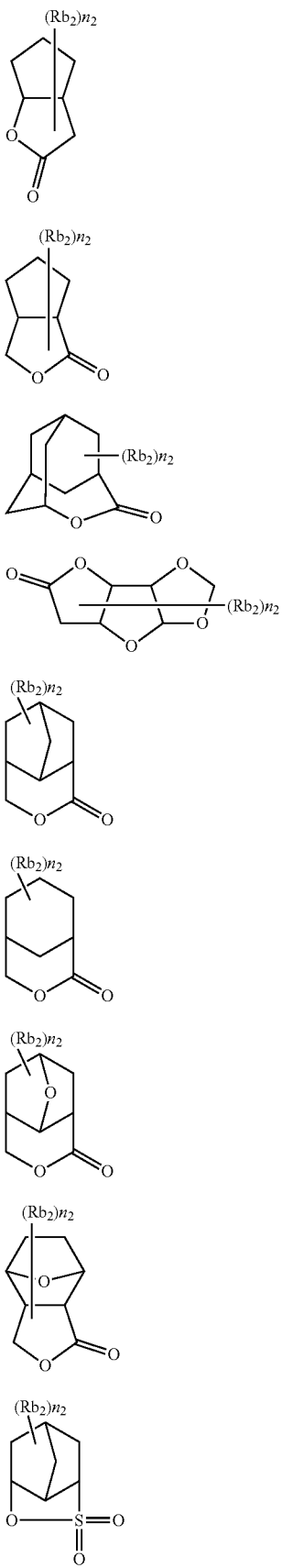

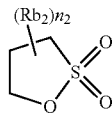

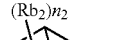

The lactone structural portion or the sultone structural portion may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group, and an alkyl group having 1 to 4 carbon atoms, the cyano group, or the acid-decomposable group is preferable. $n_2$ represents an integer of 0 to 4. In a case where $n_2$ is 2 or more, the substituents ($Rb_2$) which are present in a plural number may be the same as or different from each other. Further, the substituents ($Rb_2$) which are present in a plural number may be bonded to each other to form a ring.

As the repeating unit having a lactone structure or sultone structure, a repeating unit represented by General Formula (III) is preferable.

In General Formula (III),

A represents an ester bond (a group represented by —COO—) or an amide bond (a group represented by —CONH—).

n is the number of repetitions of the structure represented by —$R_0$—Z—, represents an integer of 0 to 5, and is preferably 0 or 1, and more preferably 0. In a case where n is 0, —$R_0$—Z— is not present and a single bond is formed.

$R_0$ represents an alkylene group, a cycloalkylene group, or a combination thereof. In a case where $R_0$'s are present in a plural number, $R_0$'s each independently represent an alkylene group, a cycloalkylene group, or a combination thereof.

Z represents a single bond, an ether bond, an ester bond, an amide bond, a urethane bond, or a urea bond. In a case where Z's are present in a plural number, they each independently represent a single bond, an ether bond, an ester bond, an amide bond, a urethane bond, or a urea bond.

$R_8$ represents a monovalent organic group having a lactone structure or sultone structure.

$R_7$ represents a hydrogen atom, a halogen atom, or a monovalent organic group (preferably a methyl group).

The alkylene group or the cycloalkylene group of $R_0$ may have a substituent.

As Z, an ether bond or an ester bond is preferable, and the ester bond is more preferable.

The resin (AX1) may have a repeating unit having a carbonate structure. The carbonate structure is preferably a cyclic carbonate structure.

The repeating unit having a cyclic carbonate structure is preferably a repeating unit represented by General Formula (A-1).

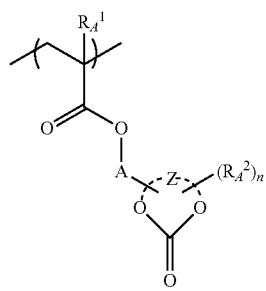

(A-1)

In General Formula (A-1), $R_A^1$ represents a hydrogen atom, a halogen atom, or a monovalent organic group (preferably a methyl group).

n represents an integer of 0 or more.

$R_A^2$ represents a substituent. In a case where n is 2 or more, $R_A^2$'s each independently represent a substituent.

A represents a single bond or a divalent linking group.

Z represents an atomic group that forms a monocyclic or polycyclic structure together with the group represented by —O—C(=O)—O— in the formula.

It is also preferable that the resin (AX1) includes the repeating unit described in paragraphs [0370] to [0414] of the specification of US2016/0070167A1 as the repeating unit C.

Specific examples of a monomer corresponding to the repeating unit represented by General Formula (III) and specific examples of a monomer corresponding to the repeating unit represented by General Formula (A-1) are shown below, but the present invention is not limited to such specific examples. The following specific examples correspond to a case where $R_7$ in General Formula (III) and $R_A^1$ in General Formula (A-1) are each a methyl group, but $R^7$ and $R_A^1$ can be optionally substituted with a hydrogen atom, a halogen atom, or a monovalent organic group.

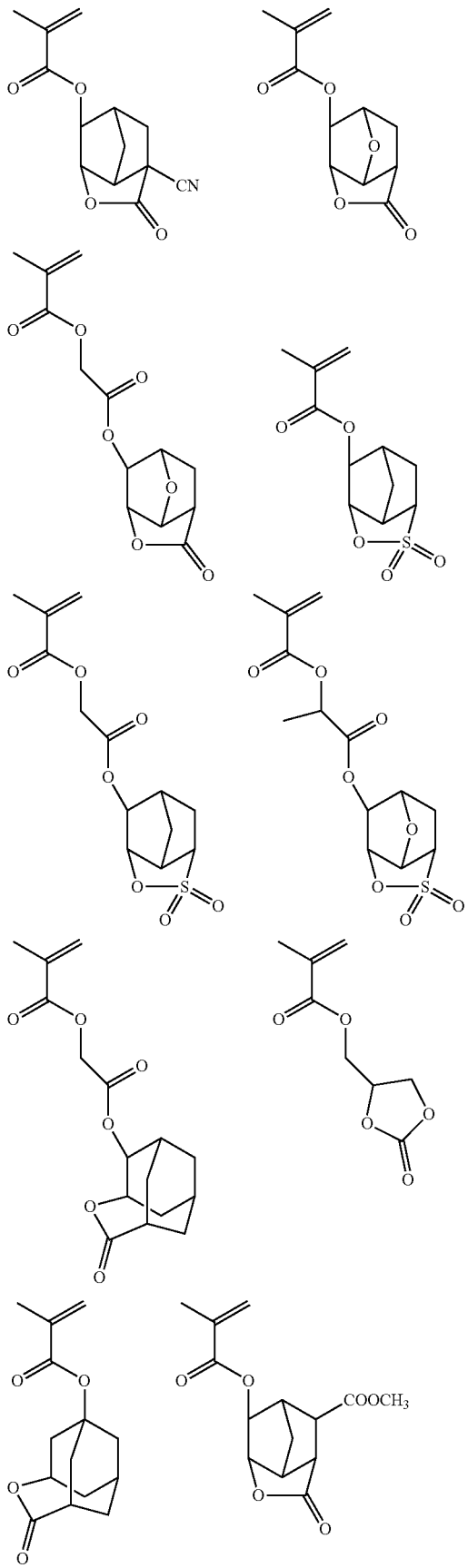

-continued

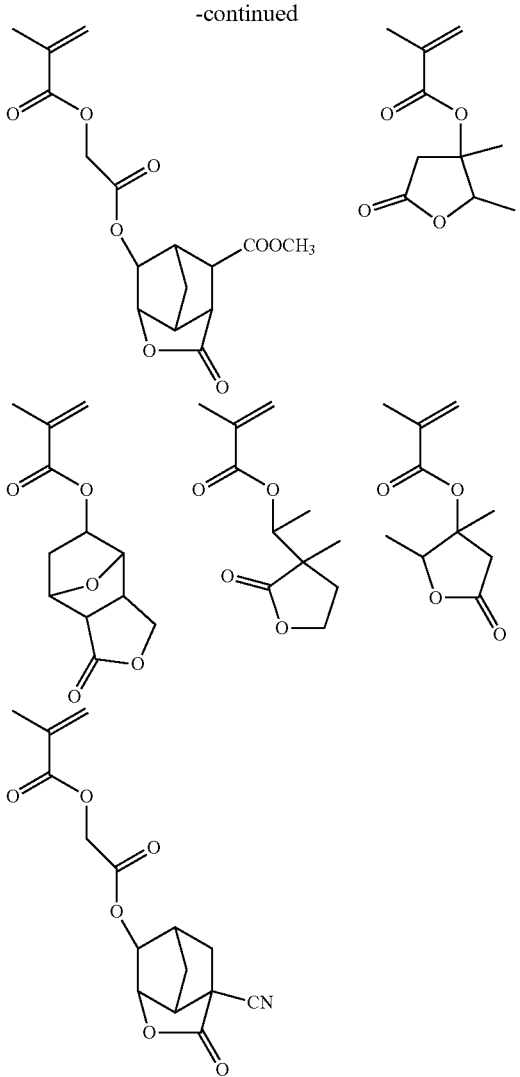

In addition to the monomers, monomers shown below are also suitably used as a raw material for the resin (AX1).

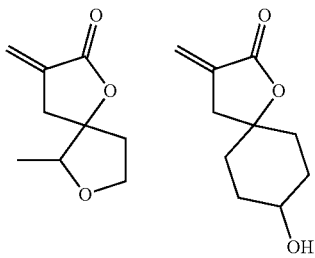

The resin (AX1) may have the repeating unit C singly or in combination of two or more kinds thereof.

A content of the repeating unit C included in the resin (AX1) (in a case where the repeating units C are present in a plural number, a total content thereof) is preferably 5% to 70% by mole, more preferably 10% to 65% by mole, and still more preferably 20% to 60% by mole, with respect to all the repeating units in the resin (AX1).

• Repeating Unit D

The resin (AX1) preferably includes a repeating unit (hereinafter also referred to as a "repeating unit D") having a polar group. Further, the repeating unit D does not include the above-mentioned repeating unit A, repeating unit B, and repeating unit C.

Examples of the polar group include a hydroxyl group, a cyano group, a carboxyl group, and a fluorinated alcohol group (for example, a hexafluoroisopropanol group).

As the repeating unit D, a repeating unit having an alicyclic hydrocarbon structure substituted with a polar group is preferable. With regard to the alicyclic hydrocarbon structure substituted with a polar group, the alicyclic hydrocarbon structure (alicyclic hydrocarbon group) is preferably a cyclohexyl group, an adamantyl group, or a norbornane group.

Specific examples of a monomer corresponding to the repeating unit D are shown below, but the present invention is not limited to these specific examples.

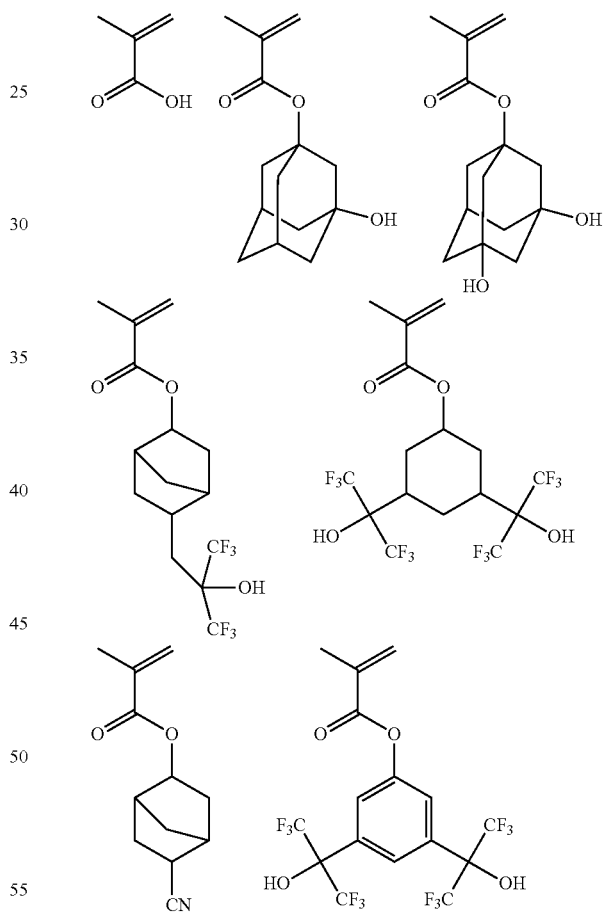

In addition to these, specific examples of the repeating unit D include the repeating units disclosed in paragraphs [0415] to [0433] of the specification of US2016/0070167A1.

The resin (AX1) may have the repeating unit D singly or in combination or two or more kinds thereof.

A content of the repeating unit D (in a case where the repeating units D are present in a plural number, a total content thereof) is preferably 5% to 60% by mole with respect to all the repeating units in the resin (AX1).

• Repeating Unit E

The resin (AX1) preferably further includes a repeating unit (hereinafter also referred to as a "repeating unit E") having a fluorine atom or an iodine atom. Further, the repeating unit E does not include the above-mentioned repeating unit A, repeating unit B, repeating unit C, and repeating unit D. Particularly, in a case of pattern formation by EUV exposure, it is preferable that the resin (AX1) includes the repeating unit E.

Specific examples of a monomer corresponding to the repeating unit E are shown below, but the present invention is not limited to these specific examples.

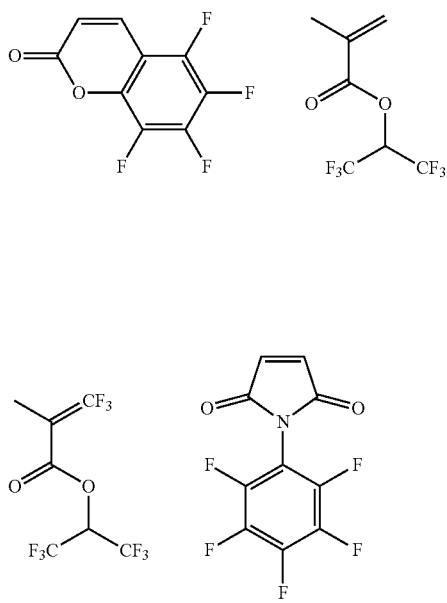

• Repeating Unit F

The resin (AX1) further contains a repeating unit (hereinafter also referred to as a "repeating unit F") other than the above-described repeating unit A, repeating unit B, repeating unit C, repeating unit D, and repeating unit E.

The repeating unit F preferably has an alicyclic hydrocarbon structure. Examples of the repeating unit F include the repeating units described in paragraphs [0236] and [0237] of the specification of US2016/0026083A1.

Preferred examples of a monomer corresponding to the repeating unit F are shown below.

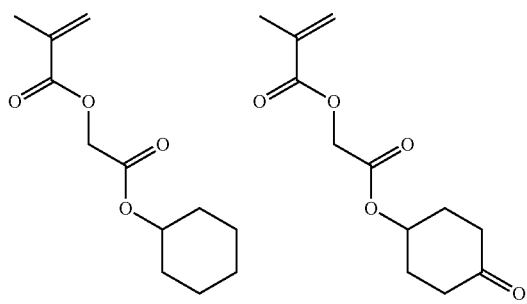

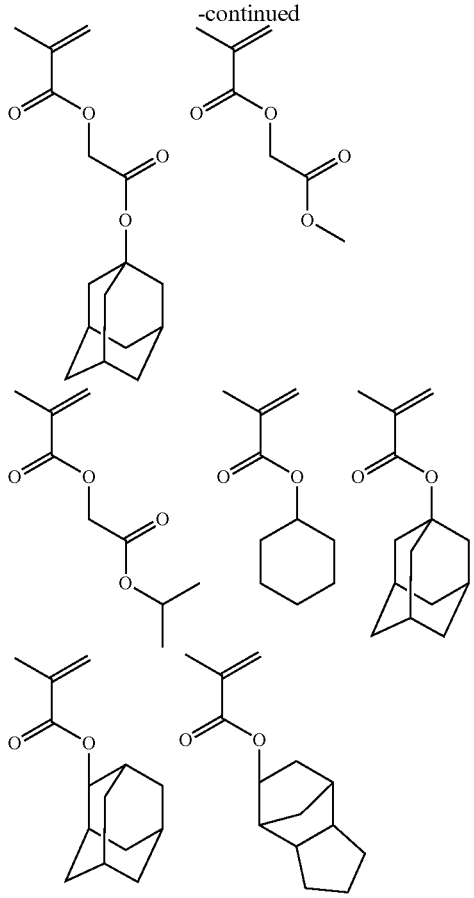

In addition to these, specific examples of the repeating unit F include the repeating unit disclosed in paragraph [0433] of the specification of US2016/0070167A1.

The resin (AX1) may also include the repeating unit F singly or in combination of two or more kinds thereof.

A content of the repeating unit F (in a case where the repeating units F are present in a plural number, a total content thereof) is preferably 5% to 40% by mole, more preferably 5% to 30% by mole, and still more preferably 5% to 25% by mole, with respect to all the repeating units in the resin (AX1).

Moreover, the resin (AX1) may have a variety of repeating structural units, in addition to the repeating structural units, as the repeating unit F for the purpose of controlling dry etching resistance, suitability for a standard developer, adhesiveness to a substrate, and a resist profile, resolving power, heat resistance, sensitivity, and the like which are general characteristics required for a resist.

Examples of such a repeating structural unit include a repeating structural unit corresponding to a predetermined monomer, but are not limited thereto.

Examples of a predetermined monomer include a compound having one addition-polymerizable unsaturated bond, selected from acrylates, methacrylates, acrylamides, methacrylamides, allyl compounds, vinyl ethers, and vinyl esters.

In addition to these, an addition-polymerizable unsaturated compound that is copolymerizable with a monomer corresponding to the various repeating structural units may be used.

In the resin (AX1), a content molar ratio of each repeating structural unit is appropriately set in order to adjust various performances.

In a case where the composition of the embodiment of the present invention is used for ArF exposure, the resin (AX1) has a repeating unit having an aromatic group in an amount of preferably 15% by mole or less, and more preferably 10% by mole or less, with respect to all the repeating units in the resin (AX1) from the viewpoint of transparency to ArF light.

In a case where the composition of the embodiment of the present invention is used for ArF exposure, it is still more preferable that the resin (AX1) includes a repeating unit having a structure in which a —COO— group is protected with a leaving group that leaves through decomposition by the action of an acid as the repeating unit B from the viewpoint of transparency to ArF light.

In a case where the composition of the embodiment of the present invention is for ArF exposure, it is preferable that all of the repeating units of the resin (AX1) are constituted with (meth)acrylate-based repeating units. In this case, any of a resin in which all of the repeating units are methacrylate-based repeating units, a resin in which all of the repeating units are acrylate-based repeating units, and a resin in which all of the repeating units are methacrylate-based repeating units and acrylate-based repeating units can be used, but it is preferable that the amount of the acrylate-based repeating units is 50% by mole or less with respect to all the repeating units of the resin (AX1).

In a case where the composition of the embodiment of the present invention is for KrF exposure, EB exposure, or EUV exposure, the resin (AX1) preferably has a repeating unit having an aromatic hydrocarbon ring group, and more preferably includes a repeating unit having a structure (acid-decomposable group) in which a phenolic hydroxyl group is protected by a leaving group that leaves through decomposition by the action of an acid as the repeating unit B.

In a case where the composition of the embodiment of the present invention is for KrF exposure, EB exposure, or EUV exposure, the content of the repeating unit having an aromatic hydrocarbon ring group included in the resin (AX1) is preferably 30% by mole or more with respect to all the repeating units in the resin (AX1). In addition, an upper limit value thereof is not particularly limited, but is, for example, 100% by mole or less.

Further, in a case where the composition of the embodiment of the present invention is for KrF exposure, EB exposure, or EUV exposure, the resin (AX1) preferably includes a fluorine atom or an iodine atom, and preferably includes, for example, a repeating unit having a polar group such as a fluorinated alcohol group (for example, a hexafluoroisopropanol group) as the repeating unit D or includes the repeating unit E. This is due to a fact that in a case where the resin (AX1) includes a fluorine atom or an iodine atom, the sensitivity of the composition is improved, the influence of photon shot noise can be reduced, and as a result, a pattern thus formed has a more excellent LWR. Incidentally, in a case where the resin (AX1) includes a fluorine atom or an iodine atom, a content of the fluorine atom or the iodine atom in the resin (AX1) is not particularly limited, but is preferably 2% by mass or more, more preferably 10% by mass or more, and still more preferably 20% by mass or more. In addition, an upper limit thereof is not particularly limited, but is, for example, 70% by mass, and preferably 50% by mass or less.

The weight-average molecular weight of the resin (AX1) is preferably 1,000 to 200,000, more preferably 2,000 to 20,000, and still more preferably 3,000 to 20,000. The dispersity (Mw/Mn) is usually 1.0 to 3.0, preferably 1.0 to 2.6, more preferably 1.0 to 2.0, and still more preferably 1.1 to 2.0.

The resin (AX1) may be used singly or in combination of two or more kinds thereof.

The content of the resin (AX1) in the composition of the embodiment of the present invention is generally 20.0% by mass or more in many cases, and is preferably 40.0% by mass or more, more preferably 60.0% by mass or more, and still more preferably 80.0% by mass or more, with respect to the total solid content. An upper limit thereof is not particularly limited, but is preferably 99.5% by mass or less, more preferably 99.0% by mass or less, and still more preferably 97.0% by mass or less.

(Resin (AX2))

The resin (AX2) is an alkali-soluble resin that includes the above-mentioned repeating unit A and the above-mentioned repeating unit B, and includes a phenolic hydroxyl group.

Moreover, in a case where the composition of the embodiment of the present invention includes the resin (AX2), the composition of the embodiment of the present invention includes the crosslinking agent (G) which will be described later together with the resin (AX2). Further, the crosslinking agent (G) may be in the state of being supported on the resin (AX2).

In a case where the composition of the embodiment of the present invention includes the resin (AX2), a pattern thus formed is usually a negative tone pattern.

The resin (AX2) preferably includes, among those, the above-mentioned repeating unit A, the above-mentioned repeating unit B, and a repeating unit having a phenolic hydroxyl group.

The repeating unit having a phenolic hydroxyl group contained in the resin (AX2) is preferably a repeating unit represented by General Formula (II).

(II)

In General Formula (II), $R^2$ represents a hydrogen atom, an alkyl group (preferably a methyl group), or a halogen atom (preferably a fluorine atom).

B' represents a single bond or a divalent linking group.

Ar' represents an aromatic ring group.

m represents an integer of 1 or more.

The divalent linking group represented by B' has the same meaning as T in General Formula (AI), and a suitable aspect thereof is also the same.

The aromatic ring group represented by Ar' is preferably a benzene ring.

m is not particularly limited as long as it is an integer of 1 or more, but is preferably 1 to 4, more preferably 1 to 3, and still more preferably 1 or 2.

Moreover, the repeating unit A and the repeating unit B included in the resin (AX2) are as described above.

The resin (AX2) may be used singly or in combination of two or more kinds thereof.

A content of the resin (AX2) in the total solid content of the composition of the embodiment of the present invention is generally 30% by mass or more in many cases, and is preferably 40% by mass or more, and more preferably 50% by mass or more. An upper limit thereof is not particularly limited, but is preferably 99% by mass or less, more preferably 90% by mass or less, and still more preferably 85% by mass or less.

Suitable examples of the resin (AX2) include the resins disclosed in paragraphs [0142] to [0347] of the specification of US2016/0282720A1.

The composition of the embodiment of the present invention may include both the resin (AX1) and the resin (AX2).

<Photoacid Generator (B)>

The composition of the embodiment of the present invention preferably includes a compound that generates an acid upon irradiation with actinic rays or radiation (hereinafter also referred to as an "photoacid generator (B)").

Furthermore, the photoacid generator (B) as mentioned herein corresponds to an acid generator which is usually used for causing a crosslinking reaction of a resin component since it causes a deprotection reaction of the resin component (deprotection reaction of an acid-decomposable resin).

The photoacid generator (B) is preferably a compound that generates an organic acid upon irradiation with actinic rays or radiation. Examples thereof include a sulfonium salt compound, an iodonium salt compound, a diazonium salt compound, a phosphonium salt compound, an imidosulfonate compound, an oxime sulfonate compound, a diazodisulfone compound, a disulfone compound, and an o-nitrobenzyl sulfonate compound.

As the photoacid generator (B), known compounds that generate an acid upon irradiation with actinic rays or radiation can be appropriately selected and used singly or as a mixture thereof. For example, the known compounds disclosed in paragraphs [0125] to [0319] of the specification of US2016/0070167A1, paragraphs [0086] to [0094] of the specification of US2015/0004544A1, and paragraphs [0323] to [0402] of the specification of US2016/0237190A1 can be suitably used as the photoacid generator (B).

As the photoacid generator (B), for example, a compound represented by General Formula (ZI), General Formula (ZII), or General Formula (ZIII) is preferable.

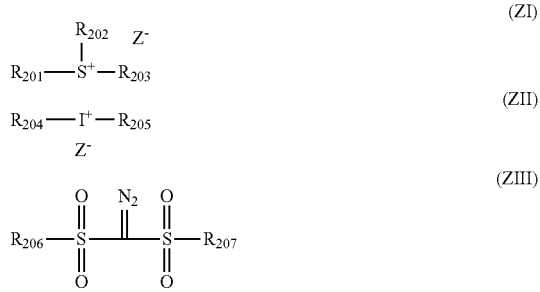

In General Formula (ZI), $R_{201}$, $R_{202}$, and $R_{203}$ each independently represent an organic group.

The organic group as each of $R_{201}$, $R_{202}$, and $R_{203}$ generally has 1 to 30 carbon atoms, and preferably has 1 to 20 carbon atoms.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group), and —$CH_2$—$CH_2$—O—$CH_2$—$CH_2$—.

$Z^-$ represents an anion.

Suitable aspects of the cation in General Formula (ZI) include the corresponding groups in a compound (ZI-1), a compound (ZI-2), a compound (ZI-3), and a compound (ZI-4) which will be described later.

Furthermore, the photoacid generator (B) may be a compound having a plurality of structures represented by General Formula (ZI). For example, the photoacid generator (B) may be a compound having a structure in which at least one of $R_{201}$, . . . , or $R_{203}$ of the compound represented by General Formula (ZI) and at least one of $R_{201}$, . . . , or $R_{203}$ of another compound represented by General Formula (ZI) are bonded via a single bond or a linking group.

First, the compound (ZI-1) will be described.

The compound (ZI-1) is an arylsulfonium compound in which at least one of $R_{201}$, . . . , or $R_{203}$ in General Formula (ZI) is an aryl group, that is, a compound having arylsulfonium as a cation.

In the arylsulfonium compound, any of $R_{201}$ to $R_{203}$ may be an aryl group, or some of $R_{201}$ to $R_{203}$ may be an aryl group, and the rest may be an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

As the aryl group included in the arylsulfonium compound, a phenyl group or a naphthyl group is preferable, and the phenyl group is more preferable. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, the two or more aryl groups may be the same as or different from each other.

The alkyl group or the cycloalkyl group contained in the arylsulfonium compound, as necessary, is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group represented by each of $R_{201}$ to $R_{203}$ may each independently have an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group as a substituent.

Next, the compound (ZI-2) will be described.

The compound (ZI-2) is a compound in which $R_{201}$ to $R_{203}$ in Formula (ZI) each independently represent an organic group having no aromatic ring. Here, examples of the aromatic ring also include an aromatic ring including a heteroatom.

The organic group having no aromatic ring as each of $R_{201}$ to $R_{203}$ generally has 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

As the alkyl group and the cycloalkyl group of each of $R_{201}$ to $R_{203}$, a linear alkyl group having 1 to 10 carbon atoms or branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group) is preferable.

$R_{201}$ to $R_{203}$ may be further substituted with a halogen atom, an alkoxy group (for example, having 1 to 5 carbon atoms), a hydroxyl group, a cyano group, or a nitro group.

Next, the compound (ZI-3) will be described.

The compound (ZI-3) is a compound represented by General Formula (ZI-3) and having a phenacylsulfonium salt structure.

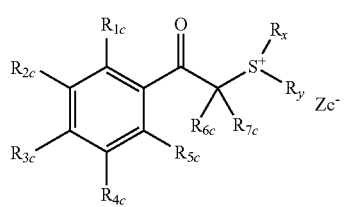

(ZI-3)

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Any two or more of $R_{1c}, \ldots,$ or $R_{5c}$, $R_{5c}$ and $R_{6c}$, $R_{6c}$ and $R_{7c}$, $R_{5c}$ and $R_x$, or $R_x$ and $R_y$ may be bonded to each other to form a ring structure, and the ring structure may each independently include an oxygen atom, a sulfur atom, a ketone group, an ester bond, or an amide bond.

Examples of the ring structure include an aromatic or non-aromatic hydrocarbon ring, an aromatic or non-aromatic heterocycle, and a polycyclic fused ring in which two or more of these rings are combined. Examples of the ring structure include a 3- to 10-membered ring, preferably a 4- to 8-membered ring, and more preferably a 5- or 6-membered ring.

Examples of the group formed by the bonding of any two or more of $R_{1c}, \ldots,$ or $R_{5c}$, $R_{6c}$ and $R_{7c}$, and $R_x$ and $R_y$ include a butylene group and a pentylene group.

As the group formed by the bonding of $R_{5c}$ and $R_{6c}$, and $R_{5c}$ and $R_x$, a single bond or an alkylene group is preferable. Examples of the alkylene group include a methylene group and an ethylene group.

$Zc^-$ represents an anion.

Next, the compound (ZI-4) will be described.

The compound (ZI-4) is represented by General Formula (ZI-4).

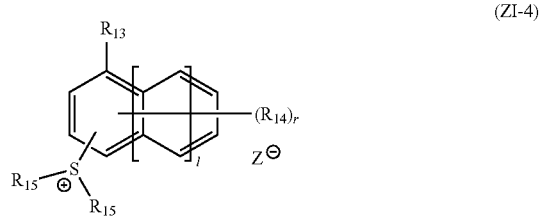

(ZI-4)

In General Formula (ZI-4), l represents an integer of 0 to 2.

r represents an integer of 0 to 8.

$R_{13}$ represents a group having a hydrogen atom, a fluorine atom, a hydroxyl group, an alkyl group, a cycloalkyl group, an alkoxy group, an alkoxycarbonyl group, or a cycloalkyl group. These groups may have a substituent.

$R_{14}$ represents a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent. In a case where $R_{14}$'s are present in a plural number, they each independently represent the group such as a hydroxyl group.

$R_{15}$'s each independently represent an alkyl group, a cycloalkyl group, or a naphthyl group. These groups may have a substituent. Two of $R_{15}$'s may be bonded to each other to form a ring. In a case where two of $R_{15}$'s are bonded to each other to form a ring, the ring skeleton may include a heteroatom such as an oxygen atom and a nitrogen atom. In one aspect, it is preferable that two of $R_{15}$'s are alkylene groups and are bonded to each other to form a ring structure.

$Z^-$ represents an anion.

In General Formula (ZI-4), the alkyl groups represented by $R_{13}$, $R_{14}$, and $R_{15}$ are linear or branched. The alkyl group preferably has 1 to 10 carbon atoms. As the alkyl group, a methyl group, an ethyl group, an n-butyl group, or a t-butyl group is preferable.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

The aryl group represented by each of $R_{204}$ to $R_{207}$ is preferably a phenyl group or a naphthyl group, and more preferably the phenyl group. The aryl group represented by each of $R_{204}$ to $R_{207}$ may be an aryl group having a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

As the alkyl group and the cycloalkyl group represented by each of $R_{204}$ to $R_{207}$, a linear alkyl group having 1 to 10 carbon atoms and branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group) is preferable.

The aryl group, the alkyl group, and the cycloalkyl group represented by each of $R_{204}$ to $R_{207}$ may each independently have a substituent. Examples of the substituent which may be contained in the aryl group, the alkyl group, and the cycloalkyl group represented by each of $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion.

As $Z^-$ in General Formula (ZI), $Z^-$ in General Formula (ZII), $Zc^-$ in General Formula (ZI-3), and $Z^-$ in General Formula (ZI-4), an anion represented by General Formula (3) is preferable.

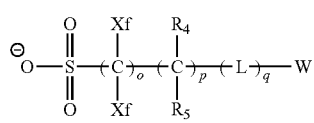

(3)

In General Formula (3), o represents an integer of 1 to 3. p represents an integer of 0 to 10. q represents an integer of 0 to 10.

Xf represents a fluorine atom or an alkyl group substituted with at least one fluorine atom. The alkyl group preferably has 1 to 10 carbon atoms, and more preferably has 1 to 4 carbon atoms. In addition, a perfluoroalkyl group is preferable as the alkyl group substituted with at least one fluorine atom.

Xf is preferably a fluorine atom or a perfluoroalkyl group having 1 to 4 carbon atoms, and more preferably a fluorine atom or $CF_3$. In particular, it is more preferable that both Xf's are fluorine atoms.

$R_4$ and $R_5$ each independently represent a hydrogen atom, a fluorine atom, an alkyl group, or an alkyl group substituted with at least one fluorine atom. In a case where $R_4$'s and $R_5$'s are present in a plural number, $R_4$'s and $R_5$'s may each be the same as or different from each other.

The alkyl group represented by each of $R_4$ and $R_5$ may have a substituent, and preferably has 1 to 4 carbon atoms. $R_4$ and $R_5$ are each preferably a hydrogen atom.

Specific examples and suitable aspects of the alkyl group substituted with at least one fluorine atom are the same as the specific examples and the suitable aspects, respectively, of Xf in General Formula (3).

L represents a divalent linking group. In a case where L's are present in a plural number, they may be the same as or different from each other.

Examples of the divalent linking group include —COO— (—C(=O)—O—), —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 15 carbon atoms), an alkenylene group (preferably having 2 to 6 carbon atoms), and a divalent linking group formed by combination of a plurality of these groups. Among these, —COO—, —OCO—, —CONH—, —NHCO—, —CO—, —O—, —SO$_2$—, —COO-alkylene group-, —OCO-alkylene group-, —CONH-alkylene group-, or —NHCO-alkylene group- is preferable, and —COO—, —OCO—, —CONH—, —SO$_2$—, —COO-alkylene group -, or —OCO-alkylene group- is more preferable.

W represents an organic group including a cyclic structure. Among these, W is preferably a cyclic organic group.

Examples of the cyclic organic group include an alicyclic group, an aryl group, and a heterocyclic group.

The alicyclic group may be monocyclic or polycyclic. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable.

The aryl group may be monocyclic or polycyclic. Examples of the aryl group include a phenyl group, a naphthyl group, a phenanthryl group, and an anthryl group.

The heterocyclic group may be monocycic or polycyclic. The polycyclic compound can further suppress acid diffusion. Further, the heterocyclic group may have aromaticity or may not have aromaticity. Examples of the heterocycle having aromaticity include a furan ring, a thiophene ring, a benzofuran ring, a benzothiophene ring, a dibenzofuran ring, a dibenzothiophene ring, and a pyridine ring. Examples of the heterocycle not having aromaticity include a tetrahydropyran ring, a lactone ring, a sultone ring, and a decahydroisoquinoline ring. Examples of the lactone ring and the sultone ring include the lactone structure and the sultone structure exemplified in the aforementioned resin. As the heterocycle in the heterocyclic group, the furan ring, the thiophene ring, the pyridine ring, or the decahydroisoquinoline ring is particularly preferable.

The cyclic organic group may have a substituent. Examples of the substituent include an alkyl group (which may be either linear or branched, preferably having 1 to 12 carbon atoms), a cycloalkyl group (which may be any of a monocycle, a polycycle, and a spirocycle, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamide group, and a sulfonic ester group. Incidentally, the carbon constituting the cyclic organic group (carbon contributing to ring formation) may be carbonyl carbon.

As the anion represented by General Formula (3), $SO_3^-$—$CF_2$—$CH_2$—OCO-(L)q'—W, $SO_3^-$—$CF_2$—CHF—$CH_2$—OCO-(L)q'—W, $SO_3^-$—$CF_2$—COO-(L)q'—W, $SO_3^-$—$CF_2$—$CF_2$—$CH_2$—$CH_2$-(L)q-W, or $SO_3^-$—$CF_2$—CH(CF$_3$)—OCO-(L)q'—W is preferable. Here, L, q, and W are each the same as in General Formula (3). q' represents an integer of 0 to 10.

In one aspect, as $Z^-$ in General Formula (ZI), $Z^-$ in General Formula (ZI), $Zc^-$ in General Formula (ZI-3), and $Z^-$ in General Formula (ZI-4), an anion represented by General Formula (4) is also preferable.

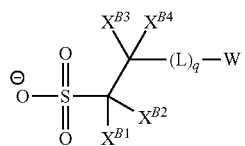

(4)

In General Formula (4), $X^{B1}$ and $X^{B2}$ each independently represent a hydrogen atom or a monovalent organic group having no fluorine atom. $X^{B1}$ and $X^{B2}$ are each preferably the hydrogen atom.

$X^{B3}$ and $X^{B4}$ each independently represent a hydrogen atom or a monovalent organic group. It is preferable that at least one of $X^{B3}$ or $X^{B4}$ is a fluorine atom or a monovalent organic group having a fluorine atom, and it is more preferable that both $X^{B3}$ and $X^{B4}$ are fluorine atoms or monovalent organic groups having a fluorine atom. It is still more preferable that both $X^{B3}$ and $X^{B4}$ are fluorine-substituted alkyl groups.

L, q, and W are the same as in General Formula (3).

As $Z^-$ in General Formula (ZI), $Z^-$ in General Formula (ZII), $Zc^-$ in General Formula (ZI-3), and $Z^-$ in General Formula (ZI-4), an anion represented by General Formula (5) is preferable.

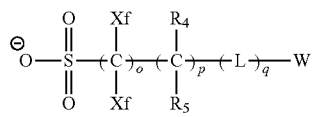

(5)

In General Formula (5), Xa's each independently represent a fluorine atom or an alkyl group substituted with at least one fluorine atom. Xb's each independently represent a hydrogen atom or an organic group having no fluorine atom. The definitions and preferred aspects of o, p, q, $R_4$, $R_5$, L, and W are each the same as those in General Formula (3).

$Z^-$ in General Formula (ZI), $Z^-$ in General Formula (ZII), $Zc^-$ in General Formula (ZI-3), and $Z^-$ in General Formula (ZI-4) may be a benzenesulfonate anion, and are each preferably a benzenesulfonate anion substituted with a branched alkyl group or a cycloalkyl group.

As $Z^-$ in General Formula (ZI), $Z^-$ in General Formula (ZII), $Zc^-$ in General Formula (ZI-3), and $Z^-$ in General Formula (ZI-4), an aromatic sulfonate anion represented by General Formula (SA1) is also preferable.

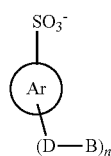

(SA1)

In Formula (SA1),

Ar represents an aryl group, and may further have a substituent other than a sulfonate anion and a -(D-B) group. Examples of the substituent which may be further contained include a fluorine atom and a hydroxyl group.

n represents an integer of 0 or more. n is preferably 1 to 4, more preferably 2 or 3, and still more preferably 3.

D represents a single bond or a divalent linking group. Examples of the divalent linking group include an ether group, a thioether group, a carbonyl group, a sulfoxide group, a sulfone group, a sulfonate group, an ester group, and a group formed by combination of two or more of these.

B represents a hydrocarbon group.

It is preferable that D is a single bond and B is an aliphatic hydrocarbon structure. It is more preferable that B is an isopropyl group or a cyclohexyl group.

Preferred examples of the sulfonium cation in General Formula (ZI) and the iodonium cation in General Formula (ZII) are shown below.

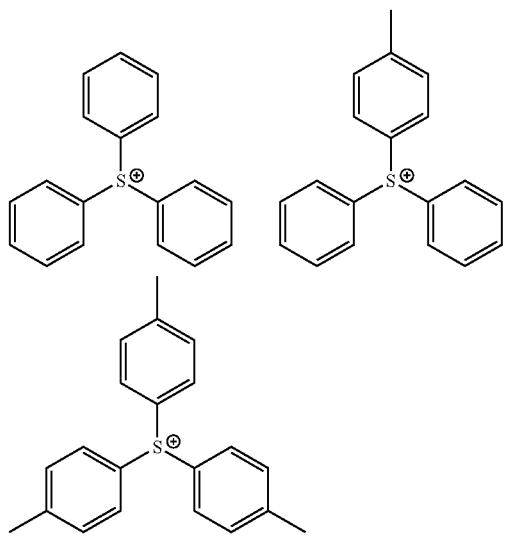

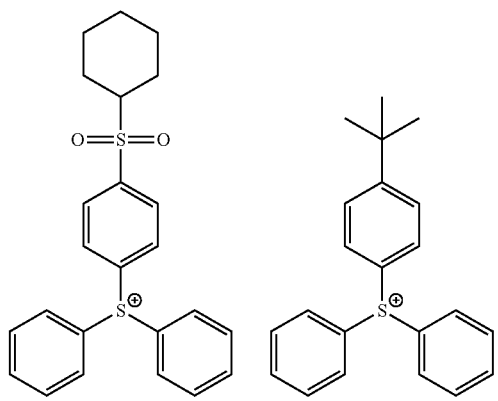

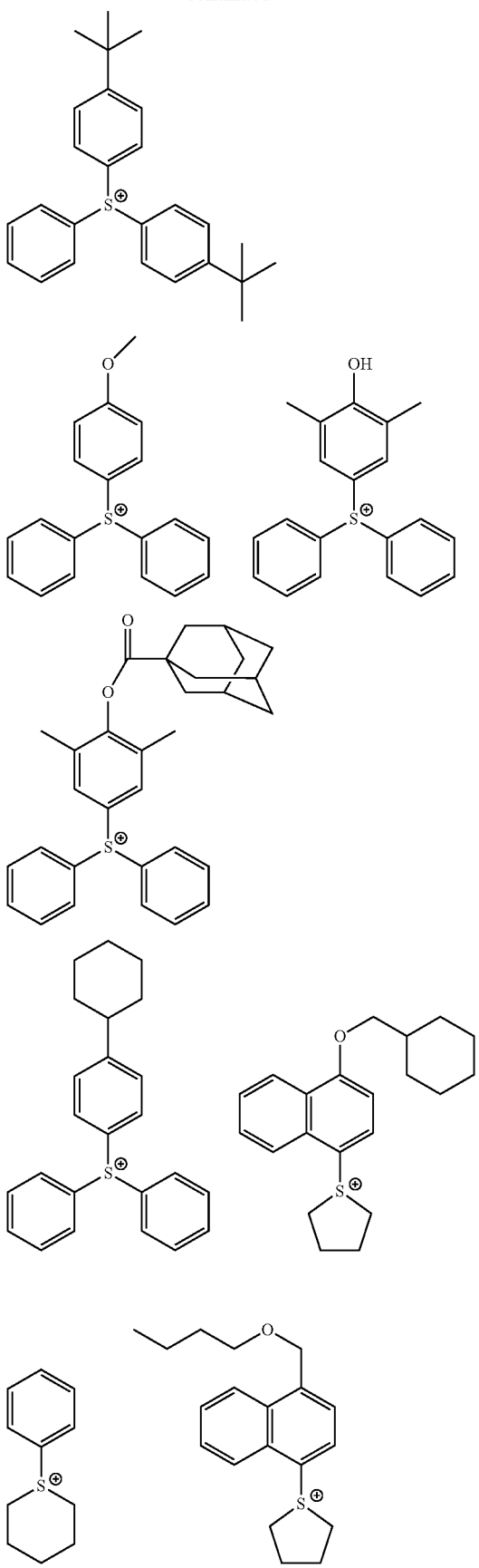
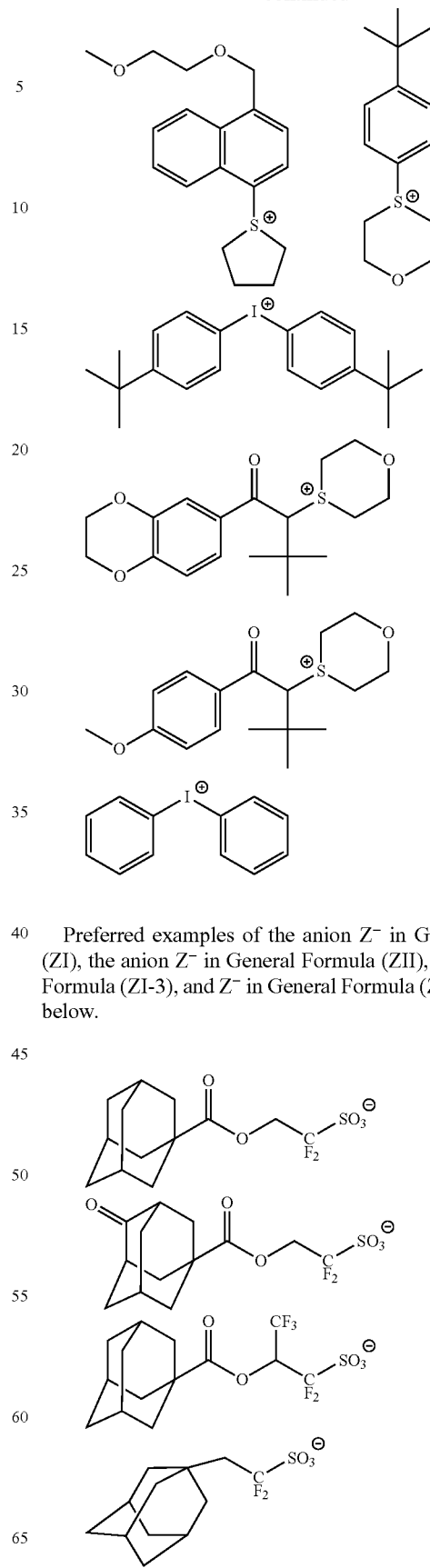
Preferred examples of the anion $Z^-$ in General Formula (ZI), the anion $Z^-$ in General Formula (ZII), $Zc^-$ in General Formula (ZI-3), and $Z^-$ in General Formula (ZI-4) are shown below.

57
-continued
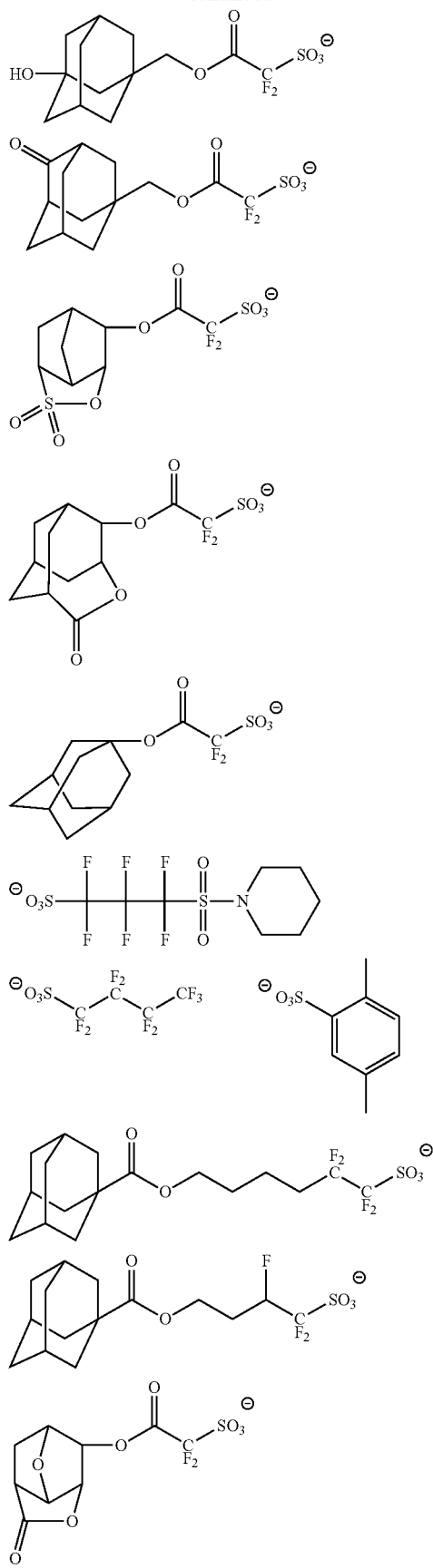
58
-continued
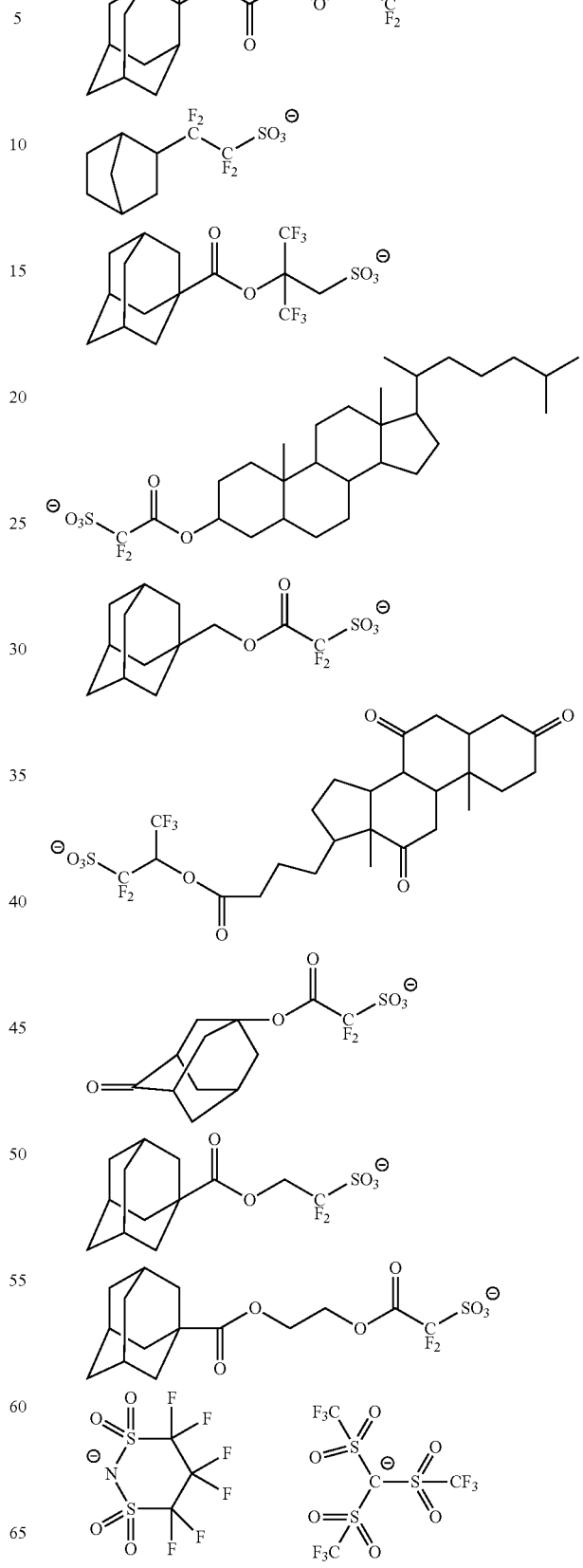

-continued

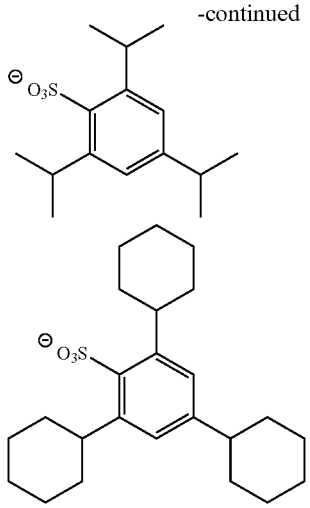

Any combination of the cations and the anions can be used as the photoacid generator (B).

The photoacid generator (B) may be in a form of a low-molecular-weight compound or a form incorporated into apart of a polymer. Further, a combination of the form of a low-molecular-weight compound and the form incorporated into apart of a polymer may also be used.

The photoacid generator (B) is preferably in the form of a low-molecular-weight compound.

In a case where the photoacid generator (B) is in the form of a low-molecular-weight compound, the molecular weight is preferably 3,000 or less, more preferably 2,000 or less, and still more preferably 1,000 or less.

In a case where the photoacid generator (B) is incorporated into a part of a polymer, it may be incorporated into a part of the resin (A) described above or in a resin other than the resin (A).

The photoacid generators (B) may be used singly or in combination of two or more kinds thereof.

A content of the photoacid generator (B) (in a case where the photoacid generators are present in a plurality of kinds, a total content thereof) in the composition is preferably 0.1% to 35.0% by mass, more preferably 0.5% to 25.0% by mass, and still more preferably 3.0% to 20.0% by mass, with respect to a total solid content of the composition.

In a case where the compound represented by General Formula (ZI-3) or (ZI-4) is included as the photoacid generator, a content of the photoacid generator included in the composition (in a case where the photoacid generators are present in a plurality of kinds, a total content thereof) is preferably 5% to 35% by mass, and more preferably 7% to 30% by mass, with respect to the total solid content of the composition.

In addition, the acid dissociation constant pKa of an acid generated by decomposition of the photoacid generator (B) upon irradiation with actinic rays or radiation is preferably smaller than the pKa of an acid generated from a monomer in which a cationic structure moiety in the salt structure in a monomer from which the above-mentioned repeating unit A is derived is substituted with a hydrogen atom.

The acid dissociation constant pKa of an acid generated by decomposition of the photoacid generator (B) upon irradiation with actinic rays or radiation is, for example, −0.01 or less, preferably −1.00 or less, more preferably −1.50 or less, and still more preferably −2.00 or less. A lower limit value of the pKa is not particularly limited, but is, for example, −5.00 or more. The pKa can be measured by the above-mentioned method.

<Acid Diffusion Control Agent (C)>

The composition of the embodiment of the present invention may include an acid diffusion control agent as long as the effect of the present invention is not impaired.

The acid diffusion control agent (D) acts as a quencher that suppresses a reaction of the acid-decomposable resin in the unexposed portion by excessive generated acids by trapping the acids generated from an acid generator and the like upon exposure. As the acid diffusion control agent (C), for example, a basic compound (CA), a basic compound (CB) whose basicity is reduced or lost upon irradiation with actinic ray or radiation, an onium salt (CC) which is a weak acid relative to an acid generator, a low-molecular-weight compound (CD) having a nitrogen atom and a group that leaves by the action of an acid, an onium salt compound (CE) having a nitrogen atom in the cationic moiety, can be used as the acid diffusion control agent. In the composition of the embodiment of the present invention, a known acid diffusion control agent can be appropriately used. For example, the known compounds disclosed in paragraphs [0627] to [0664] of the specification of US2016/0070167A1, paragraphs [0095] to [0187] of the specification of US2015/0004544A1, paragraphs [0403] to [0423] of the specification of US2016/0237190A1, and paragraphs [259] to [0328] of the specification of US2016/0274458A1 can be suitably used as the acid diffusion control agent (C).

As the basic compound (CA), compounds having structures represented by Formulae (A) to (E) are preferable.

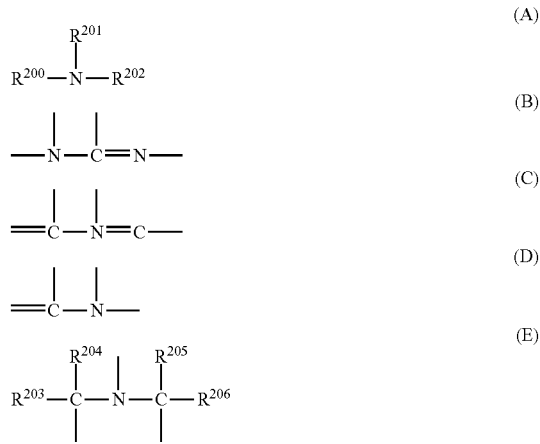

In General Formulae (A) and (E), $R^{200}$, $R^{201}$, and $R^{202}$ may be the same as or different from each other, and each independently represent a hydrogen atom, an alkyl group (preferably having 1 to 20 carbon atoms), a cycloalkyl group (preferably having 3 to 20 carbon atoms), or an aryl group (having 6 to 20 carbon atoms). $R^{201}$ and $R^{202}$ may be bonded to each other to form a ring.

$R^{203}$, $R^{204}$, $R^{205}$, and $R^{206}$ may be the same as or different from each other and each independently represent an alkyl group having 1 to 20 carbon atoms.

The alkyl group in each of General Formulae (A) and (E) may have a substituent or may be unsubstituted.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

The alkyl groups in each of General Formulae (A) and (E) are more preferably unsubstituted.

As the basic compound (CA), guanidine, aminopyrrolidine, pyrazole, pyrazoline, piperazine, aminomorpholine, aminoalkylmorpholine, piperidine, or the like is preferable; and a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond, or the like is more preferable.

The basic compound (CB) whose basicity is reduced or lost upon irradiation with actinic rays or radiation (hereinafter also referred to as a "compound (CB)") is a compound which has a proton-accepting functional group, and decomposes under irradiation with actinic rays or radiation to exhibit deterioration in proton-accepting properties, no proton-accepting properties, or a change from the proton-accepting properties to acidic properties.

The proton-accepting functional group refers to a functional group having a group or an electron which is capable of electrostatically interacting with a proton, and for example, means a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following formula.

 Unshared electron pair

Preferred examples of the partial structure of the proton-accepting functional group include a crown ether structure, an azacrown ether structure, primary to tertiary amine structures, a pyridine structure, an imidazole structure, and a pyrazine structure.

The compound (CB) decomposes upon irradiation with actinic rays or radiation to generate a compound exhibiting deterioration in proton-accepting properties, no proton-accepting properties, or a change from the proton-accepting properties to acidic properties. Here, exhibiting deterioration in proton-accepting properties, no proton-accepting properties, or a change from the proton-accepting properties to acidic properties means a change of proton-accepting properties due to the proton being added to the proton-accepting functional group, and specifically a decrease in the equilibrium constant at chemical equilibrium in a case where a proton adduct is generated from the compound (CB) having the proton-accepting functional group and the proton.

The proton-accepting properties can be confirmed by performing pH measurement.

The acid dissociation constant pKa of the compound generated by decomposition of the compound (CB) upon irradiation with actinic rays or radiation preferably satisfies pKa<−1, more preferably satisfies −13<pKa<−1, and still more preferably satisfies 13<pKa<−3.

Furthermore, the acid dissociation constant pKa can be determined by the above-mentioned method.

In the composition of the embodiment of the present invention, the onium salt (CC) which is a weak acid relative to an acid generator can be used as the acid diffusion control agent.

In a case where the acid generator and the onium salt that generates an acid which is a weak acid relative to an acid generated from the acid generator are mixed and used, an acid generated from the acid generator upon irradiation with actinic rays or radiation produces an onium salt having a strong acid anion by discharging the weak acid through salt exchange in a case where the acid collides with an onium salt having an unreacted weak acid anion. In this process, the strong acid is exchanged with a weak acid having a lower catalytic ability, and thus, the acid is apparently deactivated and the acid diffusion can be controlled.

As the onium salt which is a weak acid relative to the acid generator, compounds represented by General Formulae (d1-1) to (d1-3) are preferable.

(d1-1)

(d1-2)

(d1-3)

In the formula, $R^{51}$ is a hydrocarbon group which may have a substituent, $Z^{2c}$ is a hydrocarbon group having 1 to 30 carbon atoms, which may have a substituent (provided that carbon adjacent to S is not substituted with a fluorine atom), $R^{52}$ is an organic group, $Y^3$ is a linear, branched or cyclic alkylene group or an arylene group, Rf is a hydrocarbon group including a fluorine atom, and $M^+$'s are each independently an ammonium cation, a sulfonium cation, or an iodonium cation.

Preferred examples of the sulfonium cation or iodonium cation represented by $M^+$ include the sulfonium cation exemplified for General Formula (ZI) and the iodonium cation exemplified for General Formula (ZII).

The onium salt (CC) which is a weak acid relative to an acid generator may be a compound having a cationic moiety and an anionic moiety in the same molecule, in which the cationic moiety and the anionic moiety are linked by a covalent bond (hereinafter also referred to as a "compound (CCA)").

The compound (CCA) is preferably a compound represented by any of General Formulae (C-1) to (C-3).

(C-1)

(C-2)

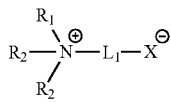

(C-3)

In General Formulae (C-1) to (C-3), $R_1$, $R_2$, and $R_3$ each independently represent a substituent having 1 or more carbon atoms.

$L_1$ represents a divalent linking group that links a cationic moiety with an anionic moiety, or a single bond.

—$X^-$ represents an anionic moiety selected from —COO$^-$, —SO$_3^-$, —SO$_2^-$, and —N$^-$—R$_4$. $R_4$ represents a monovalent substituent having a carbonyl group: —C(=O)—, a sulfonyl group: —S(=O)$_2$—, or a sulfinyl group: —S(=O)— at a site for linking to an adjacent N atom.

$R_1$, $R_2$, $R_3$, $R_4$, and $L_1$ may be bonded to each other to form a ring structure. Further, in General Formula (C-3), two of $R_1$ to $R_3$ together represent one divalent substituent, and may be bonded to an N atom by a double bond.

Examples of the substituent having 1 or more carbon atoms in each of $R_1$ to $R_3$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group. Among those, the alkyl group, a cycloalkyl group, or the aryl group is preferable.

Examples of $L_1$ as a divalent linking group include a linear or branched alkylene group, a cycloalkylene group, an arylene group, a carbonyl group, an ether bond, an ester bond, an amide bond, an urethane bond, an urea bond, and a group formed by a combination of two or more of these groups. $L_1$ is preferably the alkylene group, the arylene group, the ether bond, the ester bond, and the group formed by a combination of two or more of these groups.

The low-molecular-weight compound (CD) having a nitrogen atom and having a group that leaves by the action of an acid (hereinafter also referred to as a "compound (CD)") is preferably an amine derivative having a group that leaves by the action of an acid on the nitrogen atom.

As the group that leaves by the action of an acid, an acetal group, a carbonate group, a carbamate group, a tertiary ester group, a tertiary hydroxyl group, or a hemiaminal ether group is preferable, and the carbamate group or the hemiaminal ether group is more preferable.

The molecular weight of the compound (CD) is preferably 100 to 1,000, more preferably 100 to 700, and still more preferably 100 to 500.

The compound (CD) may have a carbamate group having a protective group on the nitrogen atom. The protective group constituting the carbamate group is represented by General Formula (d-1).

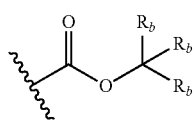

(d-1)

In General Formula (d-1), $R_b$'s each independently represent a hydrogen atom, an alkyl group (preferably having 1 to 10 carbon atoms), a cycloalkyl group (preferably having 3 to 30 carbon atoms), an aryl group (preferably having 3 to 30 carbon atoms), an aralkyl group (preferably having 1 to 10 carbon atoms), or an alkoxyalkyl group (preferably having 1 to 10 carbon atoms). Rb's may be linked to each other to form a ring.

The alkyl group, the cycloalkyl group, the aryl group, or the aralkyl group represented by Rb may be substituted with a functional group such as a hydroxyl group, a cyano group, an amino group, a pyrrolidino group, a piperidino group, a morpholino group, and an oxo group, an alkoxy group, or a halogen atom. The same applies to the alkoxyalkyl group represented by Rb.

As $R_b$, a linear or branched alkyl group, a cycloalkyl group, or an aryl group is preferable, and the linear or branched alkyl group, or the cycloalkyl group is more preferable.

Examples of the ring formed by the mutual linking of two of Rb's include an alicyic hydrocarbon group, an aromatic hydrocarbon group, a heterocyclic hydrocarbon group, and derivatives thereof.

Examples of the specific structure of the group represented by General Formula (d-1) include, but are not limited to, the structures disclosed in paragraph [0466] of the specification of US2012/0135348A1.

The compound (CD) preferably has a structure represented by General Formula (6).

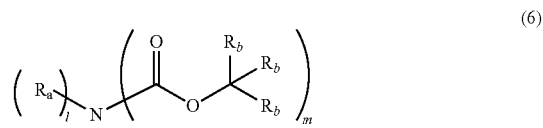

(6)

In General Formula (6), l represents an integer of 0 to 2, m represents an integer of 1 to 3, and these satisfy 1+m=3.

$R_a$ represents a hydrogen atom, an alkyl group, a cycloalkyl group, an aryl group, or an aralkyl group. In a case where l is 2, two of Ra's may be the same as or different from each other, and the two of Ra's may be linked to each other to form a heterocycle with the nitrogen atom in the formula. This heterocycle may include a heteroatom other than the nitrogen atom in the formula.

$R_b$ has the same meaning as Rb in General Formula (d-1), and preferred examples are also the same.

In General Formula (6), the alkyl group, the cycloalkyl group, the aryl group, and the aralkyl group as Ra may be each independently substituted with the same groups as the group mentioned above as a group which may be substituted in the alkyl group, the cycloalkyl group, the aryl group, and the aralkyl group as Rb.

Specific examples of the alkyl group, the cycloalkyl group, the aryl group, and the aralkyl group (such the alkyl group, the cycloalkyl group, the aryl group, and the aralkyl group may be substituted with the groups as described above) of $R_a$ include the same groups as the specific examples as described above with respect to $R_b$.

Specific examples of the particularly preferred compound (CD) in the present invention include, but are not limited to, the compounds disclosed in paragraph [0475] of the specification of US2012/0135348A1.

The onium salt compound (CE) having a nitrogen atom in the cationic moiety (hereinafter also referred to as a "compound (CE)") is preferably a compound having a basic moiety including a nitrogen atom in the cationic moiety. The basic moiety is preferably an amino group, and more preferably an aliphatic amino group. All of the atoms adjacent to the nitrogen atom in the basic moiety are still more preferably hydrogen atoms or carbon atoms. In addition, from the viewpoint of improving basicity, it is preferable that an electron-withdrawing functional group (such as a carbonyl group, a sulfonyl group, a cyano group, and a halogen atom) is not directly linked to the nitrogen atom.

Specific preferred examples of the compound (CE) include, but are not limited to, the compounds disclosed in paragraph [0203] of the specification of US2015/0309408A1.

Preferred examples of the acid diffusion control agent (C) are shown below.

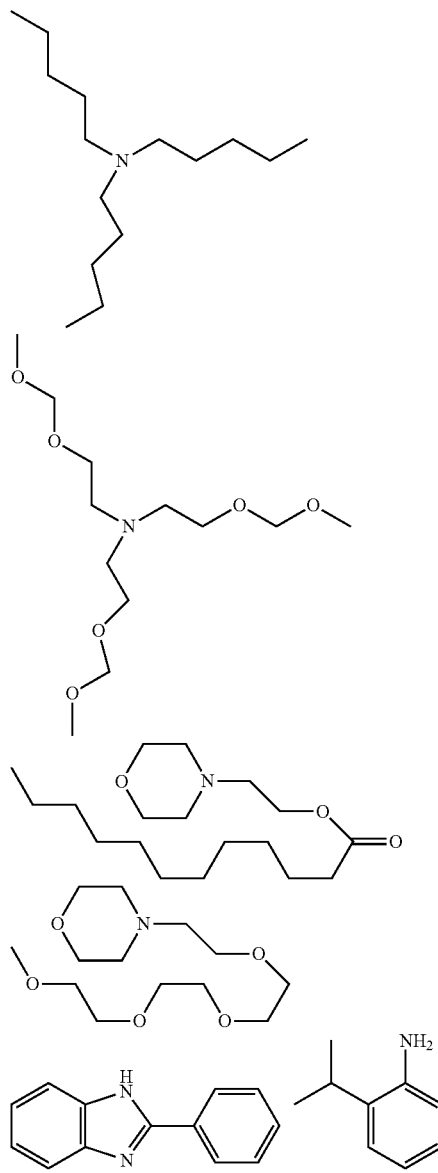

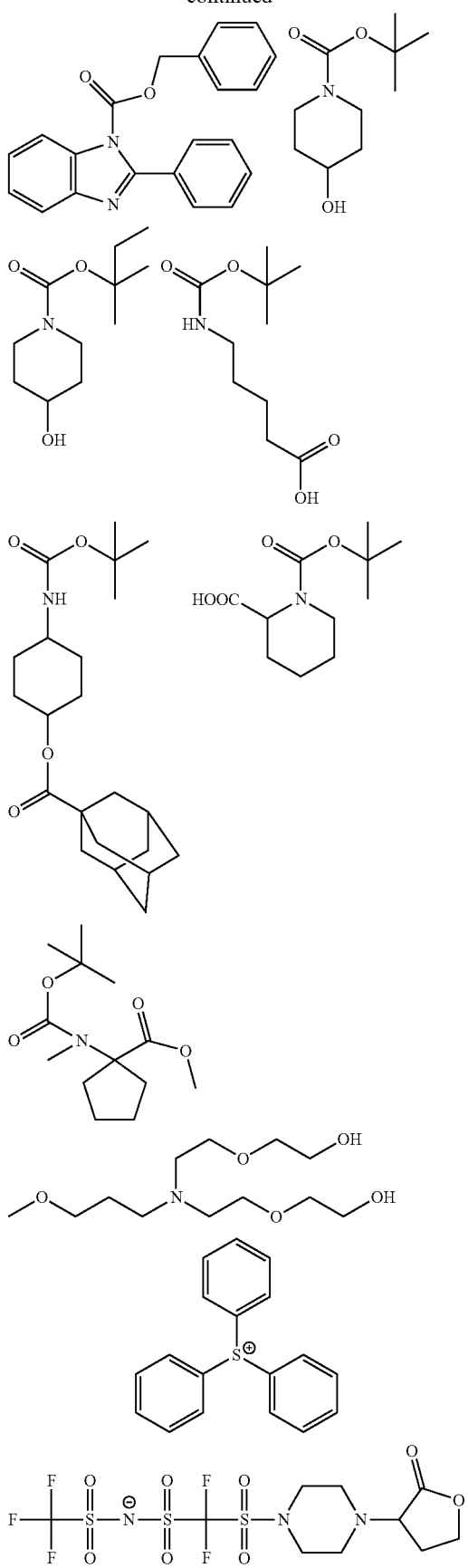

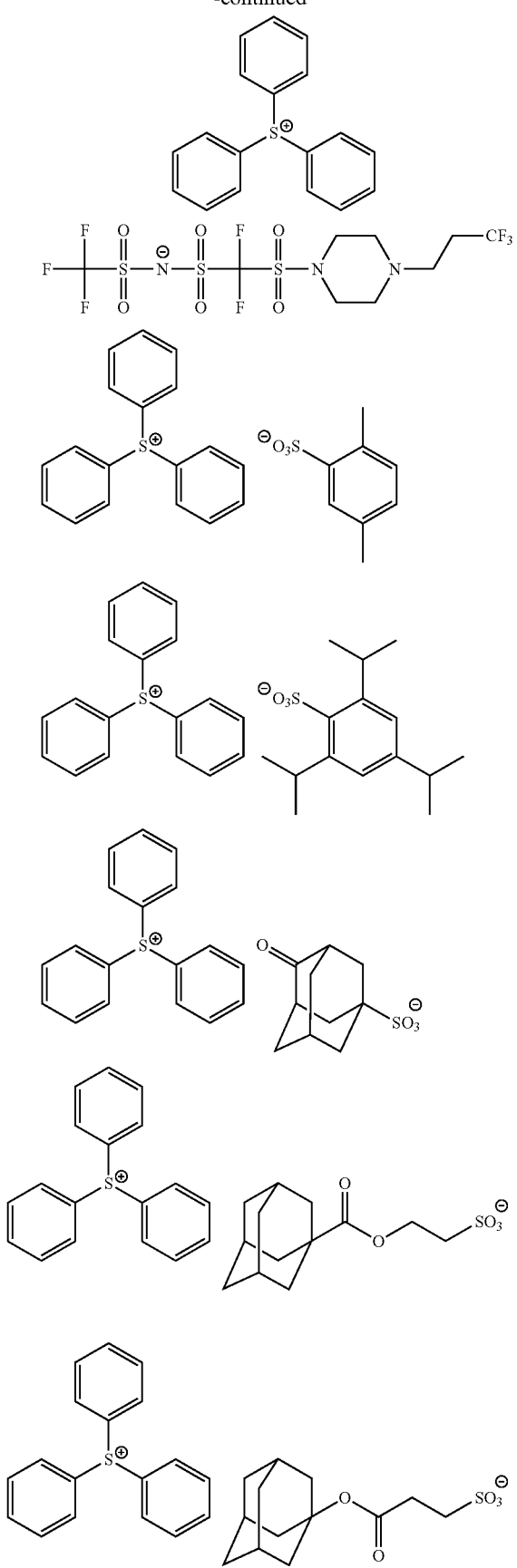
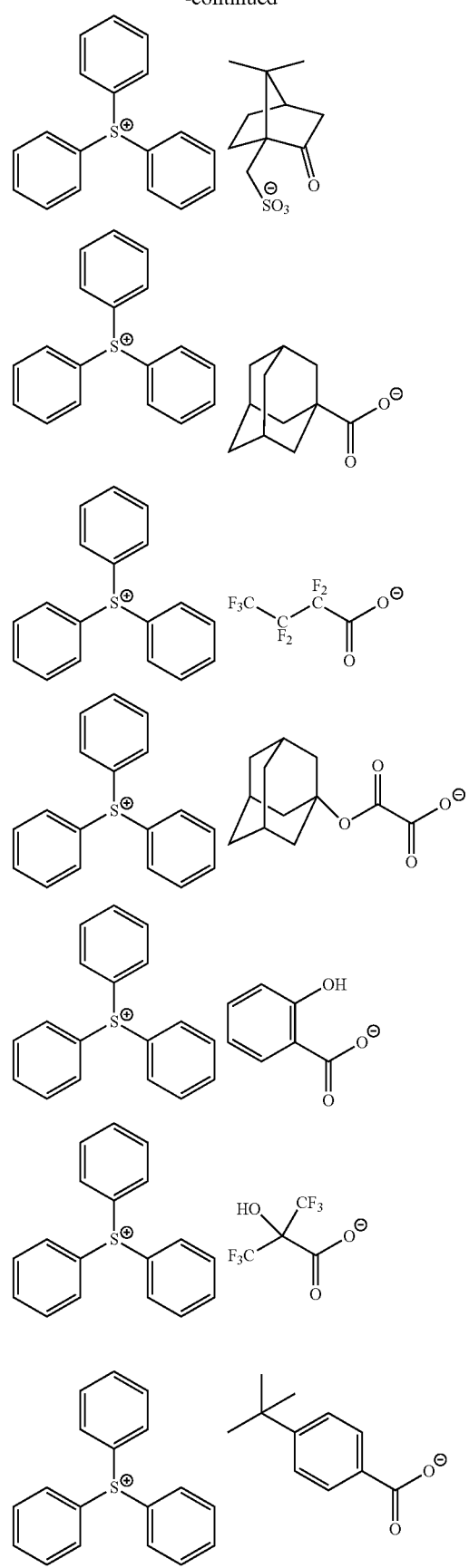

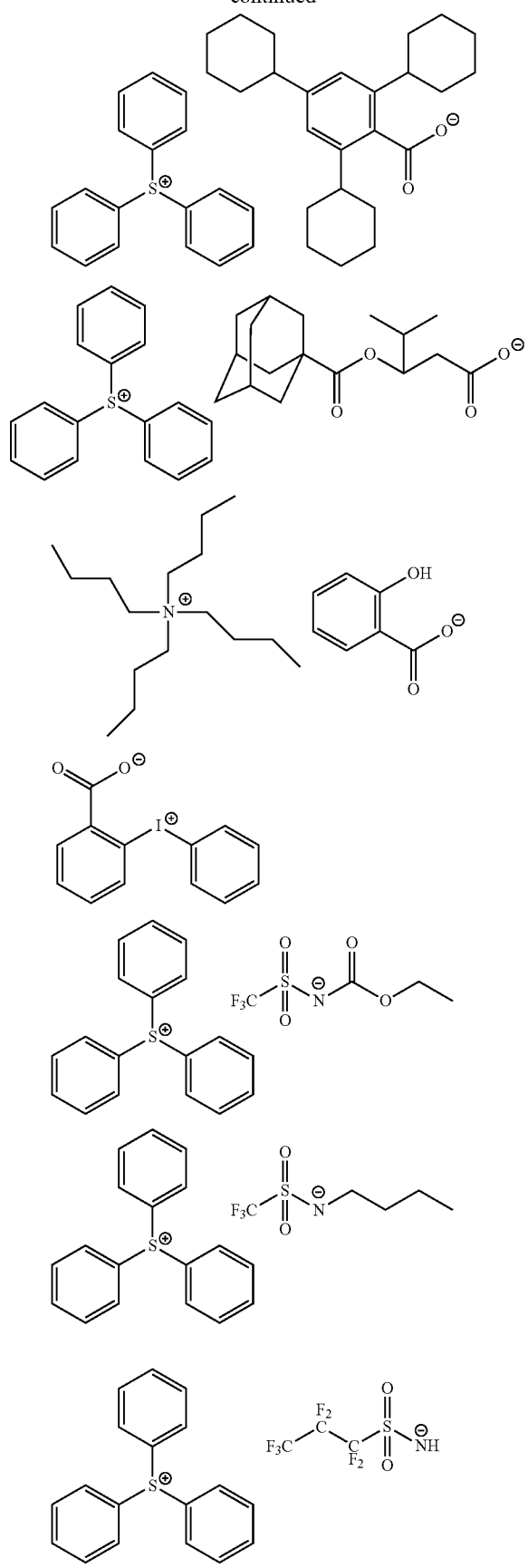

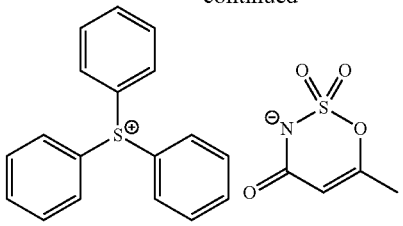

In the composition of the embodiments of the present invention, the acid diffusion control agents (C) may be used singly or in combination of two or more kinds thereof.

In a case where the composition includes the acid diffusion control agent (C), a content of the acid diffusion control agent (C) (in a case where the acid diffusion control agents (C) are present in a plural number, a total content thereof) is preferably 0.1% to 10.0% by mass, and more preferably 0.1% to 5.0% by mass, with respect to the total solid content of the composition.

<Hydrophobic Resin (D)>

The composition of the embodiment of the present invention may include a hydrophobic resin (D). Further, the hydrophobic resin (D) is preferably a resin different from the resin (AX1) and the resin (AX2).

By incorporation of the hydrophobic resin (D) into the composition of the embodiment of the present invention, the static/dynamic contact angle on the surface of the actinic ray-sensitive or radiation-sensitive film can be controlled. Thus, it is possible to improve development characteristics, suppress generation of out gas, improve immersion liquid tracking properties upon liquid immersion exposure, and reduce liquid immersion defects, for example.

Although the hydrophobic resin (D) is preferably designed to be unevenly localized on the surface of the resist film, it does not necessarily need to have a hydrophilic group in its molecule as different from the surfactant, and does not need to contribute to homogeneous mixing of polar/nonpolar materials.

The hydrophobic resin (D) is preferably a resin having at least one selected from the group consisting of a "fluorine atom", a "silicon atom", or a "$CH_3$ partial structure which is contained in a side chain portion of a resin" from the viewpoint of uneven distribution on the film surface layer.

In a case where the hydrophobic resin (D) includes a fluorine atom and/or a silicon atom, the fluorine atom and/or the silicon atom in the hydrophobic resin (D) may be included in the main chain or a side chain of the resin.

In a case where the hydrophobic resin (D) includes a fluorine atom, it is preferably a resin which has an alkyl group having a fluorine atom, a cycloalkyl group having a fluorine atom, or an aryl group having a fluorine atom, as a partial structure having a fluorine atom.

The hydrophobic resin (D) preferably has at least one group selected from the group of the following (x) to (z).

(x) an acid group, (y) a group whose solubility in an alkali developer increases through decomposition by the action of an alkali developer (hereinafter also referred to as a polarity converting group), and (z) a group that decomposes by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonylxalkylcarbonyl)methylene group, an (alkylsulfonylxalkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group.

As the acid group, the fluorinated alcohol group (preferably hexafluoroisopropanol), the sulfonimido group, or the bis(alkylcarbonyl)methylene group is preferable.

Examples of the group (y) whose solubility in an alkali developer increases through decomposition by the action of the alkali developer include a lactone group, a carboxylic ester group (—COO—), an acid anhydride group (—C(O)OC(O)—), an acid imido group (—NHCONH—), a carboxylic thioester group (—COS—), a carbonic ester group (—OC(O)O—), a sulfuric ester group (—OSO$_2$O—), and a sulfonic ester group (—SO$_2$O—), and the lactone group or the carboxylic ester group (—COO—) is preferable.

The repeating unit including such the group is, for example, a repeating unit in which the group is directly bonded to the main chain of a resin, and examples thereof include a repeating unit with an acrylic ester or a methacrylic ester. In this repeating unit, such the group may be bonded to the main chain of the resin via a linking group. Alternatively, this repeating unit may also be incorporated into a terminal of the resin by using a polymerization initiator or a chain transfer agent having such the group during polymerization.

Examples of the repeating unit having a lactone group include those similar to the repeating unit having a lactone structure described above in the section of resin (AX1).

A content of the repeating unit having a group (y) whose solubility in the alkaline developer increases through decomposition by the action of the alkaline developer is preferably 1% to 100% by mole, more preferably 3% to 98% by mole, and still more preferably 5% to 95% by mole, with respect to all the repeating units in the hydrophobic resin (D).

Examples of the repeating unit having a group (z) that decomposes by the action of an acid in the hydrophobic resin (D) include the same ones as those of the repeating unit having an acid-decomposable group described for the resin (AX1). The repeating unit having a group (z) that decomposes by the action of an acid may have at least any one of a fluorine atom or a silicon atom. A content of the repeating unit having a group (z) that decomposes by the action of an acid is preferably 1% to 80% by mole, more preferably 10% to 80% by mole, and 20% to 60% by mole, with respect to all the repeating units in the hydrophobic resin (D).

The hydrophobic resin (D) may further have a repeating unit different from the above-mentioned repeating units.

The repeating unit having a fluorine atom is preferably 10 to 100% by mole, and more preferably 30 to 100% by mole with respect to all the repeating units in the hydrophobic resin (D). Further, the repeating unit having a silicon atom is preferably 10 to 100% by mole, more preferably 20 to 100% by mole with respect to all the repeating units in the hydrophobic resin (D).

On the other hand, in particular, in a case where the hydrophobic resin (D) includes a CH$_3$ partial structure in a side chain portion, a form in which the hydrophobic resin (D) does not substantially include a fluorine atom and a silicon atom is also preferable. Further, it is preferable that the hydrophobic resin (D) is constituted with substantially only a repeating unit constituted with only an atom selected from a carbon atom, an oxygen atom, a hydrogen atom, a nitrogen atom, and a sulfur atom.

The weight-average molecular weight of the hydrophobic resin (D) in terms of standard polystyrene is preferably 1,000 to 100,000, and more preferably 1,000 to 50,000.

A total content of the residual monomers and/or oligomer components included in the hydrophobic resin (D) is preferably 0.01% to 5% by mass, and more preferably 0.01% to 3% by mass. In addition, the dispersity (Mw/Mn) is preferably in the range of 1 to 5, and more preferably in the range of 1 to 3.

As the hydrophobic resin (D), a known resin can be appropriately selected and used singly or in mixture. For example, the known resins disclosed in paragraphs [0451] to [0704] of the specification of US2015/0168830A1 and paragraphs [0340] to [0356] of the specification of US2016/0274458A1 can be suitably used as the hydrophobic resin (D). In addition, the repeating units disclosed in paragraphs [0177] to [0258] of the specification of US2016/0237190A1 are also preferable as the repeating units constituting the hydrophobic resin (D).

Preferred examples of the monomer corresponding to the repeating unit constituting the hydrophobic resin (D) are shown below.

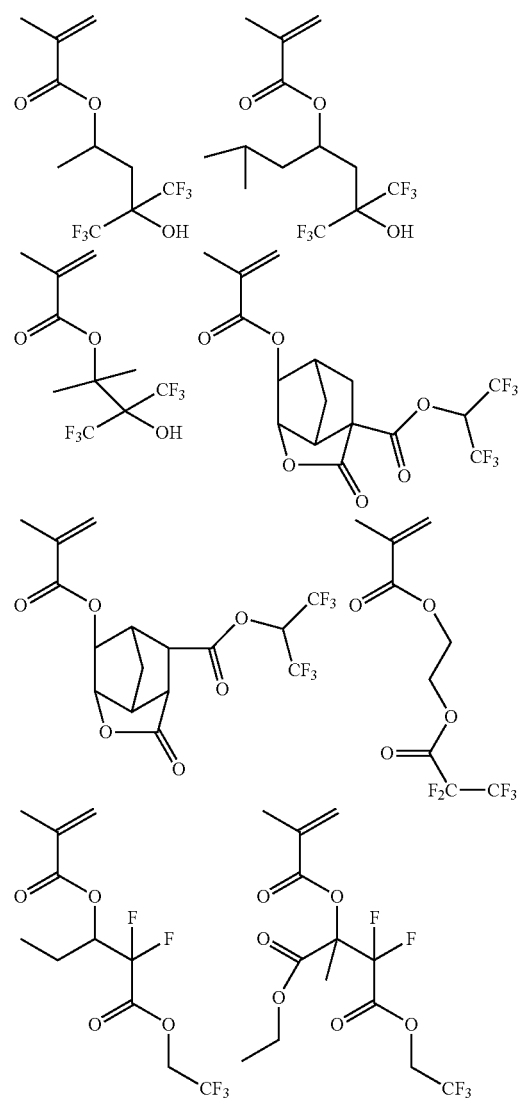

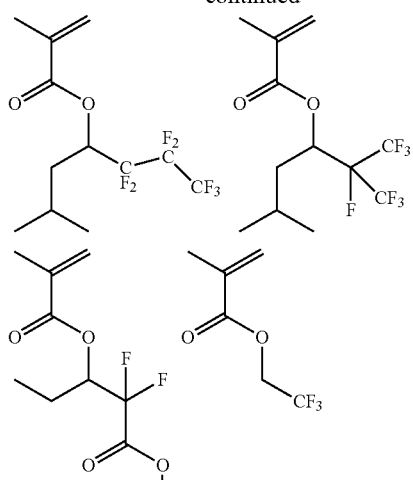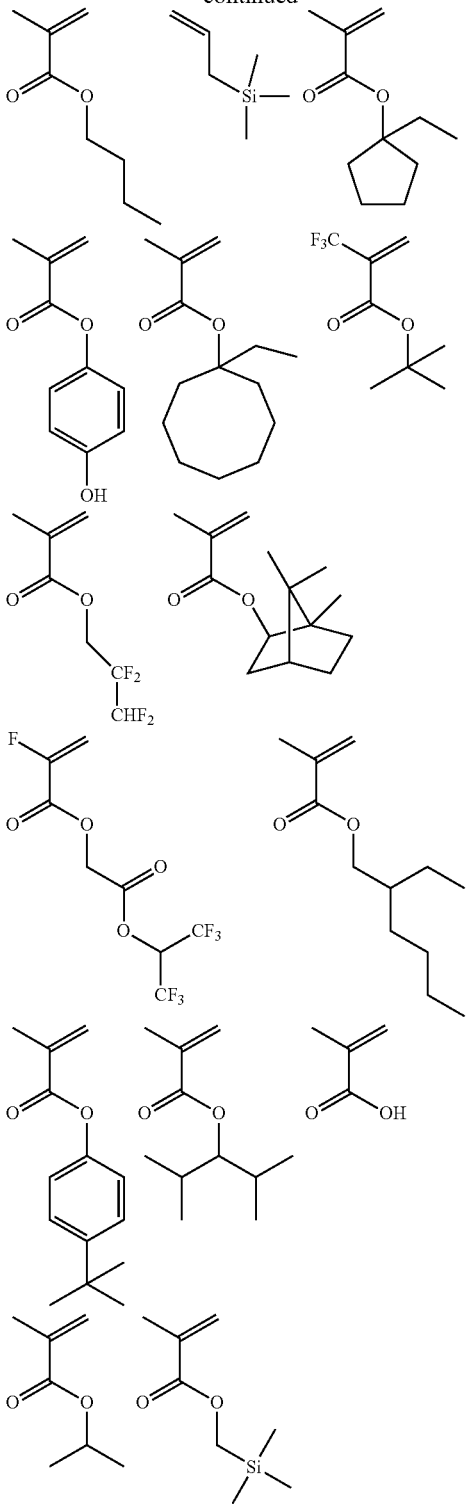
The hydrophobic resin (D) may be used singly or in combination of two or more kinds thereof.
It is preferable to use a mixture of two or more kinds of hydrophobic resins (D) having different levels of surface energy from the viewpoint of satisfying both the immersion liquid tracking properties and the development characteristics upon liquid immersion exposure.

A content of the hydrophobic resin (D) in the composition is preferably 0.01% to 10.0% by mass, and more preferably 0.05% to 8.0% by mass, with respect to the total solid content in the composition.

<Solvent (E)>

The composition of the embodiment of the present invention may include a solvent.

In the composition of the embodiment of the present invention, a known resist solvent can be appropriately used. For example, the known solvents disclosed in paragraphs [0665] to [0670] of the specification of US2016/0070167A1, paragraphs [0210] to [0235] of the specification of US2015/0004544A1, paragraphs [0424] to [0426] of the specification of US2016/0237190A1, and paragraphs [0357] to [0366] of the specification of US2016/0274458A1 can be suitably used.

Examples of the solvent which can be used in preparation of the composition include organic solvents such as alkylene glycol monoalkyl ether carboxylate, alkylene glycol monoalkyl ether, alkyl lactate, alkyl alkoxypropionate, a cyclic lactone (preferably having 4 to 10 carbon atoms), a monoketone compound (preferably having 4 to 10 carbon atoms) which may have a ring, alkylene carbonate, alkyl alkoxyacetate, and alkyl pyruvate.

As the organic solvent, a mixed solvent obtained by mixing a solvent having a hydroxyl group in the structure and a solvent having no hydroxyl group may be used.

As the solvent having a hydroxyl group and the solvent having no hydroxyl group, the above-exemplified compounds can be appropriately selected, but as the solvent having a hydroxyl group, alkylene glycol monoalkyl ether or alkyl lactate is preferable, and propylene glycol monomethyl ether (PGME), propylene glycol monoethyl ether (PGEE), methyl 2-hydroxyisobutyrate, or ethyl lactate is more preferable. Further, as the solvent having no hydroxyl group, alkylene glycol monoalkyl ether acetate, alkylalkoxypropionate, a monoketone compound which may have a ring, a cyclic lactone, alkyl acetate, or the like is preferable, and among these, propylene glycol monomethyl ether acetate (PGMEA), ethyl ethoxypropionate, 2-heptanone, γ-butyrolactone, cyclohexanone, cyclopentanone, or butyl acetate is more preferable, and propylene glycol monomethyl ether acetate, γ-butyrolactone, ethyl ethoxypropionate, cyclohexanone, cyclopentanone, or 2-heptanone are more preferable. As a solvent having no hydroxyl group, propylene carbonate is also preferable.

A mixing ratio (mass ratio) of the solvent having a hydroxyl group to the solvent having no hydroxyl group is 1/99 to 99/1, preferably 10/90 to 90/10, and more preferably 20/80 to 60/40. A mixed solvent including 50% by mass or more of the solvent having no hydroxyl group is preferable from the viewpoint of coating evenness.

The solvent preferably includes propylene glycol monomethyl ether acetate, and may be a single solvent of propylene glycol monomethyl ether acetate or a mixed solvent of two or more kinds including propylene glycol monomethyl ether acetate.

<Crosslinking Agent (F)>

The composition of the embodiment of the present invention may include a compound (hereinafter also referred to as a crosslinking agent (F)) which crosslinks a resin by the action of an acid. As the crosslinking agent (F), a known compound can be appropriately used. For example, the known compounds disclosed in paragraphs [0379] to [0431] of the specification of US2016/0147154A1 and paragraphs [0064] to [0141] of the specification of US2016/0282720A1 can be suitably used as the crosslinking agent (F).

The crosslinking agent (F) is a compound having a crosslinkable group capable of crosslinking a resin, and examples of the crosslinkable group include a hydroxymethyl group, an alkoxymethyl group, an acyloxymethyl group, an alkoxymethyl ether group, an oxirane ring, and an oxetane ring.

The crosslinkable group is preferably a hydroxymethyl group, an alkoxymethyl group, an oxirane ring, or an oxetane ring.

The crosslinking agent (F) is preferably a compound (also including a resin) having two or more crosslinking groups.

The crosslinking agent (F) is more preferably a phenol derivative having a hydroxymethyl group or an alkoxymethyl group, a urea compound (a compound having a urea structure) or a melamine compound (a compound having a melamine structure).

The crosslinking agents may be used singly or in combination of two or more kinds thereof.

A content of the crosslinking agent (F) is preferably 1.0% to 50% by mass, more preferably 3.0% to 40% by mass, and still more preferably 5.0% to 30% by mass, with respect to the total solid content of the resist composition.

<Surfactant (G)>

The composition of the embodiment of the present invention may include a surfactant. In a case where a surfactant is included, a fluorine-based and/or silicon-based surfactant (specifically a fluorine-based surfactant, a silicon-based surfactant, or a surfactant having both a fluorine atom and a silicon atom) is preferable.

By incorporating the surfactant into the composition of the embodiment of the present invention, in a case where an exposure light source of 250 nm or less, in particular, 220 nm or less is used, it is possible to obtain a pattern with good sensitivity and resolution and excellent adhesiveness and less development defects.

Examples of the fluorine-based and/or silicon-based surfactants include the surfactants described in paragraph [0276] of the specification of US2008/0248425A.

In addition, other surfactants than the fluorine-based and/or silicon-based surfactants described in paragraph [0280] of the specification of US2008/0248425A can also be used.

These surfactants may be used singly or in combination of two or more kinds thereof.

In a case where the composition of the embodiment of the present invention includes a surfactant, a content of the surfactant is preferably 0.0001% to 2.0% by mass, and more preferably 0.0005% to 1.0% by mass, with respect to the total solid content of the composition.

On the other hand, in a case where the content of the surfactant is 10 ppm or more with respect to the total solid content of the composition, the uneven distribution of the hydrophobic resin (D) on surface is enhanced. As a result, the surface of the actinic ray-sensitive or radiation-sensitive film can be made more hydrophobic, and the water following property during liquid immersion exposure is improved.

(Other Additives)

The composition of the embodiment of the present invention may include other additives such as an acid proliferation agent, a dye, a plasticizer, a photosensitizer, a light absorber, an alkali-soluble resin, a dissolution inhibitor, and a dissolution accelerator.

<Preparation Method>

The concentration of the solid content in the composition of the embodiment of the present invention is usually preferably 1.0% to 10% by mass, more preferably 2.0% to 5.7% by mass, and still more preferably 2.0% to 5.3% by mass. The concentration of the solid content is a mass percentage of other resist components excluding the solvent with respect to the total mass of the composition.

In addition, the film thickness of an actinic ray-sensitive or radiation-sensitive film formed of the composition of the embodiment of the present invention is preferably 90 nm or less, and more preferably 85 nm or less, from the viewpoint of improving resolving power. Such a film thickness can be obtained by setting the concentration of the solid content in the composition to an appropriate range to provide the composition with a suitable viscosity and improve the coating property or the film forming property.

The composition of the embodiment of the present invention is used by dissolving the components in a predetermined organic solvent, and preferably the mixed solvent, and filtering the solution through a filter and applying it onto a predetermined support (substrate). The pore size of a filter for use in filtration through the filter is preferably pore size of 0.1 μm or less, more preferably 0.05 μm or less, and still more preferably 0.03 μm or less. Further, in a case where the concentration of the solid content of the composition is high (for example, 25% by mass or more), the pore size of a filter used for filter filtration is preferably 3 μm or less, more preferably 0.5 μm or less, and still more preferably 0.3 μm or less. The filter is preferably a polytetrafluoroethylene-made, polyethylene-made, or nylon-made filter. In the filtration through a filter as shown in the specification of JP2002-062667A, circulating filtration may be performed or the filtration may be performed by connecting plural kinds of filters in series or in parallel. In addition, the composition may be filtered in plural times. Furthermore, the composition may be subjected to a deaeration treatment or the like before or after filtration through a filter.

<Applications>

The composition of the embodiment of the present invention relates to an actinic ray-sensitive or radiation-sensitive resin composition whose properties change by undergoing a reaction upon irradiation with actinic rays or radiation. More specifically, the composition of the embodiment of the present invention relates to an actinic my-sensitive or radiation-sensitive resin composition which is used in a step of manufacturing a semiconductor such as an integrated circuit (IC), for manufacture of a circuit board for a liquid crystal, a thermal head, or the like, the manufacture of a mold structure for imprinting, other photofabrication steps, or production of a planographic printing plate or an acid-curable composition. A pattern formed in the present invention can be used in an etching step, an ion implantation step, a bump electrode forming step, a rewiring forming step, a microelectromechanical system (MEMS), or the like.

[Pattern Forming Method]

The present invention also relates to a pattern forming method using the actinic my-sensitive or radiation-sensitive resin composition. Hereinafter, the pattern forming method of the embodiment of the present invention will be described. Further, the actinic ray-sensitive or radiation-sensitive film of the embodiment of the present invention will be described together with the description of the pattern forming method.

The pattern forming method of the embodiment of the present invention has:
  (i) a step of forming a resist film (actinic ray-sensitive or radiation-sensitive film) on a support with the above-described actinic my-sensitive or radiation-sensitive resin composition (resist film forming step),
  (ii) a step of exposing the resist film (irradiating actinic rays or radiation) (exposing step), and
  (iii) a step of developing the exposed resist film with a developer (developing step).

The pattern forming method of the embodiment of the present invention is not particularly limited as long as it includes the steps (i) to (iii), and may further include the following steps.

In the pattern forming method of the embodiment of the present invention, the exposing method in the exposing step (ii) may be liquid immersion exposure.
  The pattern forming method of the embodiment of the present invention preferably includes a prebaking (PB) step (iv) before the exposing step (ii).
  The pattern forming method of the embodiment of the present invention preferably includes a post-exposure baking (PEB) step (v) after the exposing step (ii) and before the developing step (iii).
  The pattern forming method of the embodiment of the present invention may include the exposing step (ii) a plurality of times.
  The pattern forming method of the embodiment of the present invention may include the prebaking step (iv) a plurality of times.
  The pattern forming method of the embodiment of the present invention may include the post-exposure baking step (v) a plurality of times.

In the pattern forming method of the embodiment of the present invention, the film forming step (i), the exposing step (ii), and the developing step (iii) described above can be performed by a generally known method.

In addition, a resist underlayer film (for example, spin on glass (SOG), spin on carbon (SOC), and an antireflection film) may be formed between the resist film and the support, as desired. As a material constituting the resist underlayer film, known organic or inorganic materials can be appropriately used.
  A protective film (topcoat) may be formed on the upper layer of the resist film. As the protective film, a known material can be appropriately used. For example, the compositions for forming a protective film disclosed in the specification of US2007/0178407A, the specification of US2008/0085466A, the specification of US2007/0275326A, the specification of US2016/0299432A, the specification of US2013/0244438A, or the specification of WO2016/157988A can be suitably used. The composition for forming a protective film preferably includes the above-described acid diffusion control agent.
  A protective film may be formed on the upper layer of the resist film including the above-mentioned hydrophobic resin.
  The support is not particularly limited, and a substrate which is generally used in a step of manufacturing a semiconductor such as an IC, and a process for manufacturing a circuit board for a liquid crystal, a thermal head, or the like, and other lithographic processes of photofabrication can be used. Specific examples of the support include an inorganic substrate such as silicon, $SiO_2$, and SiN.

For any of the prebaking step (iv) and the post-exposure baking step (v), the baking temperature is preferably 70° C. to 130° C., and more preferably 80° C. to 120° C.

For any of the prebaking step (iv) and the post-exposure baking step (v), the baking time is preferably 30 to 300 seconds, more preferably 30 to 180 seconds, and still more preferably 30 to 90 seconds.

The baking may be performed using a unit included in an exposure apparatus and a development device, or may also be performed using a hot plate or the like.

A light source wavelength used in the exposing step is not particularly limited, and examples thereof include infrared rays, visible light, ultraviolet rays, far ultraviolet rays, extreme ultraviolet rays (EUV), X-rays, and electron beams. Among those, far ultraviolet rays are preferable, and a wavelength thereof is preferably 250 nm or less, more preferably 220 nm or less, and still more preferably 1 to 200 mu. Specific examples thereof include a KrF excimer laser (248 nm), an ArF excimer laser (193 nm), an $F_2$ excimer laser (157 mu), X-rays, EUV (13 mu), and electron beams, the KrF excimer laser, the ArF excimer laser, EUV, or the electron beams are preferable.

In the developing step (iii), the developer may be either an alkali developer or a developer including an organic solvent (hereinafter also referred to as an organic developer).

As the alkali developer, a quaternary ammonium salt typified by tetramethylammonium hydroxide is usually used, but in addition to this, an alkaline aqueous solution such as an inorganic alkali, primary to tertiary amines, an alcoholamine, and a cyclic amine can also be used.

Furthermore, the alkali developer may include an appropriate amount of alcohols and/or a surfactant. The alkali concentration of the alkali developer is usually 0.1% to 20% by mass. The pH of the alkali developer is usually 10 to 15.

A time period for performing development the using the alkali developer is usually 10 to 300 seconds.

The alkali concentration, the pH, and the development time using the alkali developer can be appropriately adjusted depending on a pattern formed.

The organic developer is preferably a developer including at least one organic solvent selected from the group consisting of a ketone-based solvent, an ester-based solvent, an alcohol-based solvent, an amide-based solvent, an ether-based solvent, and a hydrocarbon-based solvent.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butyrate, methyl 2-hydroxyisobutyrate, isoamyl acetate, isobutyl isobutyrate, and butyl propionate.

As the alcohol-based solvent, the amide-based solvent, the ether-based solvent, and the hydrocarbon-based solvent, the solvents disclosed in paragraphs [0715] to [0718] of the specification of US2016/0070167A1 can be used.

A plurality of the solvents may be mixed or the solvent may be used in admixture with a solvent other than those described above or water. The moisture content in the entire developer is preferably less than 50% by mass, more preferably less than 20% by mass, still more preferably less than 10% by mass, and even still more preferably 0% to less than 5% by mass, and particularly preferably, moisture is not substantially included.

The content of the organic solvent with respect to the organic developer is preferably 50% to 100% by mass, more preferably 80% to 100% by mass, still more preferably 90% to 100% by mass, and particularly preferably 95% to 100/by mass, with respect to the total amount of the developer.

The organic developer may include an appropriate amount of a known surfactant, as desired.

The content of the surfactant is usually 0.001% to 5% by mass, preferably 0.005% to 2% by mass, and still more preferably 0.01% to 0.5% by mass, with respect to the total amount of the developer.

The organic developer may include the above-described acid diffusion control agent.

Examples of the developing method include a method in which a substrate is dipped in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously jetted onto a substrate spun at a constant rate while scanning a developer jetting nozzle at a constant rate (a dynamic dispense method).

A combination of a step of performing development using an alkaline aqueous solution (an alkali developing step) and a step of performing development using a developer including an organic solvent (an organic solvent developing step) may be used. Thus, a finer pattern can be formed since a pattern can be formed by keeping only a region with an intermediate exposure intensity from not being dissolved.

It is preferable that the method includes a step of performing washing using a rinsing liquid (a rinsing step) after the developing step (iii).

As the rinsing liquid used in the rinsing step after the developing step with an alkali developer, for example, pure water can be used. The pure water may include an appropriate amount of a surfactant. In this case, after the developing step or the rinsing step, a treatment for removing the developer or the rinsing liquid adhering on a pattern by a supercritical fluid may be added. In addition, after the rinsing treatment or the treatment using a supercritical fluid, a heating treatment for removing moisture remaining in the pattern may be performed.

The rinsing liquid used in the rinsing step after the developing step with a developer including an organic solvent is not particularly limited as long as the rinsing liquid does not dissolve the pattern, and a solution including a common organic solvent can be used. As the rinsing liquid, a rinsing liquid including at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include the same solvents as those described for the developer including an organic solvent.

As the rinsing liquid used in the rinsing step in this case, a rinsing liquid including a monohydric alcohol is more preferable.

Here, examples of the monohydric alcohol used in the rinsing step include linear, branched, or cyclic monohydric alcohols. Specific examples thereof include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and methyl isobutyl carbinol. Examples of the monohydric alcohol having 5 or more carbon atoms include 1-hexanol, 2-hexanol, 4-methyl-2-pentanol, 1-pentanol, 3-methyl-1-butanol, and methyl isobutyl carbinol.

The respective components in a plural number may be mixed or the components may also be used in admixture with an organic solvent other than the solvents.

The moisture content in the rinsing liquid is preferably 10% by mass or less, more preferably 5% by mass or less, and still more preferably 3% by mass or less. By setting the moisture content to 10% by mass or less, good development characteristics are obtained.

The rinsing liquid may include an appropriate amount of a surfactant.

In the rinsing step, the substrate that has been subjected to development using an organic developer is subjected to a washing treatment using a rinsing liquid including an organic solvent. A method for the washing treatment method is not particularly limited, but examples thereof include a method in which a rinsing liquid is continuously jetted on a substrate rotated at a constant rate (a rotation application method), a method in which a substrate is dipped in a tank filled with a rinsing liquid for a certain period of time (a dip method), and a method in which a rinsing liquid is sprayed on a substrate surface (a spray method). Among those, it is preferable that a washing treatment is carried out using the rotation application method, and a substrate is rotated at a rotation speed of 2,000 to 4,000 rpm after washing, thereby removing the rinsing liquid from the substrate. Furthermore, it is also preferable that the method includes a baking step after the rinsing step (postbaking). The developer and the rinsing liquid remaining between and inside the patterns are removed by the baking step. In the baking step after the rinsing step, the baking temperature is usually 40° C. to 160° C., and preferably 70° C. to 95° C., and the baking time is typically 10 seconds to 3 minutes, and preferably 30 seconds to 90 seconds.

It is preferable that various materials (for example, a resist solvent, a developer, a rinsing liquid, a composition for forming an antireflection film, and a composition for forming a topcoat) used in the actinic ray-sensitive or radiation-sensitive resin composition of the embodiment of the present invention, and the pattern forming method of the embodiment of the present invention include no impurities such as metal components, isomers, and residual monomers. The content of the impurities included in these materials is preferably 1 ppm or less, more preferably 100 ppt or less, and still more preferably 10 ppt or less, and particularly preferably, the impurities are not substantially included (no higher than a detection limit of a measurement device).

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made, polyethylene-made, or nylon-made filter is preferable. As the filter, a filter which has been washed with an organic solvent in advance may be used. In the step of filtration using a filter, plural kinds of filters connected in series or in parallel may be used. In a case of using the plural kinds of filters, a combination of filters having different pore diameters and/or materials may be used. In addition, various materials may be filtered plural times, and the step of filtering plural times may be a circulatory filtration step. As the filter, a filter having a reduced amount of eluates as disclosed in the specification of JP2016-201426A is preferable.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, and organic adsorbing materials such as activated carbon can be used. Examples of the metal adsorbing agent include those disclosed in the specification of JP2016-206500A.

In addition, as a method for reducing the impurities such as metals included in the various materials, metal content selects the less material as a raw material constituting the various materials, performing filtering using a filter of the raw material constituting the various materials, equipment the inner and a method such as performing distillation under conditions suppressing as much where available equal to contamination is lined with TEFLON (registered trademark). It is also preferable to perform a glass lining treatment in all steps of the manufacturing facility for synthesizing various materials (a resin, a photoacid generator, and the like) of the resist component in order to reduce impurities such as metals to a ppt order. Preferred conditions in the filtering using a filter to be performed on the raw material constituting the various materials are the same as the above-described conditions.

In order to prevent impurities from being incorporated, it is preferable that various materials are stored in the container described in US2015/0227049A, JP2015-123351A, JP2017-013804A, or the like.

A method for improving the surface roughness of a pattern may be applied to a pattern formed by the pattern forming method of the embodiment of the present invention. Examples of the method for improving the surface roughness of a pattern include the method of treating a pattern by plasma of a hydrogen-containing gas, as disclosed in the specification of US2015/0104957A. In addition, known methods as described in the specification of JP2004-235468A, the specification of US2010/0020297A, and Proc.

of SPIE Vol. 8328 83280N-1 "EUV Resist Curing Technique for LWR Reduction and Etch Selectivity Enhancement" may be applied.

In addition, a pattern formed by the method can be used as a core material (core) of the spacer process disclosed in, for example, the specification of JP1991-270227A (JP-H03-270227A) and the specification of US2013/0209941A.

[Method for Manufacturing Electronic Device]

Moreover, the present invention further relates to a method for manufacturing an electronic device, the method including the above-described pattern forming method. The electronic device manufactured by the method for manufacturing an electronic device of an embodiment of the present invention is suitably mounted on electric or electronic equipment (for example, home electronics, office automation (OA)-related equipment, media-related equipment, optical equipment, and telecommunication equipment).

EXAMPLES

Hereinbelow, the present invention will be described in more detail with reference to Examples. The materials, the amounts of materials used, the proportions, the treatment details, the treatment procedure, and the like shown in the Examples below may be modified as appropriate as long as the modifications do not depart from the spirit of the present invention. Therefore, the scope of the present invention should not be construed as being limited to the Examples shown below.

[Preparation of Actinic Ray-Sensitive or Radiation-Sensitive Resin Composition (for ArF Exposure)]

Various components contained in the actinic ray-sensitive or radiation-sensitive resin composition shown in Table 4 are shown below.

<Resin (AX1)>

The resins (A-1 to A-11 and B-1 to B-3) shown in Table 4 are shown below.

Further, the weight-average molecular weight (Mw) and the dispersity (Mw/Mn) of the resins A-1 to A-11 and B-1 to B-3 were measured by GPC (carrier: THF (tetrahydrofuran)) (amount converted in terms of polystyrene). In addition, the compositional ratio (ratio % by mole) of the resin was measured by $^{13}$C-nuclear magnetic resonance (NMR).

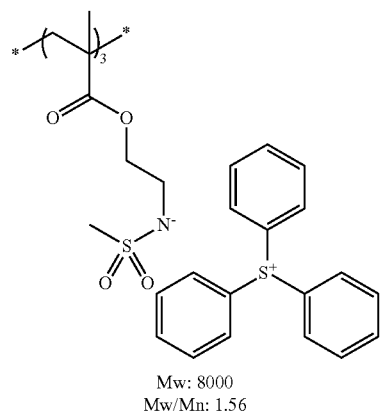

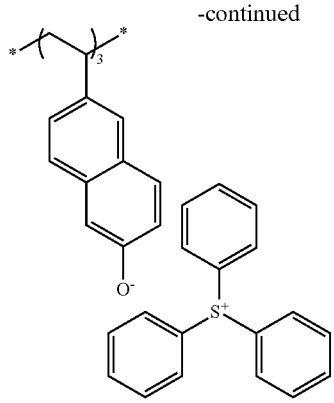
Mw: 7500
Mw/Mn: 1.59
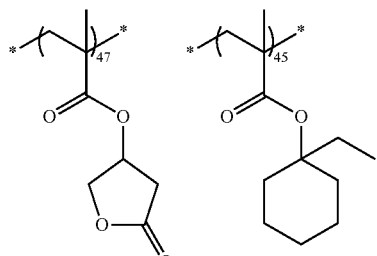
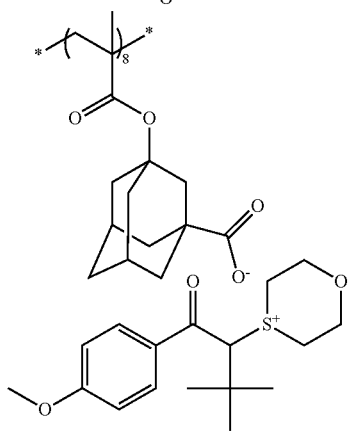
Mw: 18000
Mw/Mn: 1.71
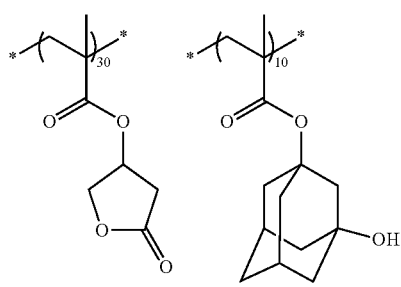
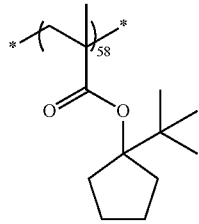
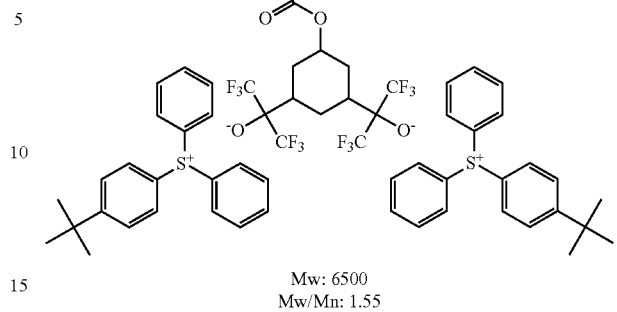
Mw: 6500
Mw/Mn: 1.55
A-4
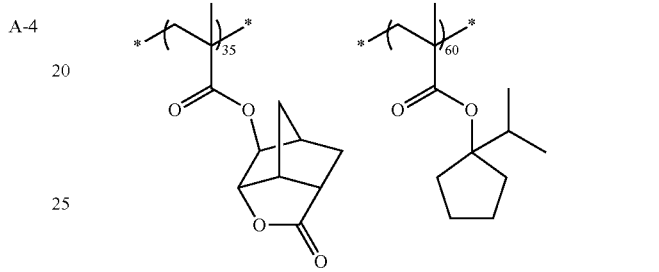
A-6
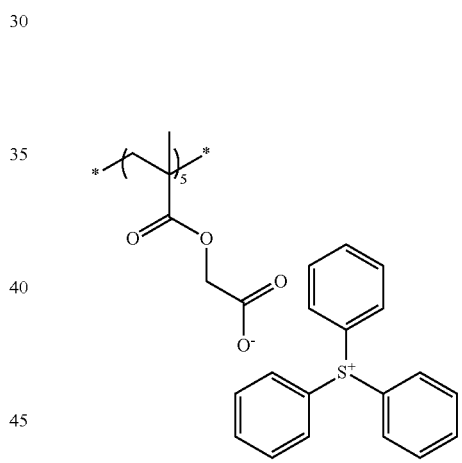
Mw: 9000
Mw/Mn: 1.60
A-5
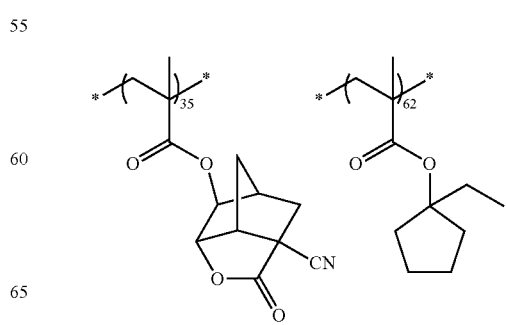
A-7

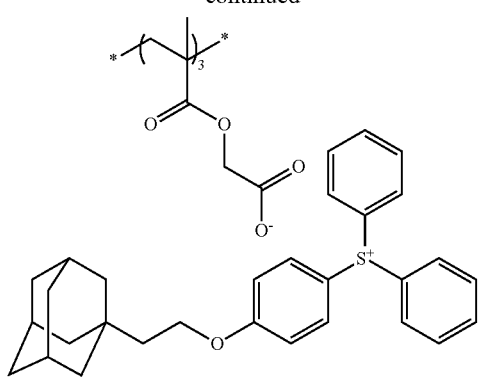
Mw: 12000
Mw/Mn: 1.63
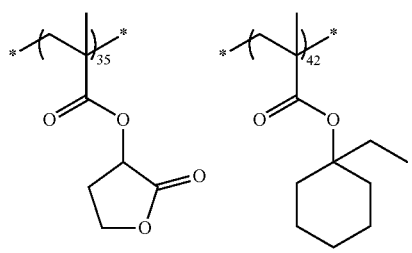
Mw: 8500
Mw/Mn: 1.55
A-8
A-10
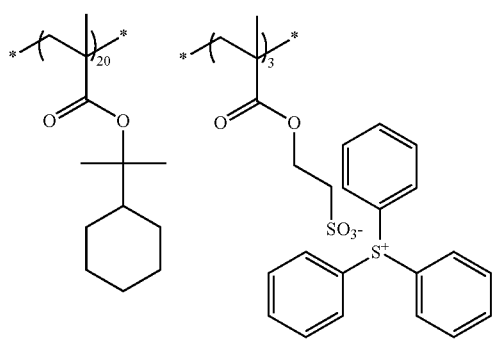
Mw: 6000
Mw/Mn: 1.47
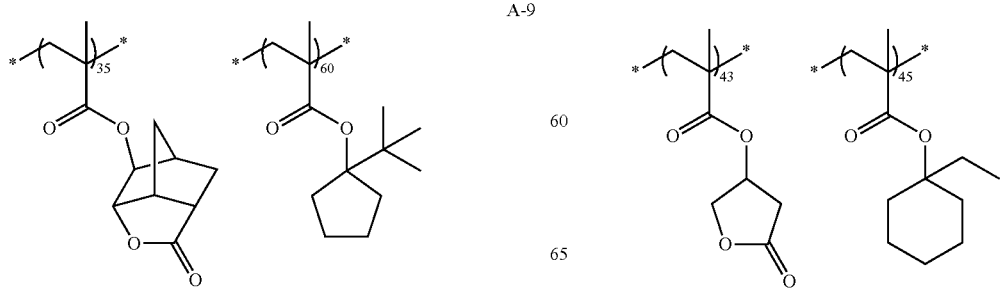
Mw: 16000
Mw/Mn: 1.67
A-9
A-11
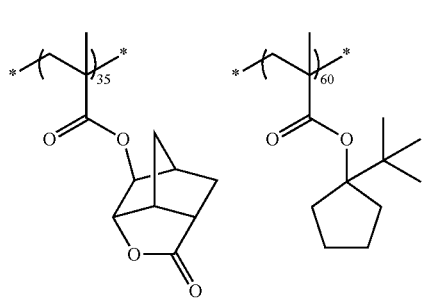

-continued

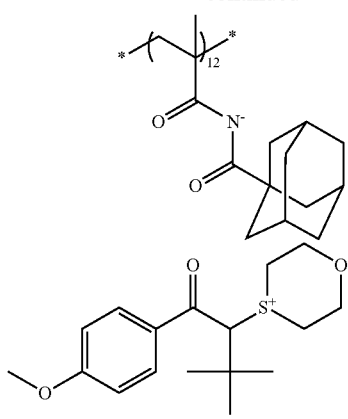

Mw: 20000
Mw/Mn: 1.67

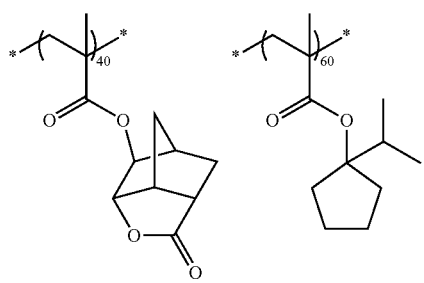

Mw: 10000
Mw/Mn: 1.73

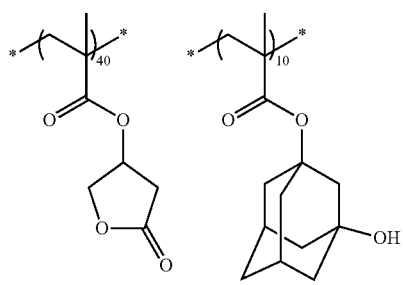

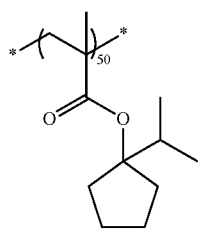

Mw: 8500
Mw/Mn: 1.62

-continued

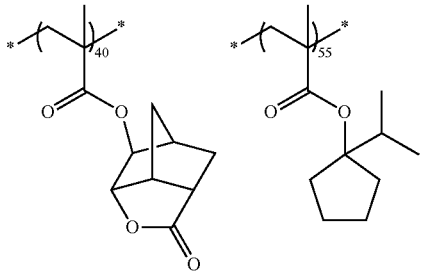

B-1

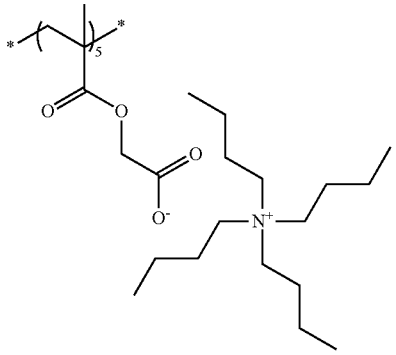

B-2

Mw: 8000
Mw/Mn: 1.56

With regard to repeating units derived from monomers having a salt structure (corresponding to the repeating unit A) in the resins (A-1 to A-11 and B-3) shown in Table 4, the pKa's of the monomers in which the main chain part in the repeating unit is a double bond and a cationic structure moiety in the monomer having a salt structure is substituted with a hydrogen atom are shown in Table 1. Measurement of the pKa was performed by the above-mentioned method.

In addition, for example, in a case of the resin A-1, in the repeating unit derived from a monomer having a salt structure (corresponding to the repeating unit A), a monomer in which the cationic structure moiety in the salt structure is substituted with a hydrogen atom has a structure shown below.

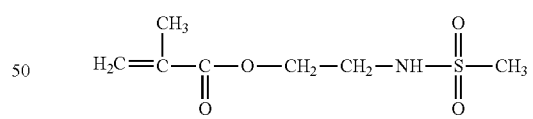

TABLE 1

| Resin | pKa of monomer obtained by substituting cationic structure moiety in salt structure with hydrogen atom in repeating unit derived from monomer having salt structure (corresponding to repeating unit A) |
|---|---|
| A-1 | 9.84 |
| A-2 | 3.72 |
| A-3 | 9.59 |
| A-4 | 4.31 |
| A-5 | 9.33 |
| A-6 | 2.53 |
| A-7 | 2.53 |
| A-8 | 1.04 |

TABLE 1-continued
| Resin | pKa of monomer obtained by substituting cationic structure moiety in salt structure with hydrogen atom in repeating unit derived from monomer having salt structure (corresponding to repeating unit A) |
|---|---|
| A-9 | −0.55 |
| A-10 | 4.85 |
| A-11 | 10.51 |
| B-3 | 2.53 |
<Acid Generator (B)>
The structures of the acid generators (B) (PAG-1 to PAG-8) shown in Table 4 are shown below.
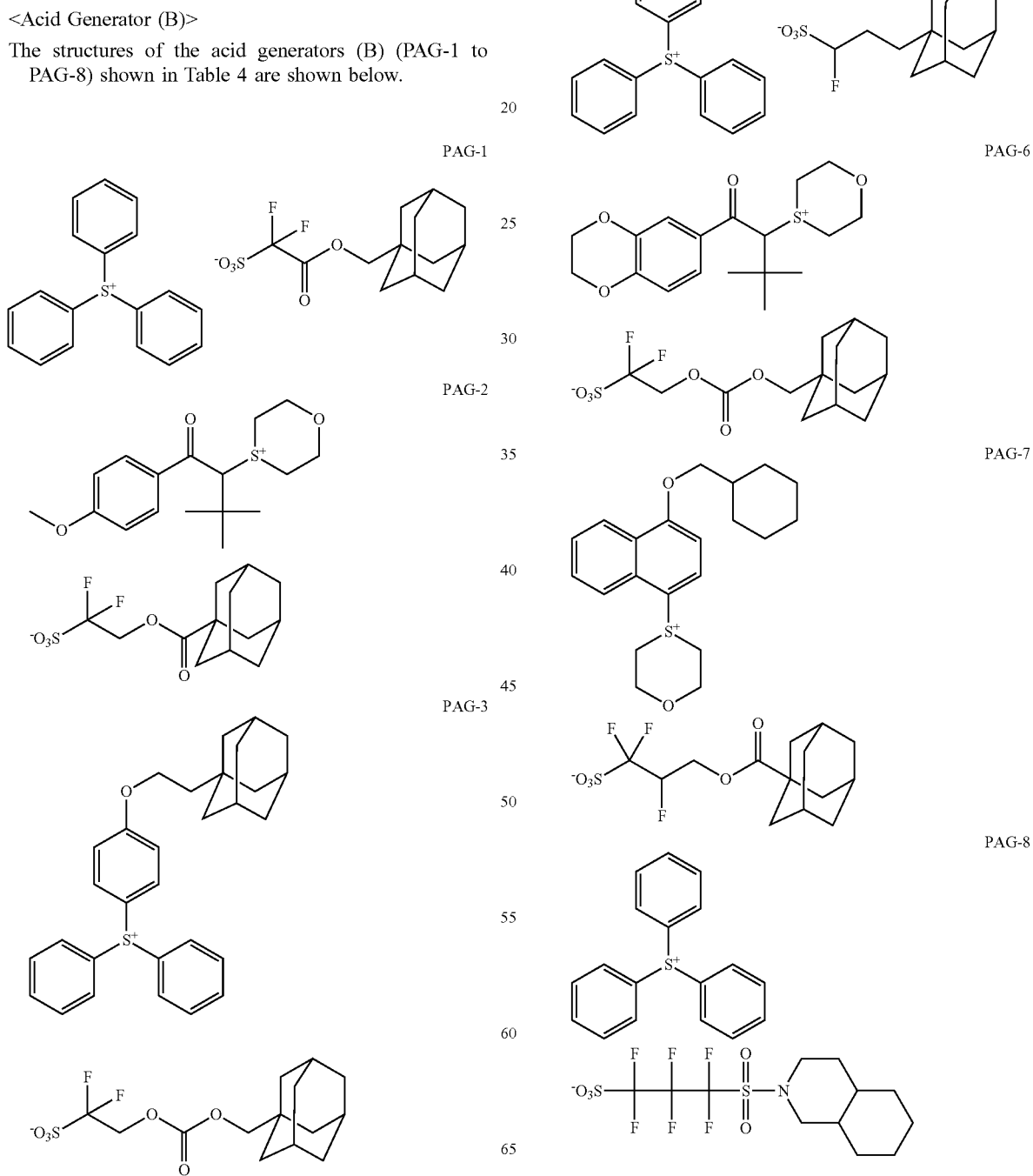

The pKa's of acids generated from the above-mentioned acid generators (B) (PAG-1 to PAG-8) are shown in Table 2. Measurement of the pKa was performed by the above-mentioned method.

TABLE 2

| Resin | pKa for acid generation |
| --- | --- |
| PAG-1 | −3.26 |
| PAG-2 | −2.70 |
| PAG-3 | −2.70 |
| PAG-4 | −1.37 |
| PAG-5 | −0.02 |
| PAG-6 | −2.70 |
| PAG-7 | −2.92 |
| PAG-8 | −3.27 |

<Acid Diffusion Control Agent (Basic Compound)>

The structures of the acid diffusion control agents (N-1 to N-4) shown in Table 4 are shown below.

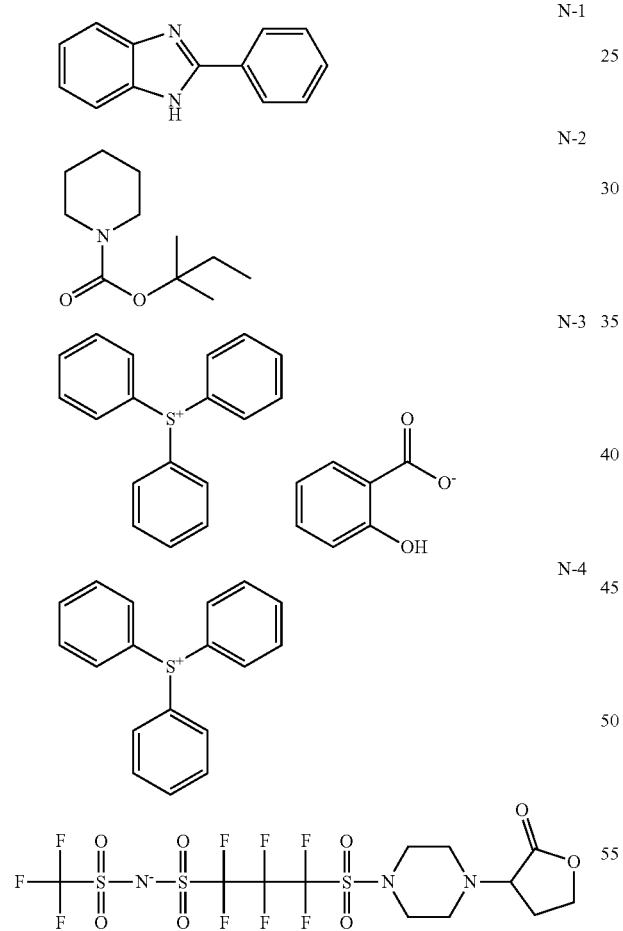

<Hydrophobic Resin>

The structures of the hydrophobic resins (1b and 2b) shown in Table 4 are shown below. Further, the weight-average molecular weight (Mw) and the dispersity (Mw/Mn) of the hydrophobic resins (1b and 2b) were measured by GPC (carrier: THF (tetrahydrofuran)) (amount converted in terms of polystyrene). In addi-tion, the compositional ratio (ratio % by mole) of the resin was measured by $^{13}$C-nuclear magnetic resonance (NMR).

Table 3 shows the weight-average molecular weight (Mw), dispersity (Mw/Mn), and molar ratio (the molar ratio of each repeating unit is shown in order from the left) of the hydrophobic resins (1b and 2b).

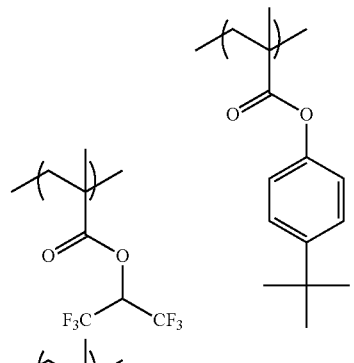

(1b)

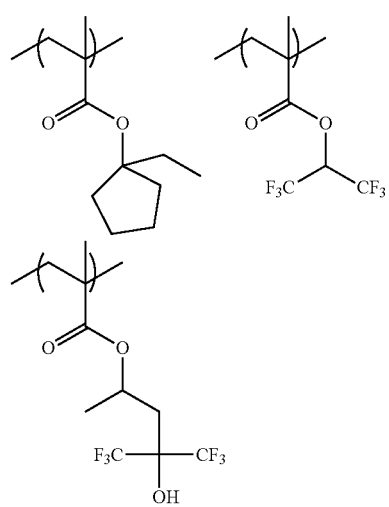

(2b)

TABLE 3

| Hydrophobic resin | Compositional ratio (% by mole) | | | Mw | Mw/Mn |
| --- | --- | --- | --- | --- | --- |
| 1b | 50 | 45 | 5 | 7,000 | 1.30 |
| 2b | 40 | 40 | 20 | 18,600 | 1.57 |

<Surfactant>

The surfactants shown in Table 4 are shown below.

W-1: PolyFox PF-6320 (manufactured by OMNOVA Solutions Inc.; fluorine-based)

<Solvent>

The solvents shown in Table 4 are shown below.

SL-1: Propylene glycol monomethyl ether acetate (PGMEA)
SL-2: Propylene glycol monomethyl ether (PGME)
SL-3: Cyclohexanone
SL-4: γ-Butyrolactone

[ArF Exposure Pattern Formation and Performance Evaluation]

<Preparation of Actinic Ray-Sensitive or Radiation-Sensitive Resin Composition>

The components shown in Table 4 were mixed so that the concentration of the solid content was 3.8% by mass. Then, the obtained mixed liquid was filtered through a polyethylene filter having a pore size of 0.1 μm to prepare an actinic ray-sensitive or radiation-sensitive resin composition (hereinafter also referred to as a "resist composition"). In addition, in the resist composition, the solid content means all the components excluding the solvent. The obtained resist composition was used in Examples and Comparative Examples.

<Pattern Formation>

A composition for forming an organic antireflection film ARC29SR (manufactured by Nissan Chemical Industries, Ltd.) was applied onto a silicon wafer and baked at 205° C. for 60 seconds to form an antireflection film having a film thickness of 95 in. A resist composition was applied onto the obtained antireflection film and baked (PB: prebaking) at 100° C. for 60 seconds to form a resist film having a film thickness of 85 nm.

The obtained wafer was exposed through a 6% halftone mask having a 1:1 line-and-space pattern with a line width of 44 nm by using an ArF excimer laser liquid immersion scanner (XT1700i, manufactured by ASML, NA 1.20, C-Quad, outer sigma: 0.900, inner sigma: 0.812, XY deflection). Ultrapure water was used as the immersion liquid. Then, the wafer was heated at 105° C. for 60 second (PEB: post-exposure baking). Thereafter, the wafer was developed by puddling with a negative tone developer (butyl acetate) or a positive developer (aqueous tetramethylammonium hydroxide (TMAH) solution) for 30 seconds, and the wafer was rotated at a rotation speed of 4,000 rpm for 30 seconds to form a 1:1 line-and-space pattern with a line thickness of 44 nm.

<Performance Evaluation>

(LWR Performance Evaluation)

The 1:1 line-and-space pattern with a line width of 44 nm was observed from the top of the pattern with a critical dimension scanning electron microscope (SEM (S-8840, Hitachi High-Technologies Corporation), the line width was measured at 50 points in the edge range of 2 μm in the longitudinal direction of the line pattern, a standard deviation was determined for the measurement dispersion, and 3σ was calculated. A smaller value thereof indicates better performance.

The results are shown in Table 4.

TABLE 4

| | Actinic-sensitive or radiation-sensitive resin composition (formulation) | | | | | | | Evaluation |
|---|---|---|---|---|---|---|---|---|
| | Resin (10 g) | Acid generator (g) | Basic compound (g) | Hydrophobic resin (0.05 g) | Surfactant (0.03 g) | Solvent (mass ratio) | Developer | LWR (nm) |
| Example 1 | A-1 | PAG-1 (2.2) | — | 1b | — | SL-1/SL-2 (80/20) | Butyl acetate | 3.71 |
| Example 2 | A-2 | PAG-2 (2.5) | — | 1b | — | SL-1/SL-2 (80/20) | Butyl acetate | 3.66 |
| Example 3 | A-3 | PAG-7 (2.3) | N-2 (0.05) | 1b | — | SL-1/SL-2 (80/20) | Butyl acetate | 3.97 |
| Example 4 | A-4 | PAG-4 (3.0) | — | 2b | — | SL-1/SL-2 (80/20) | Butyl acetate | 4.21 |
| Example 5 | A-5 | PAG-5 (2.0) | N-1 (0.08) | 1b | — | SL-1/SL-2 (90/10) | Butyl acetate | 4.32 |
| Example 6 | A-6 | PAG-6 (2.7) | — | 1b | — | SL-1/SL-3 (80/20) | Butyl acetate | 3.77 |
| Example 7 | A-7 | PAG-1 (2.0) | — | 1b | — | SL-1/SL-2 (80/20) | Butyl acetate | 4.01 |
| Example 8 | A-8 | PAG-1 (2.2) | — | 1b | — | SL-1/SL-2 (80/20) | Butyl acetate | 3.77 |
| Example 9 | A-9 | PAG-6 (2.7) | — | 1b | — | SL-1/SL-3 (80/20) | Butyl acetate | 3.63 |
| Example 10 | A-10 | PAG-6 (2.7) | — | 1b | — | SL-1/SL-3 (80/20) | Butyl acetate | 3.81 |
| Example 11 | A-11 | PAG-5 (2.0) | — | 1b | — | SL-1/SL-2 (90/10) | Butyl acetate | 3.79 |
| Example 12 | A-1 | PAG-1 (2.0) | — | 1b | — | SL-1/SL-2 (80/20) | Aqueous TMAH solution | 3.61 |
| Example 13 | A-2 | PAG-8 (2.3) | N-3 (0.06) | 2b | W-1 | SL-1/SL-4 (80/20) | Aqueous TMAH solution | 3.58 |
| Example 14 | A-3 | PAG-2 (2.3) | — | 1b | — | SL-1/SL-2 (75/25) | Aqueous TMAH solution | 3.76 |
| Example 15 | A-4 | PAG-4 (2.3) | N-4 (0.05) | 1b | — | SL-1 | Aqueous TMAH solution | 3.92 |
| Example 16 | A-5 | PAG-3 (2.5) | — | 1b | — | SL-1/SL-2 (80/20) | Aqueous TMAH solution | 4.21 |
| Example 17 | A-6 | PAG-3 (2.2) | — | 1b | — | SL-1/SL-2 (80/20) | Aqueous TMAH solution | 3.86 |
| Example 18 | A-7 | PAG-2/PAG-3 (1.0/1.0) | — | 1b | — | SL-1/SL-2 (80/20) | Aqueous TMAH solution | 4.05 |
| Example 19 | A-8 | PAG-7 (2.3) | N-2 (0.05) | 1b | — | SL-1/SL-2 (80/20) | Aqueous TMAH solution | 3.83 |

TABLE 4-continued

| | Resin (10 g) | Acid generator (g) | Basic compound (g) | Hydrophobic resin (0.05 g) | Surfactant (0.03 g) | Solvent (mass ratio) | Developer | Evaluation LWR (nm) |
|---|---|---|---|---|---|---|---|---|
| Example 20 | A-9 | PAG-7 (2.3) | N-2 (0.05) | 1b | — | SL-1/SL-2 (80/20) | Aqueous TMAH solution | 3.99 |
| Example 21 | A-10 | PAG-2 (2.5) | — | 1b | — | SL-1/SL-2 (80/20) | Aqueous TMAH solution | 4.01 |
| Example 22 | A-11 | PAG-5 (2.0) | — | 1b | — | SL-1/SL-2 (90/10) | Aqueous TMAH solution | 3.81 |
| Example 23 | A-1/A-4 (5 g/5 g) | PAG-7 (2.3) | — | 1b | — | SL-1/SL-2/SL-4 (80/10/10) | Butyl acetate | 3.88 |
| Comparative Example 1 | B-1 | PAG-3 (2.0) | N-4 (0.40) | 1b | — | SL-1/SL-2 (80/20) | Butyl acetate | 6.55 |
| Comparative Example 2 | B-2 | PAG-3 (2.0) | N-3 (0.40) | 1b | — | SL-1/SL-2 (80/20) | Aqueous TMAH solution | 6.48 |
| Comparative Example 3 | B-3 | PAG-3 (2.0) | — | 1b | — | SL-1/SL-2 (80/20) | Butyl acetate | 6.55 |

From the results in Table 4, it is clear that in a case where the composition of Examples is used, a pattern thus formed has excellent LWR in the ArF exposure evaluation.

On the other hand, it is clear that a pattern obtained with the compositions of Comparative Examples has LWR not satisfying the desired requirements.

[Preparation of Actinic Ray-Sensitive or Radiation-Sensitive Resin Composition (for EUV Exposure)]

The various components included in the actinic ray-sensitive or radiation-sensitive resin composition shown in Table 8 are shown below.

<Resin (AX1)>

The resins (A-12 to A-15 and B4) shown in Table 8 are shown below.

Furthermore, the weight-average molecular weight (Mw) and the dispersity (Mw/Mn) of the resins A-12 to A-15 and B4 were measured by GPC (carrier: THF (tetrahydrofuran)) (amount converted in terms of polystyrene). In addition, the compositional ratio (ratio % by mole) of the resin was measured by $^{13}C$-nuclear magnetic resonance (NMR).

A-12

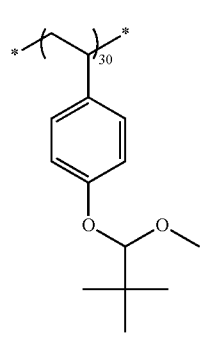
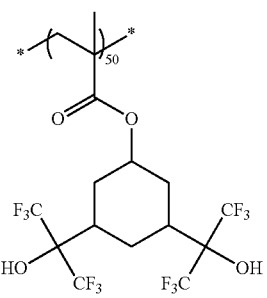

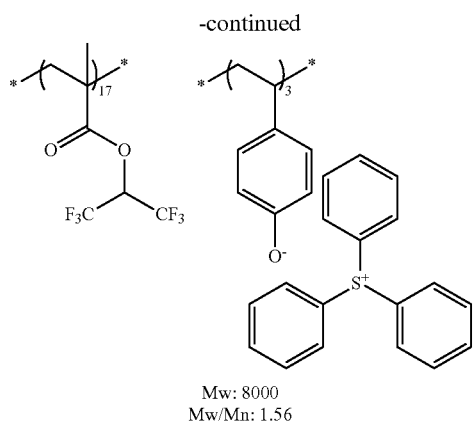

Mw: 8000
Mw/Mn: 1.56

A-13

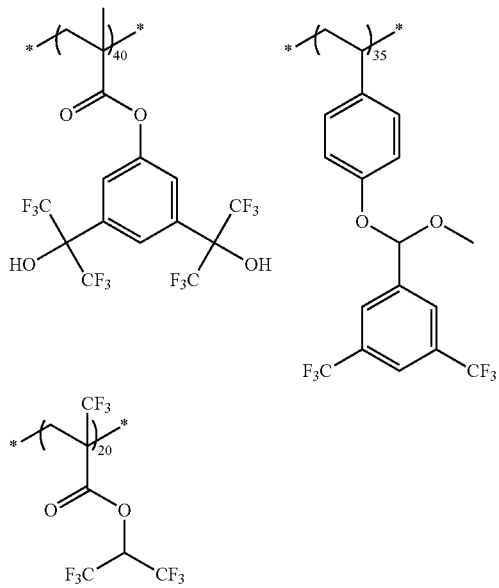

-continued

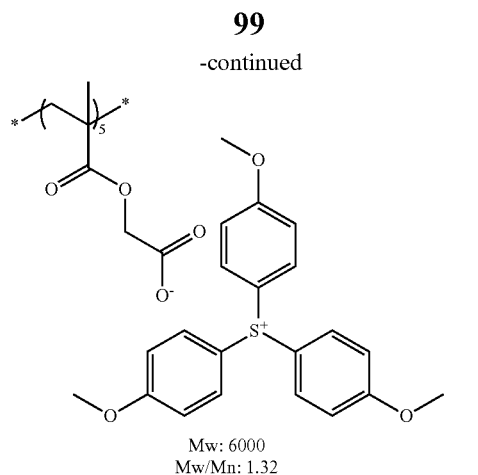

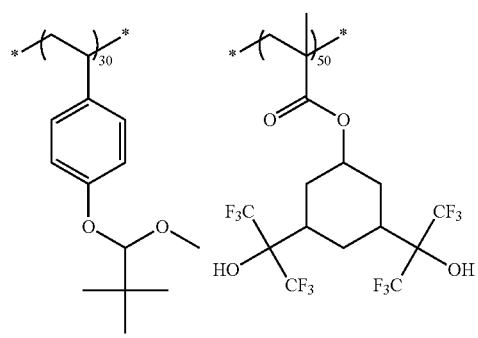

A-14

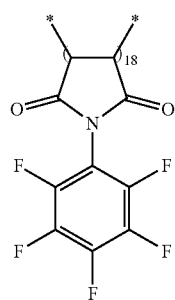

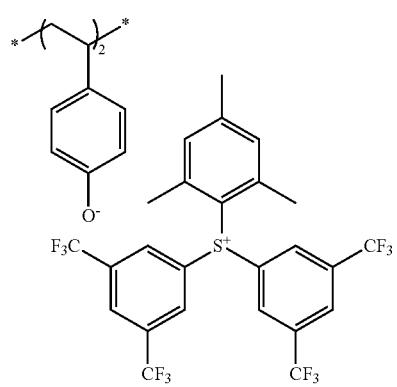

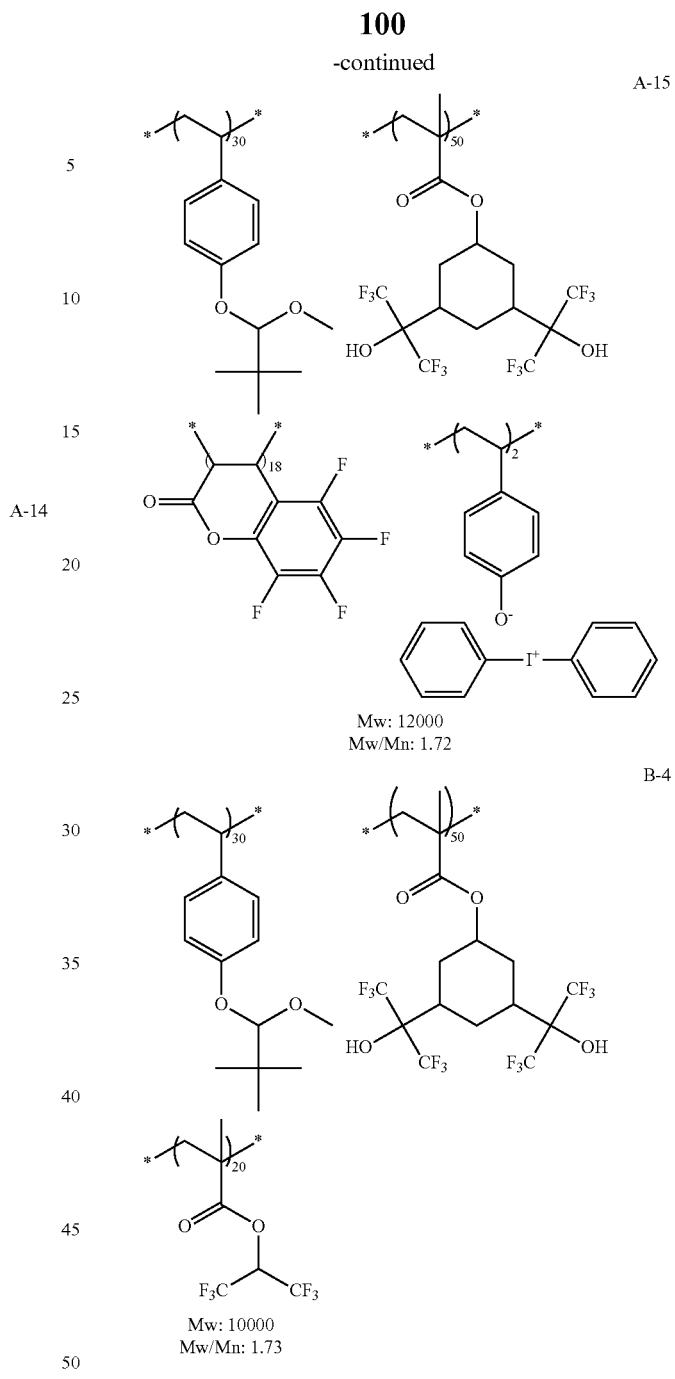

Furthermore, with regard to the repeating units (corresponding to the repeating unit A) derived from the monomers having a salt structure in the resins (A-12 to A-15) shown in Table 8, the pKa's of monomers in which the main chain part in the repeating unit is a double bond and the cationic structure moiety in the monomer having a salt structure is substituted with a hydrogen atom are shown in Table 5. Measurement of the pKa was performed by the above-mentioned method.

In addition, for example, in a case of the resin A-12, in the repeating unit (corresponding to the repeating unit A) derived from a monomer having a salt structure, a monomer in which the cationic structure moiety in the salt structure is substituted with a hydrogen atom is hydroxystyrene.

TABLE 5

| Resin | pKa of monomer obtained by substituting cationic structure moiety in salt structure with hydrogen atom in repeating unit derived from monomer having salt structure (corresponding to repeating unit A) |
|---|---|
| A-12 | 9.95 |
| A-13 | 2.53 |
| A-14 | 9.95 |
| A-15 | 9.95 |

<Acid Generator (B)>

The structures of the acid generators (B) (PAG-9 to PAG-12) shown in Table 8 are shown below.

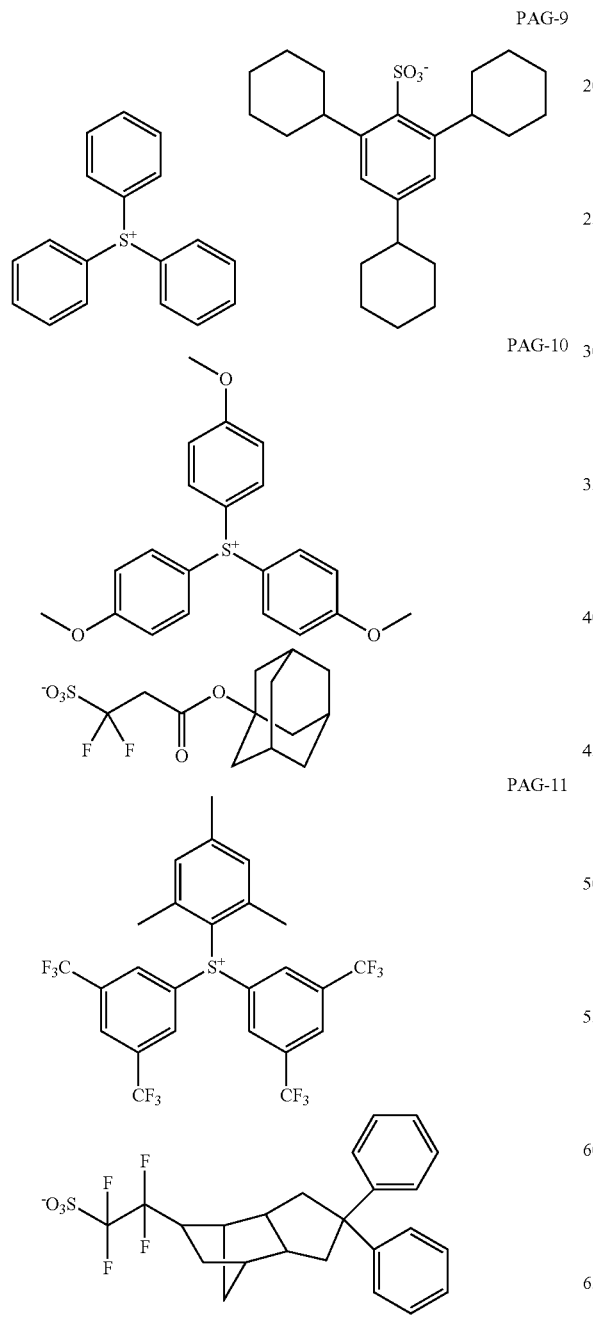

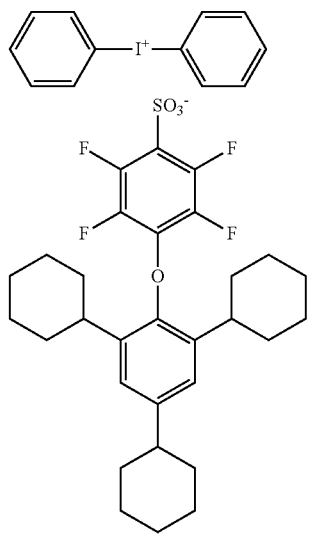

The pKa's of acids generated from the above-mentioned acid generators (B) (PAG-9 to PAG-12) are shown in Table 6. Measurement of the pKa was performed by the above-mentioned method.

TABLE 6

| Resin | pKa for acid generation |
|---|---|
| PAG-9 | −0.22 |
| PAG-10 | −2.43 |
| PAG-11 | −2.80 |
| PAG-12 | −1.99 |

<Acid Diffusion Control Agent (Basic Compound)>

The structures of the acid diffusion control agents (N-1 and N-4) shown in Table 8 are shown below.

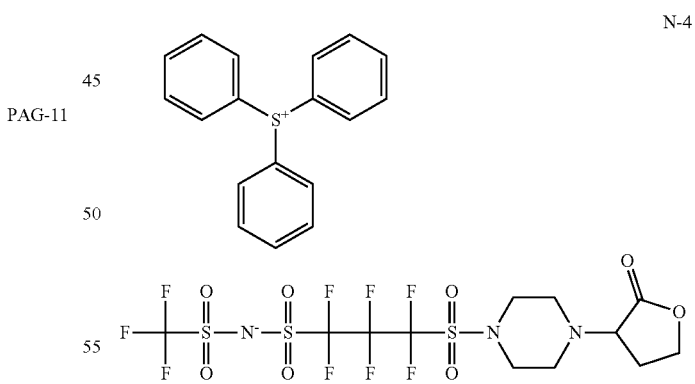

<Hydrophobic Resin>

The structure of the hydrophobic resin (3b) shown in Table 8 is shown below. The weight-average molecular weight (Mw) and the dispersity (Mw/Mn) of the hydrophobic resin (3b) were measured by GPC (carrier: THF (tetrahydrofuran)) (amount converted in terms of polystyrene). In addition, the compositional ratio (ratio % by mole) of the resin was measured by $^{13}$C-nuclear magnetic resonance (NMR).

The weight-average molecular weight (Mw), the dispersity (Mw/Mn), and the molar ratio of the hydrophobic resin (3b) are shown in Table 7.

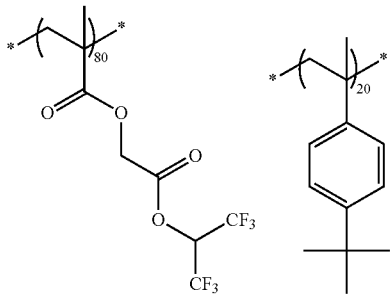

(3b)

TABLE 7

| Hydrophobic resin | Compositional ratio (% by mole) | Mw | Mw/Mn |
|---|---|---|---|
| 3b | 80  20 | 14,000 | 1.7 |

<Surfactant>
The surfactants shown in Table 8 are shown below.
W-1: MEGAFACE F176 (manufactured by DIC Corporation; fluorine-based)
W-2: MEGAFACE R08 (manufactured by DIC Corporation; fluorine-based and silicon-based)
<Solvent>
The solvents shown in Table 8 are shown below.
SL-1: Propylene glycol monomethyl ether acetate (PGMEA)
SL-2: Propylene glycol monomethyl ether (PGME)
SL-3: Cyclohexanone
SL-4: γ-Butyrolactone
SL-5: Ethyl lactate
[EUV Exposure Pattern Formation and Performance Evaluation]
<Preparation of Actinic Ray-Sensitive or Radiation-Sensitive Resin Composition>
The components shown in Table 8 were mixed so that the concentration of the solid content was 1.4% by mass.

Then, the obtained mixed liquid was filtered through a polyethylene filter having a pore size of 0.03 m to prepare an actinic my-sensitive or radiation-sensitive resin composition (also referred to as a resist composition). In addition, in the resist composition, the solid content means all the components excluding the solvent. The obtained resist composition was used in Examples and Comparative Examples.
<Pattern Formation>
The resist composition was applied onto a silicon wafer (12 inches) on which an underlayer film AL412 (manufactured by Brewer Science, Inc.) had been formed, and the coating film was baked (PB: prebaking) at 100° C. for 60 seconds to obtain a silicon wafer having a resist film.

The silicon wafer having the obtained resist film was subjected to pattern irradiation using an EUV exposure apparatus (manufactured by Exitech Ltd., Micro Exposure Tool, NA 0.3, Quadrupole, outer sigma: 0.68, and inner sigma: 0.36). In addition, a mask having a line size=20 nm and a line: space=1:1 was used as the reticle.

Thereafter, after baking at 105° C. for 60 seconds (PEB: post-exposure baking), the silicon wafer was puddle-developed with a negative tone developer (butyl acetate) or a positive developer (aqueous tetramethyl-ammonium hydroxide (TMAH) solution) for 30 seconds, and puddle-rinsed with pure water, and then, the silicon wafer was rotated at a rotation speed of 4,000 rpm for 30 seconds and then baked at 90° C. for 60 seconds to obtain a line-and-space pattern having a pitch of 40 nm and a line width of 20 nm (space width of 20 nm).
<Performance Evaluation>
(LWR Performance Evaluation)
The obtained 1:1 line-and-space pattern with a line width of 20 nm was observed from the top of the pattern with a critical dimension scanning electron microscope (SEM (S-8840, Hitachi High-Technologies Corporation)), the line width was measured at 50 points in the edge range of 2 μm in the longitudinal direction of the line pattern, a standard deviation was determined for the measurement dispersion, and 3v was calculated. A smaller value thereof indicates better performance.

The results are shown in Table 8.

TABLE 8

| | Actinic-sensitive or radiation-sensitive resin composition (formulation) | | | | | | | Evaluation |
|---|---|---|---|---|---|---|---|---|
| | Resin (10 g) | Acid generator (g) | Basic compound (g) | Hydrophobic resin (0.05 g) | Surfactant (0.03 g) | Solvent (mass ratio) | Developer | LWR (nm) |
| Example 24 | A-12 | PAG-9 (2.6) | — | 3b | — | SL-1/SL-2/SL-3 (30/20/50) | Butyl acetate | 4.71 |
| Example 25 | A-13 | PAG-10 (2.7) | — | 3b | — | SL-1/SL-2 (80/20) | Butyl acetate | 4.54 |
| Example 26 | A-14 | PAG-11 (3.1) | N-4 (0.05) | 3b | — | SL-1/SL-2/SL-3 (30/20/50) | Butyl acetate | 4.74 |
| Example 27 | A-15 | PAG-12 (3.0) | — | 3b | W-1 | SL-1/SL-4 (90/10) | Butyl acetate | 4.26 |
| Example 28 | A-12 | PAG-9 (3.1) | — | 3b | — | SL-3/SL-5 (90/10) | Aqueous TMAH solution | 4.41 |
| Example 29 | A-13 | PAG-10 (3.3) | — | 3b | — | SL-1/SL-4 (90/10) | Aqueous TMAH solution | 4.67 |
| Example 30 | A-14 | PAG-11 (3.5) | — | 3b | — | SL-1/SL-4 (90/10) | Aqueous TMAH solution | 4.64 |

TABLE 8-continued

| | Actinic-sensitive or radiation-sensitive resin composition (formulation) | | | | | | | Evaluation |
|---|---|---|---|---|---|---|---|---|
| | Resin (10 g) | Acid generator (g) | Basic compound (g) | Hydrophobic resin (0.05 g) | Surfactant (0.03 g) | Solvent (mass ratio) | Developer | LWR (nm) |
| Example 31 | A-15 | PAG-12 (3.2) | | 3b | W-2 | SL-3/SL-5 (90/10) | Aqueous TMAH solution | 4.82 |
| Example 32 | A-12/A-15 (5 g/5 g) | | | 3b | — | SL-1/SL-2/SL-3 (30/20/50) | Butyl acetate | 4.53 |
| Comparative Example 4 | B-4 | PAG-9 (2.7) | N-4 (0.30) | 3b | — | SL-1/SL-2 (80/20) | Butyl acetate | 7.71 |
| Comparative Example 5 | B-4 | PAG-9 (2.7) | N-4 (0.30) | 3b | — | SL-1/SL-2 (80/20) | Aqueous TMAH solution | 8.02 |

From the results in Table 8, it is clear that in a case where the composition of Examples is used, a pattern thus formed has excellent LWR in the EUV exposure evaluation.

On the other hand, it is clear that a pattern obtained with the compositions of Comparative Examples has LWR not satisfying the desired requirements.

What is claimed is:

1. An actinic ray-sensitive or radiation-sensitive resin composition comprising a resin including a repeating unit derived from a monomer having a salt structure and a repeating unit having a group whose polarity increases through decomposition by the action of an acid, wherein the salt structure consists of an anionic structure moiety and an actinic ray-sensitive decomposable or radiation-sensitive decomposable cationic structure moiety, a pKa of a monomer obtained by substituting the cationic structure moiety in the salt structure with a hydrogen atom is −0.80 or more, and the monomer having the salt structure is a monomer represented by General Formula (X1),

(X1)

in the formula, $P^{11}$ represents a polymerizable group, $Y^{11-}$ represents a group selected from the group consisting of anionic functional groups represented by General Formulae (Y2) to (Y8), $Z^{11+}$ represents an actinic ray-sensitive decomposable or radiation-sensitive decomposable cation, m represents an integer of 1 or more, $L^{11}$ represents a single bond or an m+1-valent linking group, in a case where $Y^{11-}$ is an anionic functional group represented by General Formula (Y2), $L^{11}$ includes neither a phenylene group nor a lactone structure,

(Y2)

in General Formula (Y2), $R^{11}$ and $R^{12}$ each independently represent a hydrogen atom or a monovalent organic group, provided that in a case where one of $R^{11}$ and $R^{12}$ represents a fluorine atom or a fluoroalkyl group, the other of $R^{11}$ and $R^{12}$ represents a hydrogen atom or a monovalent organic group different from the fluorine atom and the fluoroalkyl group, $R^{11}$ and $R^{12}$ may be bonded to each other to form a ring, $R^{11}$ and $R^{12}$ may be each independently bonded to $L^{11}$ in General Formula (X1) to form a ring, provided that the ring formed by the bonding of $R^{11}$ and $L^{11}$ in General Formula (X1) and the ring formed by the bonding of $R^{12}$ and $L^{11}$ in General Formula (X1) include no benzene ring, and

* represents a bonding position to $L^{11}$,

(Y3)

in General Formula (Y3), $R^{13}$ represents a monovalent organic group, provided that in a case where a group adjacent to a sulfur atom in $R^{13}$ is a carbon atom, the carbon atom has no fluorine atom as a substituent, $R^{13}$ may be bonded to $L^{11}$ in General Formula (X1) to form a ring, and

* represents a bonding position to $L^{11}$,

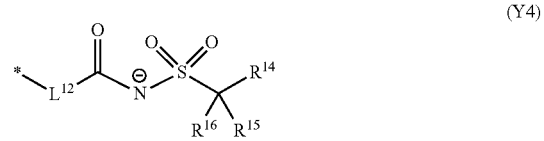

(Y4)

in General Formula (Y4), $L^{12}$ represents a single bond or a divalent linking group, $R^{14}$, $R^{15}$, and $R^{16}$ each independently represent a hydrogen atom or a monovalent organic group, provided that in a case where two of $R^{14}$, $R^{15}$, and $R^{16}$ represent a fluorine atom or a fluoroalkyl group, one of $R^{14}$, $R^{15}$, and $R^{16}$ represents a hydrogen atom or a monovalent organic group different from the fluorine atom and the fluoroalkyl group, in a case where two of $R^{14}$, $R^{15}$, and $R^{16}$ each represent a fluorine atom or a fluoroalkyl group, and a group adjacent to an amido group in $L^{12}$ is a carbon atom, the carbon atom does not have two or more fluorine atoms and fluoroalkyl groups as a substituent, $R^{14}$, $R^{15}$, and $R^{16}$ may be bonded to each other to form a ring, $R^{14}$, $R^{15}$, and $R^{16}$ may be each independently bonded to $L^{12}$ to form a ring, $R^{14}$, $R^{15}$, and $R^{16}$ may be each independently bond to $L^{11}$ in General Formula (X1) to form a ring, and

* represents a bonding position to $L^{11}$,

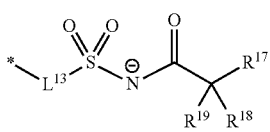
(Y5)

in General Formula (Y5), $L^{13}$ represents a single bond or a divalent linking group, $R^{17}$, $R^{18}$, and $R^{19}$ each independently represent a hydrogen atom or a monovalent organic group, provided that in a case where two or more of $R^{17}$, $R^{18}$, or $R^{19}$ each represent a fluorine atom or a fluoroalkyl group, and a group adjacent to a sulfonamido group in $L^{13}$ is a carbon atom, the carbon atom does not have two or more fluorine atoms and fluoroalkyl groups as a substituent, $R^{17}$, $R^{18}$, and $R^{19}$ may be bonded to each other to form a ring, $R^{17}$, $R^{18}$, and $R^{19}$ may be each independently bonded to $L^{13}$ to form a ring, $R^{17}$, $R^{18}$, and $R^{19}$ may be each independently bonded to $L^{11}$ in General Formula (X1) to form a ring, and

* represents a bonding position to $L^{11}$,

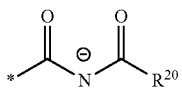
(Y6)

in General Formula (Y6), $R^{20}$ represents a monovalent organic group, $R^{20}$ may be bonded to $L^{11}$ in General Formula (X1) to form a ring, and

* represents a bonding position to $L^{11}$,

(Y7)

in General Formula (Y7), * represents a bonding position to $L^{11}$, and provided that the atom bonded to * in $L^{11}$ is a carbon atom which is not a carbonyl group,

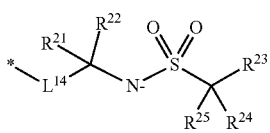
(Y8)

in General Formula (Y8), $L^{14}$ represents a single bond or a divalent linking group, $R^{21}$, $R^{22}$, $R^{23}$, $R^{24}$, and $R^{25}$ each independently represent a hydrogen atom or a monovalent organic group, $R^{23}$, $R^{24}$, and $R^{25}$ may be bonded to each other to form a ring, $R^{23}$, $R^{24}$, and $R^{25}$ may be each independently bonded to $L^{14}$, $R^{21}$, and $R^{22}$ to form a ring, $R^{21}$, $R^{22}$, and $L^{14}$ may be bonded to each other to form a ring, and $R^{23}$, $R^{24}$, and $R^{25}$ may be each independently bonded to $L^{11}$ in General Formula (X1) to form a ring.

2. The actinic ray-sensitive or radiation-sensitive resin composition according to claim 1, further comprising a photoacid generator that generates an acid upon irradiation with actinic rays or radiation.

3. The actinic ray-sensitive or radiation-sensitive resin composition according to claim 2,
wherein a pKa of an acid generated from the photoacid generator is smaller than a pKa of a monomer obtained by substituting the cationic structure moiety in the salt structure with a hydrogen atom.

4. A resist film formed using the actinic ray-sensitive or radiation-sensitive resin composition according to claim 1.

5. A pattern forming method comprising:
a resist film forming step of forming a resist film using the actinic ray-sensitive or radiation-sensitive resin composition according to claim 1;
an exposing step of exposing the resist film; and
a developing step of developing the exposed resist film using a developer.

6. A method for manufacturing an electronic device, comprising the pattern forming method according to claim 5.

7. A resist film formed using the actinic ray-sensitive or radiation-sensitive resin composition according to claim 2.

8. A pattern forming method comprising:
a resist film forming step of forming a resist film using the actinic ray-sensitive or radiation-sensitive resin composition according to claim 2;
an exposing step of exposing the resist film; and
a developing step of developing the exposed resist film using a developer.

9. A method for manufacturing an electronic device, comprising the pattern forming method according to claim 8.

10. A resist film formed using the actinic ray-sensitive or radiation-sensitive resin composition according to claim 3.

11. A pattern forming method comprising:
a resist film forming step of forming a resist film using the actinic ray-sensitive or radiation-sensitive resin composition according to claim 3;
an exposing step of exposing the resist film; and
a developing step of developing the exposed resist film using a developer.

12. A method for manufacturing an electronic device, comprising the pattern forming method according to claim 11.

* * * * *